(12) United States Patent
Brown et al.

(10) Patent No.: US 8,969,850 B2
(45) Date of Patent: Mar. 3, 2015

(54) NANO-STRUCTURE ARRAYS FOR EMR IMAGING

(75) Inventors: Robert G. Brown, Tustin, CA (US); James H. Stanley, Palo Alto, CA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 380 days.

(21) Appl. No.: 13/243,342

(22) Filed: Sep. 23, 2011

(65) Prior Publication Data

US 2013/0075699 A1 Mar. 28, 2013

(51) Int. Cl.
| | |
|---|---|
| H01L 29/06 | (2006.01) |
| H01L 31/052 | (2014.01) |
| H01L 31/08 | (2006.01) |
| B82Y 30/00 | (2011.01) |

(52) U.S. Cl.
CPC ............ *H01L 31/0522* (2013.01); *H01L 31/08* (2013.01); *B82Y 30/00* (2013.01); *Y02E 10/52* (2013.01); *Y10S 977/778* (2013.01); *Y10S 977/784* (2013.01)
USPC ................. 257/20; 257/21; 257/22; 257/428; 257/E31.003; 977/778; 977/784

(58) Field of Classification Search
USPC ....... 257/20–22, 428, E31.003; 977/778, 784
See application file for complete search history.

(56) References Cited

U.S. PATENT DOCUMENTS

| | | | |
|---|---|---|---|
| 4,814,847 A | 3/1989 | Tabatabaie | |
| 4,814,874 A | 3/1989 | Adachi | |
| 5,949,071 A | 9/1999 | Ruffner et al. | |
| 8,089,115 B2 | 1/2012 | Leong et al. | |
| 2006/0108657 A1 | 5/2006 | Raynor | |
| 2007/0289623 A1* | 12/2007 | Atwater | ........................ 136/252 |
| 2009/0103095 A1 | 4/2009 | Beausoleil et al. | |
| 2009/0152664 A1 | 6/2009 | Klem et al. | |
| 2010/0058978 A1 | 3/2010 | Nikoobakht | |
| 2010/0127172 A1 | 5/2010 | Nikoobakht | |

(Continued)

FOREIGN PATENT DOCUMENTS

| | | |
|---|---|---|
| RU | 2374720 C1 | 11/2009 |
| RU | 101866 U1 | 1/2011 |

(Continued)

OTHER PUBLICATIONS

Anderson, M.S., Surface enhanced infrared absorption by coupling photon and plasmon resonance, Applied Physics Letters, vol. 87, 2005, 4 pages.

(Continued)

*Primary Examiner* — Matthew E Warren
(74) *Attorney, Agent, or Firm* — Angel N. Gerdzhikov; Donna P. Suchy; Daniel M. Barbieri

(57) ABSTRACT

An electro-magnetic radiation detector is described. The electro-magnetic radiation detector includes a detector material and a voltage biasing element. The detector material includes a substantially regular array of nano-particles embedded in a matrix material. The voltage biasing element is configured to apply a bias voltage to the matrix material such that electrical current is directly generated based on a cooperative plasmon effect in the detector material when electro-magnetic radiation in a predetermined wavelength range is incident upon the detector material, where the dominant mechanism for decay in the cooperative plasmon effect is non-radiative.

35 Claims, 44 Drawing Sheets

(56) References Cited

U.S. PATENT DOCUMENTS

| | | | |
|---|---|---|---|
| 2011/0215298 A1* | 9/2011 | Kim et al. | 257/24 |
| 2011/0278541 A1* | 11/2011 | Huang et al. | 257/21 |
| 2012/0280209 A1* | 11/2012 | Bonnell et al. | 257/21 |

FOREIGN PATENT DOCUMENTS

| | | |
|---|---|---|
| WO | WO 2008/135905 | 11/2008 |
| WO | WO 2009/104188 | 8/2009 |

OTHER PUBLICATIONS

U.S. Appl. No. 13/243,443, filed Sep. 23, 2011, Brown et al.

International search report and written opinion for international application No. PCT/US12/35112. mail date Jun. 28, 2012, 5 pages.

McIntyre, R. J., The Distribution of Gains in Uniformly Multiplying Avalanche Photodiodes: Theory, IEEE Transactions on Electron Devices, vol. Ed-19, No. 6, Jun. 1972, pp. 703-713.

McIntyre, R. J., Recent Developments in silicon avalanche photodiodes, Measurement, vol. 3, 1985, pp. 146-152.

Miyachi et al., A photosensing system composed of photosystem I, molecular wire, gold nano-particle, and double surfactants in water, Chem. Commun. 46, 2010; pp. 2557-2559.

Radford, W. et al., Sensitivity improvements in uncooled microbolometer FPAs, Proc. SPIE, vol. 3698, 1999, pp. 119-130.

Saleh, B. E. A., & Teich, M. C., 1991; Fundamentals of Photonics, Wiley & Sons, Inc., 1991, 4 pages.

Sönnichsen, C., et al., Drastic Reduction of Plasmon Damping in Gold Nanorods, Phys. Rev. Letts., vol. 88, No. 7, 2002, 4 pages.

Wokaun, A., Surface enhancements of optical fields, Molecular Physics, 56, 1, 1985, 34 pages.

Yamaguchi, T. et al., Optical effect of the substrate on the anomalous absorption of aggregated silver films, Thin Solid Films, 21, 1974; pp. 173-187.

Zayats, A. V. et al., Nano-optics of surface plasmon polaritons, Physics Reports 408, 2005; pp. 131-314 (184 pages).

Zhao, L.L., et al., The Extinction Spectra of Silver Nanoparticle Arrays: Influence of Array Structure on Plasmon Resonance Wavelength and Width, J. Phys. Chem. B, 107, 2003; pp. 7343-7350.

Campbell, Optoelectronic Technology and Lightwave Communication Systems, Van Nostrand Reinhold, 1989, 40 pages.

Knight et al., Photodetection with Active Optical Antennas, May 6, 2011, 5 pages.

Rogalski, Selected Papers on Infrared Detectors: Developments, 2004.

Office Action for U.S. Appl. No. 13/360,570, mail date Oct. 9, 2013, 11 pages.

Notice of Allowance on U.S. Appl. No. 13/360,570 Dated Mar. 19, 2014, 5 pages.

Office Action on U.S. Appl. No. 13/690,276 Dated Mar. 7, 2014, 11 pages.

Office Action on U.S. Appl. No. 13/690,276 Dated Apr. 10, 2014, 16 pages.

Novotny, "The History of Near-field Optics", from Progress in Optics 50, chapter 5, p. 137-184 (Elsevier, Amsterdam, The Netherlands, 2007).

Office Action on U.S. Appl. No. 14/019,288 Dated Nov. 12, 2014, 10 pages.

* cited by examiner

FIG. 1c
*n*-type semiconductor
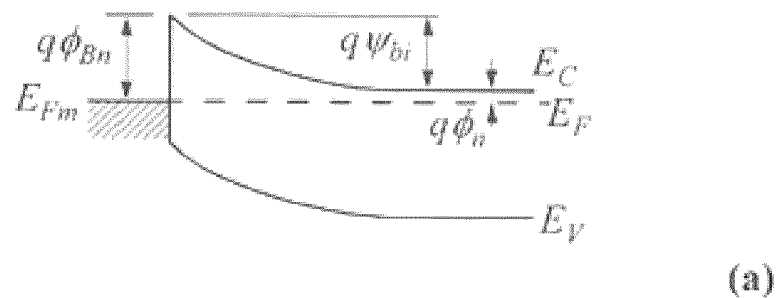
(a)
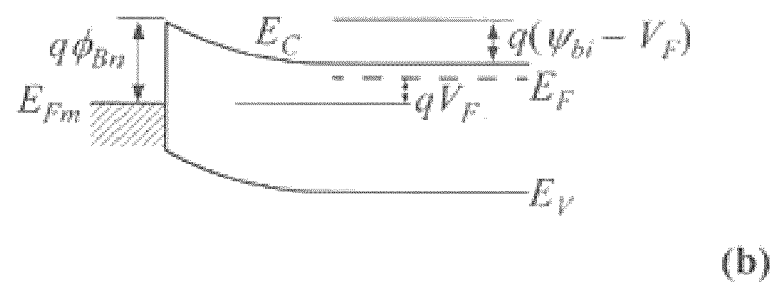
(b)
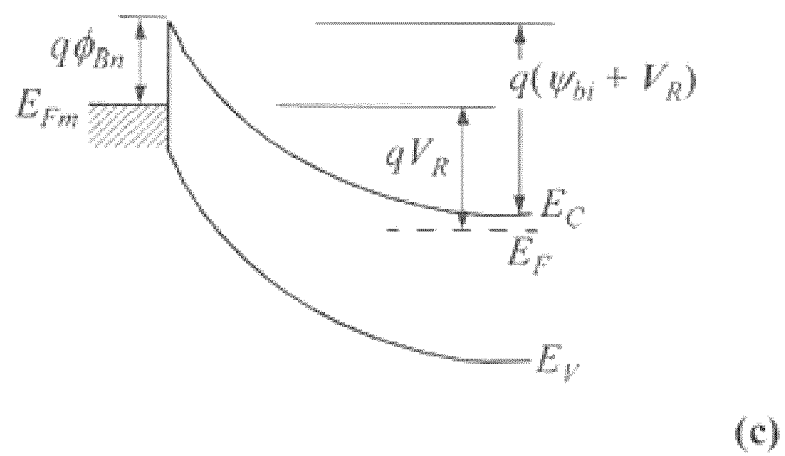
(c)

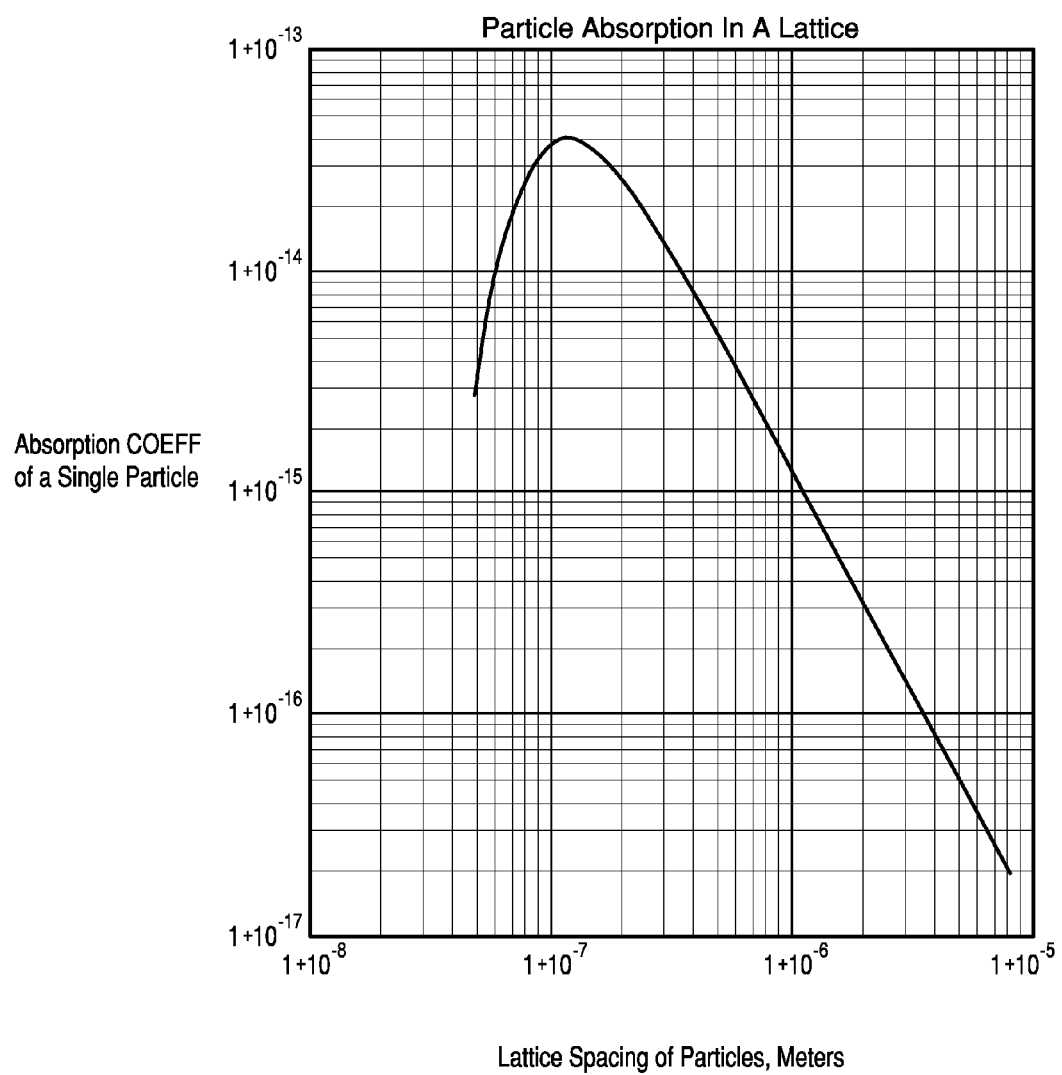

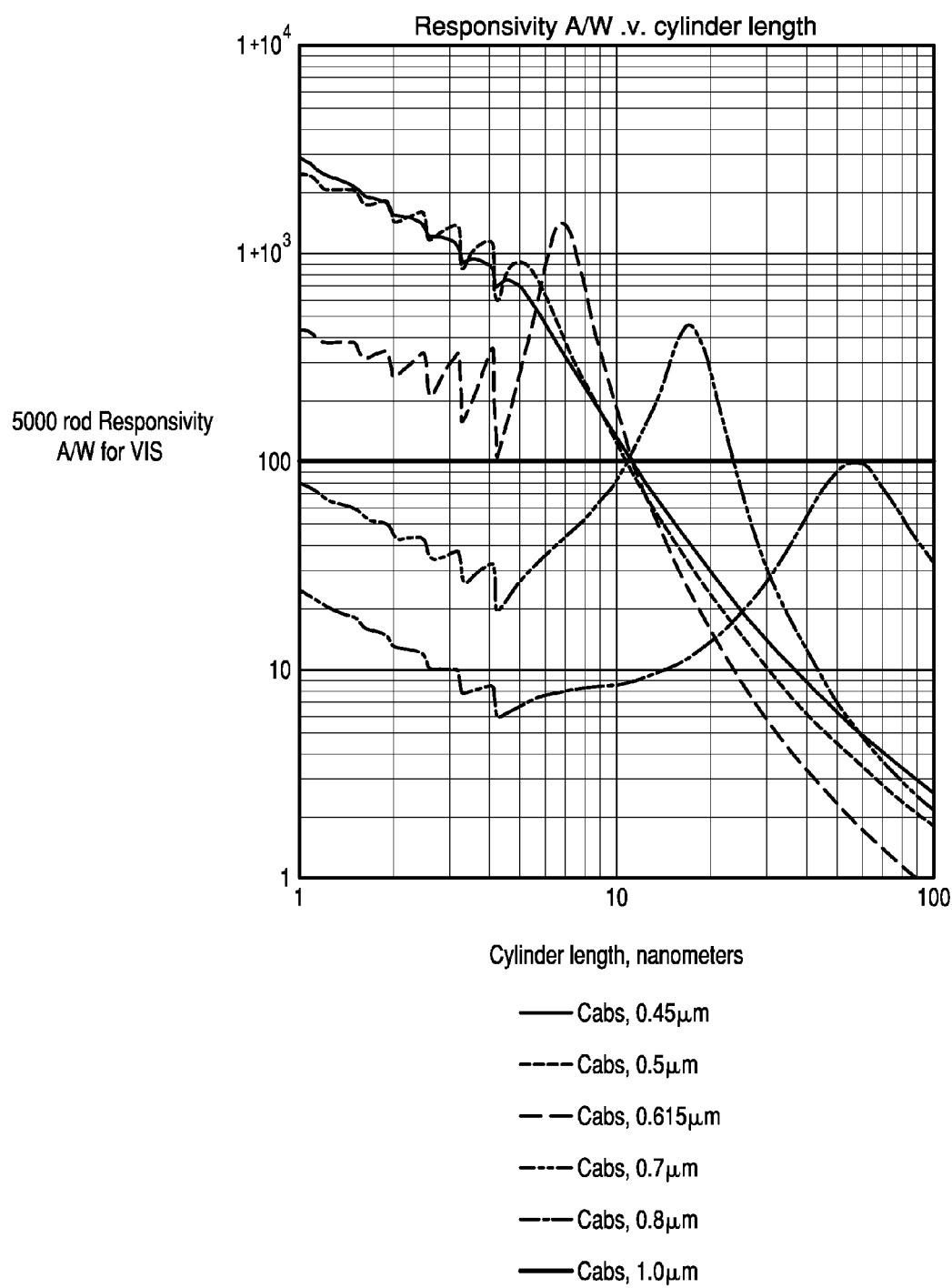

Schematic representation of photosystem I, an essential complex in photosynthesis, adapted into a light sensor using gold nanoparticles.

NANO-STRUCTURE ARRAYS FOR EMR IMAGING

FIELD OF THE INVENTION

The present invention relates to the use of nanoparticle arrays embedded in a matrix material for the detection of electromagnetic radiation (EMR), EMR detector materials employing such nanoparticle arrays, and EMR detectors employing such detector materials.

BACKGROUND

Nanoparticles are widely used for their optical properties. In their use, nanoparticles are known to be excellent scatterers of light and other EMR.

Gold nanoparticles have been used to absorb EMR to create a rise in their temperature which can subsequently be measured through resistance change in their surrounding medium. Such gold nanoparticles can be the basis of potential microbolometer improvement [Nikoobakht, B., May 27, 2010; US Patent Application Publication US 2010/0127172 A1]. In such systems, however, no direct use is made of the electrical properties of the plasmon's electron cloud at the surface of the nanoparticles, and the electric field the plasmon's electron cloud creates. Electrons are not detected directly as current in such systems.

Nanoparticles have also been attached to the surface of silicon solar cells for the purposes of scattering (re-radiating) the incident EMR from the Sun into the optical modes of a photovoltaic silicon detector, for the purposes of increasing absorption of EMR in the silicon to create an electric current flow, such as is the standard process in optoelectronic photo-detection devices [Fonash, S. J., 2010; 'Solar Cell Device Physics', Elsevier].

Indeed, there is considerable global interest at present in the emerging fields of plasmonics, photonic crystals and so called meta-materials [Wehrspohn, R. B., Kitzerow, H.-S., and Busch, K., 2008; 'Nanophotonic Materials: Photonic Crystals, Plasmonics, and Metamaterials', Wiley-VCH.]. Throughout the development of these materials, the focus has been on the manipulation of their optical and non-linear optical properties for a variety of optical applications.

SUMMARY

According to one embodiment, there is provided an electro-magnetic radiation detector, comprising: a detector material comprising a substantially regular array of nano-particles embedded in a matrix material; and a voltage biasing element configured to apply a bias voltage to the matrix material such that electrical current is directly generated based on a cooperative plasmon effect in the detector material when electromagnetic radiation in a predetermined wavelength range is incident upon the detector material, where the dominant mechanism for decay in the cooperative plasmon effect is non-radiative.

According to one aspect of the embodiment, the nano-particles comprise a metal, and the matrix material comprises a semiconductor material.

According to another aspect of the embodiment, the nano-particles comprise gold.

According to another aspect of the embodiment, the matrix material comprises one of silicon or InSb.

According to another aspect of the embodiment, the nano-particles comprise a semiconductor material, and the matrix material comprises a metal.

According to another aspect of the embodiment, the nano-particles comprise a first semiconductor material, and the matrix material comprises a second semiconductor material.

According to another aspect of the embodiment, the second semiconductor material is highly doped.

According to another aspect of the embodiment, the nano-particles comprise a semiconductor material, and the matrix material comprises a conductive contact material having ohmic or Schottky barrier properties with respect to the embedded nano-particles.

According to another aspect of the embodiment, the voltage biasing element comprises a first electrode electrically contacting a first side of the matrix material and a second electrode electrically contacting a second side of the matrix material.

According to another aspect of the embodiment, the first and second electrodes are laterally arranged relative to each other.

According to another aspect of the embodiment, the detector further comprises an anti-reflection coating on the matrix material.

According to another aspect of the embodiment, the first and second electrodes are vertically arranged relative to each other.

According to another aspect of the embodiment, the first electrode is transparent or semi-transparent to the electromagnetic radiation in the predetermined wavelength range.

According to another aspect of the embodiment, the matrix material comprises a heterojunction, and the nano-particles are embedded in the heterojunction.

According to another aspect of the embodiment, the matrix material comprises a metal-semiconductor junction, and the nano-particles are embedded in the metal-semiconductor junction.

According to another aspect of the embodiment, the matrix material comprises a metal as a perforated contact electrode and the nano-particles comprise a semiconductor material.

According to another aspect of the embodiment, the voltage biasing element comprises another electrode electrically contacting the nano-particles.

According to another aspect of the embodiment, the detector further comprises: a p-type semiconductor region formed on the matrix material; and an n-type semiconductor region formed on the p-type semiconductor region, wherein the first electrode contacts the n-type semiconductor region, and the second electrode contacts the matrix material opposite to the p-type semiconductor region, and wherein the matrix material comprises a π doped semiconductor material.

According to another aspect of the embodiment, the detector is an avalanche photodiode.

According to another aspect of the embodiment, the detector is a solar cell.

According to another aspect of the embodiment, the detector is a focal plane array.

According to another aspect of the embodiment, the nano-particles are cylindrical, spherical, cubic, rectangular-cubic, ellipsoidal, planar or spiral-twisted.

According to another aspect of the embodiment, the nano-particles have a long axis, and the array comprises one or more pixels.

According to another aspect of the embodiment, the nano-particles in each pixel are arranged such that the long-axis of each nano-particle in the pixel are oriented along a same direction.

According to another aspect of the embodiment, the nano-particles in each pixel comprise a first group of nano-particles and a second group of nano-particles, the long-axis of each nano-particle in the first group oriented along a first direction, the long-axis of each nano-particle in the second group oriented along a second direction.

According to another aspect of the embodiment, the first direction is perpendicular to the second direction.

According to another aspect of the embodiment, the nano-particles of the first and second groups are arranged in the same region of the pixel to form a checker-board pattern.

According to another aspect of the embodiment, the nano-particles of the first and second groups are arranged in different regions of the pixel.

According to another aspect of the embodiment, the nano-particles in each pixel comprise a first group of nano-particles arranged in a first region of the pixel and a second group of nano-particles arranged in a second region of the pixel, wherein the nano-particles in the first group are arranged in the first region to optimally detect electromagnetic radiation in a first wavelength range, and the nano-particles in the second group are arranged in the second region to optimally detect electromagnetic radiation in a second wavelength range different from the first wavelength range.

According to another aspect of the embodiment, the nano-particles in each pixel further comprise a third group of nano-particles arranged in a third region of the pixel, the nano-particles in the third group are arranged in the third region to optimally detect electromagnetic radiation in a third wavelength range different from the first wavelength range and the second wavelength range.

According to another aspect of the embodiment, the array is polarization sensitive to the electromagnetic radiation in the predetermined radiation range.

According to another aspect of the embodiment, the nano-particles of the first group are sensitive to a polarization of the electromagnetic radiation in the predetermined radiation range in a first polarization direction, and the nano-particles of the second group are sensitive to a polarization of the electromagnetic radiation in the predetermined radiation range in a second polarization direction.

According to another aspect of the embodiment, the predetermined wavelength range comprises multiple predetermined wavelength subranges.

According to another aspect of the embodiment, the predetermined wavelength subranges are separated from each other.

According to another aspect of the embodiment, the predetermined wavelength subranges are continuous with each other.

According to another aspect of the embodiment, the predetermined wavelength range is between the deep ultra-violet and microwave regions of the electromagnetic spectrum.

According to another aspect of the embodiment, the predetermined wavelength range comprises at least one of the visible, near infra-red, short-wave infrared, medium-wave infrared, infra-red, long-wave infra-red, and tera-hertz regions of the electromagnetic spectrum.

BRIEF DESCRIPTION OF FIGURES

FIG. 1c is a diagram illustrating the energy levels at metal-semiconductor interface under (a) equilibrium, (b) forward bias $V_f$, and (c) reverse bias $V_r$ conditions.

FIG. 15d is a graph illustrating the absorption for a single nanorod versus lattice spacing of a nanorod array as a function of nanorod spacing.

FIG. 37 is a graph showing the responsivity for ~5000 gold nanorods in silicon as a function of nanorod length.

DETAILED DESCRIPTION

Introduction

Figure 1A:
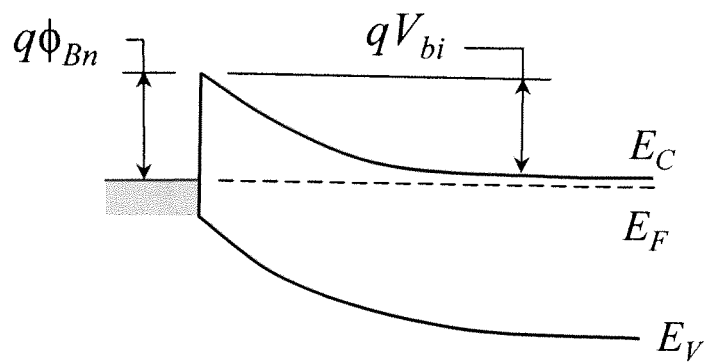
FIG. 1a is a diagram illustrating the energy levels at metal-semiconductor interface.

The references cited herein are incorporated by reference in their entirety.

The present inventors have found that by appropriately selecting the geometry and materials for a detector material comprising a substantially regular array of nanoparticles embedded in a matrix material, and by applying an appropriate bias voltage to the matrix material, a direct electrical current may be generated based on a cooperative plasmon effect in the detector material when EMR in a desired wavelength range is incident upon the detector material, and where the dominant mechanism for decay in the cooperative plasmon effect is nonradiative. The direct electronic mechanism used for detection has advantages over other current detection systems for EMR detection.

A primary focus is the use of plasmonic effect maximized absorption by nanoparticles, such as metal nanoparticles, embedded in a matrix material, such as a semiconductor material, for the purpose of detecting incident EMR. This mechanism is precisely the opposite effect which has been used in many optical nanoparticle systems, where the employment of a plasmonic effect is used to maximally scatter incident EMR into the surrounding semiconducting matrix material to enhance the EMR absorption in that material.

The selection of the geometry and materials to maximize the absorption may involve (1) the choice of nanoparticle material and matrix material, (2) the size and shape of nanoparticles, (3) the arrangement of such nanoparticles in different kinds of substantially regular arrays, and (4) an appropriately applied bias voltage, so as to generate both (A) a high electric field in the vicinity of the nanoparticles and (B) subsequent electric current to flow, which can provide a measurement of the fluctuations in the strength of the incident EMR and its fluctuations. Thus the fluctuations of the incident EMR can be sensed, either photovoltaically or photoconductively, according to peripheral circuitry into which this nano-plasmonic (meta-material) EMR-sensor is placed.

Further parameters for providing an appropriate EMR detector may include, such as in the case where the matrix material is a semiconductor, for example: (5) varying the doping level of the semiconductor material adjacent to the nanoparticle arrays, and (6) the use of multiple semiconductor materials to form hetero-junctions in which the nanoparticle arrays are embedded.

The selection of the geometry and materials will in general depend upon the wavelength of the EMR desired to be detected. In general, the detector may be tailored for EMR detection desired regions across the EMR spectrum such as from the deep ultra-violet to the microwave region, through both the visible (VIS) and all infrared (IR) regions, such as near IR (NIR), long wavelength (LWIR), mid IR (MWIR), and short wavelength IR (SWIR).

For example, for detectors in the LWIR region (approximately 8 to 14 microns wavelength), gold nanorods may be embedded in a silicon matrix, and provide a number of advantageous features. Such LWIR detectors may provide enhancements of responsivity/sensitivity as compared to micro-bolometers at LWIR wavelengths. Furthermore, arrays of nanorods may arranged to be polarization sensitive, creating a new sensing parameter, whereas the symmetry of spheres as nanoparticles may not allow for such polarization sensitivity.

Further, detector frequency response is good, as plasmon decay times are of order of less than 1 picosecond and 10 micron pixel electrical time constants are around 50 microseconds (20 KHz).

Such nanoparticle array detectors using gold nanorods may provide advantages over microbolometer detectors. In particular, such nanoparticle array detectors may outperform corresponding micro-bolometers by substantially more than an order of magnitude, and thus represent a cost-effective, competitive and worthwhile detector-performance improvement leading towards higher resolution and less blurred moving images, together with much greater temperature sensitivity and gray scale within images.

For example, for a f/1, 10 micron square pixel, closepacked gold nanorod array system, preliminary estimates of Noise Equivalent Temperature Difference (NETD) are in the sub milliKelvin (mK) region, Minimum Resolvable Temperature Difference (MRTD) being mostly sub-mK across the entire Modulation Transfer Function (MTF). 120 Hz and greater frame rate displays are thus made possible for the LWIR region, providing applications for night vision. These numbers compare favorably to microbolometers in the LWIR because of the direct electronic mechanism used for detection rather than the usual thermal fluctuation mechanism of microbolometers.

Background Technology for Nanoparticles and Nanoparticle Arrays (i) Polaritons and Plasmons As technological background for the present invention, an important aspect is electronic states called polaritons, which are surface plasmons. Surface plasmons and their properties are described in many texts. An excellent review is given by [Zayats, A. V., Smolyaninov, I. I. and Maradudin, A. A., 2005; 'Nano-optics of surface plasmon polaritons', Physics Reports 408, pp 131-314]. The essential math for calculation of surface plasmon characteristics is contained therein. Surface plasmons are associated with surfaces, such as substrates. In contrast to surface plasmons, localized plasmons are plasmons associated with small particles of size less than the incident wavelength, i.e., $<\lambda$.

For a localized plasmon excited by photon absorption, there are two competing processes for decay, a radiative decay process into photons, dominating for larger particles, and a nonradiative process due to absorption. For this invention, it is desired to maximize the nonradiative process for the purposes of detection, which also minimizes the radiative decay process. The nonradiative decay is due to the creation of electron-hole pairs via either intra-band excitations within the conduction band, or inter-band excitations from the lower lying d bands to the (surface plasmon) conduction band (in noble metals such as gold). Radiation damping in localized plasmons is caused by direct radiative decay of the coherent electron oscillation into photons. Such radiative decay is not the desired decay mechanism for the detectors described herein.

By using a model for both these possibilities [Zayats, A. V., Smolyaninov, I. I. and Maradudin, A. A., 2005; 'Nano-optics of surface plasmon polaritons', Physics Reports 408, pp 131-314], i.e., radiative and non-radiative decay, a 'quantum efficiency' for the light scattering aspects (due to radiative decay) may be estimated. For the detectors of the present invention it is desired to minimize the light scattering efficiency so that absorption and thus the responsivity is maximized.

(ii) Metal Nanoparticles

Single Nanorods

Computation of the optical and absorption properties of single arbitrarily shaped nanorod nanoparticles proceeds from knowledge of the optical constants of the nanorod material across the infrared spectrum from the near and short-wave end to the long-wave end, around 13 microns wavelength. For example, such data is found for gold in [Palik, E. D., 1985; 'Handbook of Optical Constants of Solids', Academic Press].

To determine the absorption cross-section of the particle under study, Cabs, the complex refractive index n+ik may be used, and the complex dielectric function (or relative permittivity) $\epsilon = \epsilon' + i\epsilon''$; where $\epsilon' = n^2 - k^2$ and $\epsilon'' = 2nk$. From the relationship of the complex dielectric function as a function of wavelength ($\lambda$), the polarizability ($\alpha$) of any shape of particle may be calculated using various equations for different shapes of particle, [van de Hulst, H. C., 1957 & 1981; 'Light Scattering by Small Particles', Dover].

Once the polarizability $\alpha$ is determined, the absorption cross-section of the particularly shaped particle under study, Cabs, may be calculated based on its shape and material, along with its related quantity, the absorption efficiency, Qabs, [van de Hulst, H. C., 1957 & 1981; 'Light Scattering by Small Particles', Dover]. Both of these parameters may then be used in the estimation of responsivity and other sensitivity parameters. The aspect ratio and size of a nanorod directly affects the nanorod's polarizability, $\alpha$, and may be approximated by various different means [van de Hulst, H. C., 1957 & 1981; 'Light Scattering by Small Particles', Dover].

From the Cabs, the absolute responsivity using incident illumination power, the coupling constant to the detector's electrical circuit, and polarization conditions may be calculated, as will be described below. Selecting and optimizing the plasmon decay mechanism, and computing the detector's substrate coupling constant are both of importance. With nanorods, localized plasmons, not surface plasmons, are the plasmons of interest. As described below, localized plasmons may be used to excite surface plasmons in the detector substrate material providing an efficient power transfer into a detector geometry.

Clusters of Nanorods

Substantially regular arrays of nanoparticles are employed in the detectors described to provide an appropriate electronic decay mechanism for absorption. Thus, it is important to look at clusters of nanoparticles, such as nanorods, in determining the decay mechanism. The regularity of the arrays and the spacing between particles are parameters in minimizing radiative decay.

Clusters of nanorods cause changes to the plasmon resonance conditions, depending strongly on the separation of the nanorods compared to their characteristic dimensions. Such effects are known, such as described in [Kreibig, U., & Vollmer, M., 1995; 'Optical Properties of Metal Clusters', Springer]; although exact calculation may be difficult.

Two regimes are distinguished depending on the magnitude of the inter-particle spacing, d. Using closely spaced particles, $d<<\lambda$ (the wavelength of the incident EMR), near-field interactions with a dependence on $d^{-3}$ dominate. Light scattering is strongly reduced for closely spaced particles, and thus such closely spaced particles are useful in the detectors as described herein. Interparticle coupling leads to shifts in the spectral position of plasmon resonance. With rods, there is a blue-shift (toward higher energy) for the excitation of transverse modes, and a red-shift (toward higher energy) for longitudinal modes. For larger particle separations, far field dipole coupling with $d^{-1}$ dependence dominates.

Nanorods on Surfaces and Coupling

Interactions between nanorods can be enhanced by providing additional coupling pathways, for example, seeding surface plasmons of the detector material surface from localized plasmons in the nanorods by use of a conducting substrate. This is useful to maximize coupling into a detector.

There is experimental evidence of changes in plasmon resonance conditions of arrays of nanoparticles on surfaces, some describing the coupling of arrays of nanoparticles to surface plasmons in the substrate material. Further, quantification of energy coupling effects of arrays of nanorods is described in [Yamaguchi, T., et al, 1974; 'Optical effect of the substrate on the anomalous absorption of aggregated silver films', Thin Solid Films, 21, pp 173-187], and a mathematical discussion in great detail of the induced dipole-strengths of a particle on a surface is described in [Mills, D. L., 2002; 'Theory of STM-induced enhancement of dynamic dipole moments on crystal surfaces', Physical Review B, 65, page 125419]. These theories are useful in the computation of detector responsivity and for the calculation of energy coupling constants for various different media surrounding gold nanorod arrays on a surface, and for various different media forming the substrate material.

A valuable method for computing the polarizability Pj of an individual particle in an array has been described by [Wokaun, A., 1985; 'Surface enhancements of optical fields', Molecular Physics, 56, 1, pp 1-33] as follows:

$$P_j = \frac{1}{4\pi} \frac{(\varepsilon-1)(1-q^2/10)}{1+(\varepsilon-1)A_{\mathit{eff},jj}} E_{0j}, \; j = x, y, z.$$

where $A_{\mathit{eff}}$ is the effective shape dependent polarization constant of an individual particle and $q = k(abc)^{1/3}$ where a, b, c are the particle's half-axis lengths, and k is the scattering vector.

EMR Scattering and Absorption

Gans' mathematics for calculation of light-scattering and absorption cross-section based on particle-shapes is described in [Link, S. and EI-Sayed, M. A., 2000; 'Shape and size dependence of radiative, nonradiative and photothermal properties of gold nanocrystals', Int. Reviews in Physical Chemistry, 19, 3, pp 409-453]. The optical absorption spectrum of a collection of randomly oriented gold nanorods with aspect ratio R can be modeled using an extension of the Mie theory. Within the dipole approximation according to the Gans treatment, the extinction cross-section $\sigma_{ext}$ for elongated ellipsoids is given by the following equation:

$$\sigma_{ext} = \frac{\omega}{3c} \varepsilon_m^{3/2} V \sum_j \frac{(1/P_j^2)\varepsilon_2}{\{\varepsilon_1 + [(1-P_j)/P_j]\varepsilon_m\}^2 + \varepsilon_2^2}$$

where $P_j$ are the depolarization factors along the three axes A, B and C of the nanorod with A>B=C, defined as:

$$P_A = \frac{1-e^2}{e^2} \left[ \frac{1}{2e} \ln\left(\frac{1+e}{1-e}\right) - 1 \right],$$

$$P_B = P_C = \frac{1-P_A}{2},$$

and the aspect ratio R is included in e as follows:

$$e = \left[ 1 - \left(\frac{B}{A}\right)^2 \right]^{1/2} = \left(1 - \frac{1}{R^2}\right)^{1/2}$$

Semiconductor Physics and Optoelectronics Effect of Metal-Semiconductor Interfaces Metal-semiconductor interfaces have long been used in photodetection and solar-cells. A modern treatment is given in [Chuang, S. L., 1995; 'Physics of Optoelectronic devices', p 342, Wiley] and [Sze, S. M., & Ng, K. K., 2007; 'Physics of Semiconductor Devices', 3$^{rd}$ Edition, Wiley-Interscience], which is the origin of FIGS. 1a, 1b & 1c. When a semiconductor is in intimate contact with a metal, the Fermi levels of both materials line up, and a barrier is formed over (or through) which carriers must pass during current flow (see FIG. 1a). In this case the current is majority carriers, unlike a p-n junction where the minority carriers dominate.

For example, for gold metal nanorods in a semiconductor matrix, with plasmon excitation based on LWIR EMR incident, a "cloud of electrons (plasmon) is excited. A high electric field is created at the surface of the nanorods. Thus the majority carriers are electrons, in which case the appropriate theory to be used here is a n-type doped semiconductor (see FIG. 1b).

When a voltage bias is applied, the line up of the energy levels is changed, per FIG. 1c and the flow of electrons into and out of the metal is altered. The Schottky barrier is effectively lowered by applying a forward bias. For smaller photon energy, hv, than the bandgap, Eg, (longer wavelength) q$\phi$B<hv<Eg the photoexcited electrons in the metal can surmount the barrier and be collected by the semiconductor (see FIG. 1b).

While silicon could be used as the semiconductor matrix material, other semiconductor materials could also be used. For example, GaAs could be used for higher speed detectors or to exploit different barrier properties. One advantage of using silicon is that it is already highly developed in volume production of CMOS detector arrays comprising tens of millions of ultra-low noise (rms~2e−) pixels with associated read-out circuitry.

The nanorod array designs may be retrofit into standard Si-CMOS detector-arrays, using a 10 micron pixel capability instead of the typical 1-2 micron pixel capability used in many camera detector arrays. This may facilitate rapid transition to high volume manufacturing while allowing for using multi-mega-pixel imaging.

In an n-type arrangement under bias, the current is dominated by electron-flow from the metal into the semiconductor, and the total thermionic current is given by the following equation [Sze, S. M., & Ng, K. K., 2007; 'Physics of Semiconductor Devices', 3$^{rd}$ Edition, Wiley-Interscience]:

$$I := A \cdot R \cdot T^2 \cdot \exp\left(\frac{-\phi \cdot q}{k \cdot T}\right) \cdot \exp\left[\left(\frac{V \cdot q}{k \cdot T}\right) - 1\right]$$

where V is the applied bias voltage V, $\phi$ the barrier height, T is the temperature (deg K), k is Boltzmann's constant, q is the electron charge, R is the Richardson constant, and A is the cross-sectional area of the metal.

For Si<100> and Si<111>, the values of R are known to be ~246 and ~258 respectively. For GaAs, R ~8.04.

The depletion region width of the semiconductor, W, is estimated from:

$$W := \left[ 2 \cdot \frac{\varepsilon s \cdot (Vbi - V)}{q \cdot Nd} \right]^{\frac{1}{2}}$$

where $\in$S is the relative permittivity of the semiconductor, Nd is the dopant concentration, and Vbi is the built-in potential due to the metal-semiconductor interface, which for gold-silicon is −0.297 Volts for $10^{15}$ cm$^{-3}$ n-type doping. For sub-Volt detector bias, the depletion region will extend to ~1 µm to 3 µm.

For the barrier to work effectively, the doping of the semiconductor is preferably light to medium in level, somewhere between about $10^{15}$ cm$^{-3}$ and $5\times10^{16}$ cm$^{-3}$. Under high doping conditions of, say, ~$10^{20}$ cm$^{-3}$, tunneling through the barrier is encountered. Such high doping conditions could be a basis of a variation on a gold nanoparticle silicon matrix detector design. The doping may be performed, for example, using arsenic doping, such as by arsene gas by diffusion at 1200° C., or by ion-implantation, for example.

Figure 2:
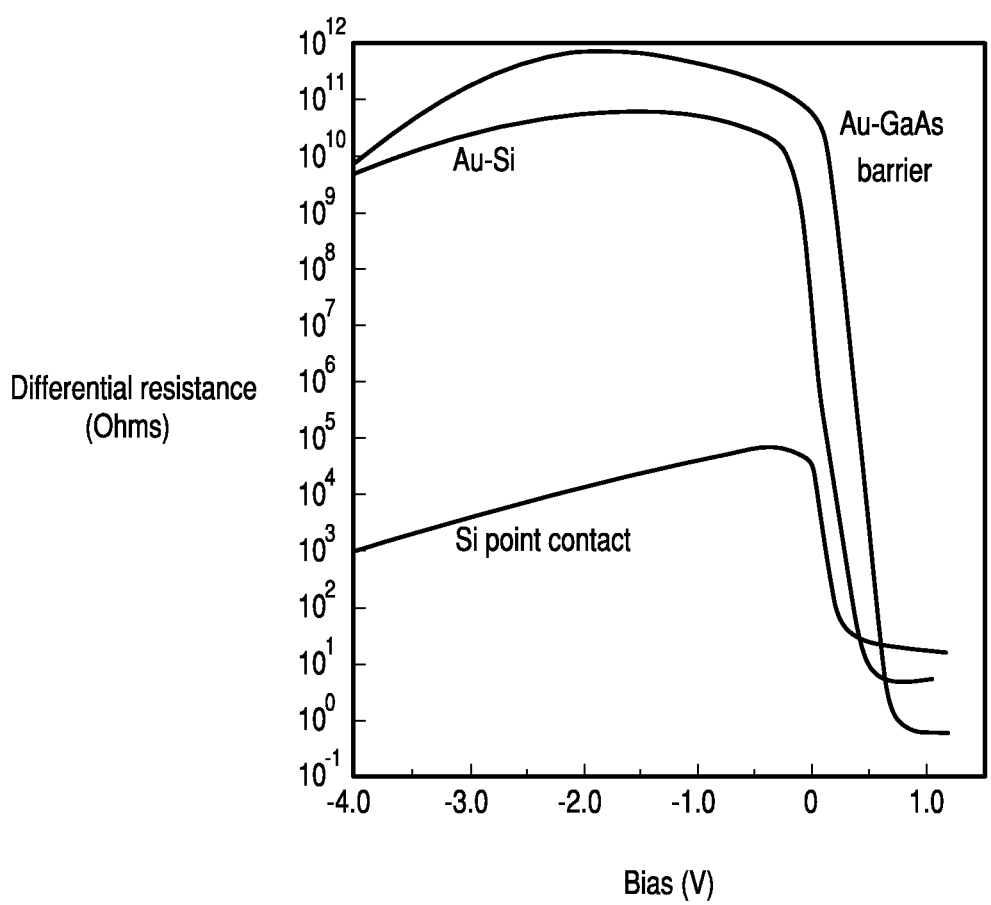
FIG. 2 is a graph showing the barrier resistance versus the bias voltage for different metal-semiconductor interfaces.

The doping and the metal-semiconductor interface affect the barrier. The barrier resistance versus applied bias for different contacts to silicon is shown in FIG. 2. From FIG. 2 it can be seen that a bias voltage of around ~0.5 Volts is useful.

Figure 3:
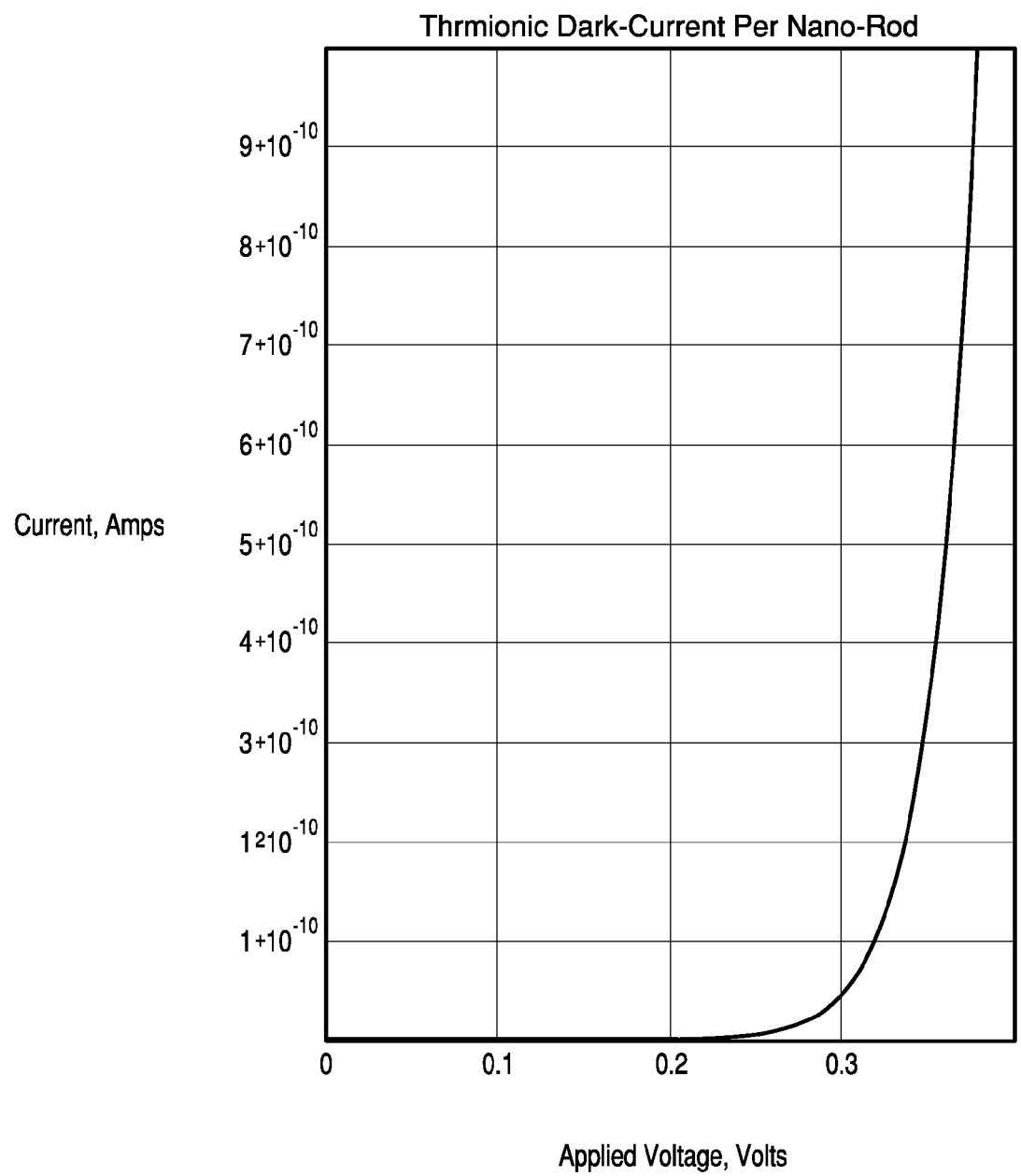
FIG. 3 is a graph showing the thermionic current versus applied bias voltage for a single gold nanorod of length 1 micron and diameter 0.1 microns in Si<100>, n-doped at $10^{15}$ $cm^{-3}$.

The dark current also depends on the metal-semiconductor interface and doping. For an exemplary single gold nanorod of 1 micron length and 0.1 microns diameter embedded in Si<100>, n-doped at $10^{15}$ cm$^{-3}$ the thermionic current can be calculated as shown in FIG. 3.

Figure 4:
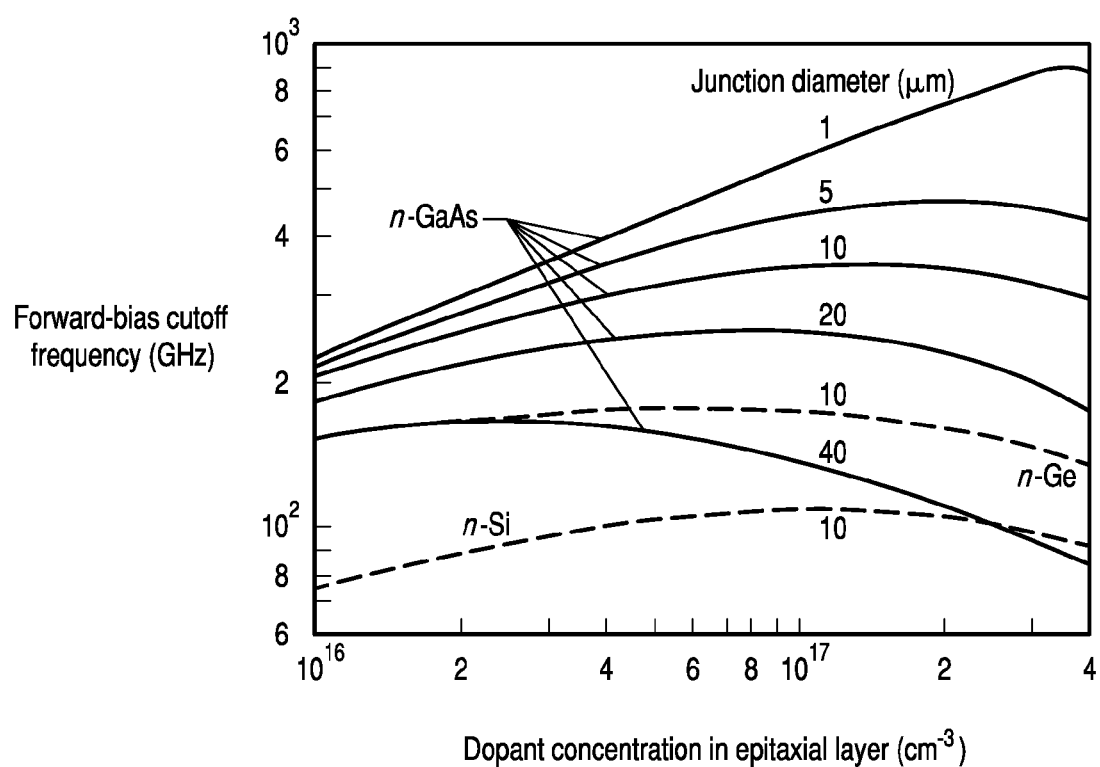
FIG. 4 is a graph showing the forward-bias cutoff frequency versus the dopant concentration.

The frequency response of the detector based on the metal-semiconductor interface may also be estimated. In FIG. 4 the frequency responses of various metal-Si visible light photodetectors whose pixel sizes are 1.0-40.0 microns is shown. Based on this, it is expected that the intrinsic performance will be in the tens of GHz range for a detector design using nanorods, when the n doping is at ~$10^{16}$ cm$^{-3}$.

Embodiments

Figure 5:
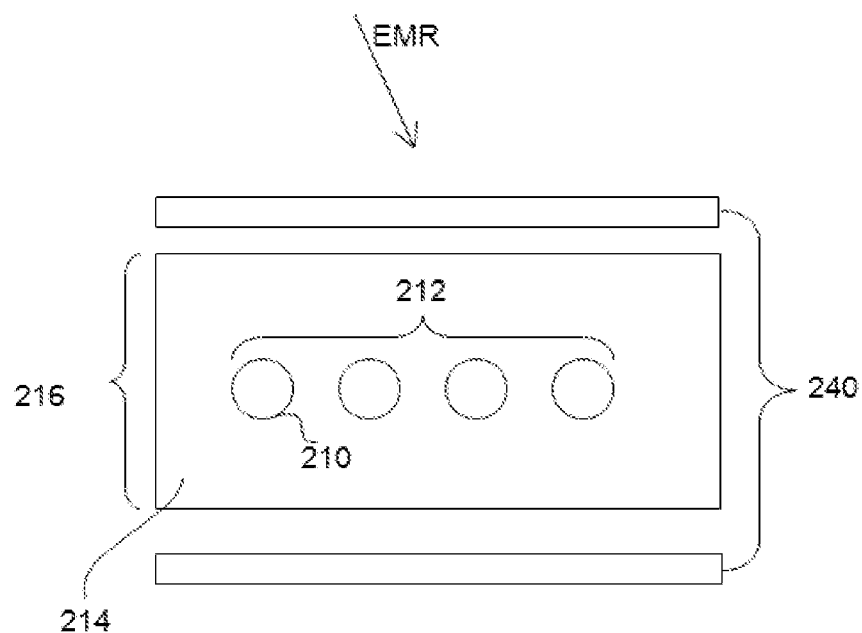
FIG. 5 is a schematic of an electromagnetic radiation detector according to an embodiment of the invention.

FIG. 5 illustrates a schematic of an EMR detector according to one embodiment of the invention. The EMR detector includes a detector material 216 and a voltage biasing element 240. The detector material 216 includes a substantially regular array 212 of nanoparticles 210 embedded in a matrix material 214. The voltage biasing element 240 is configured to apply a bias voltage to the matrix material 214 such that electrical current is directly generated based on a cooperative plasmon effect in the detector material when electro-magnetic radiation in a predetermined wavelength range is incident upon the detector material, where the dominant mechanism for decay in the cooperative plasmon effect is non-radiative.

LWIR Detector

Figure 6:
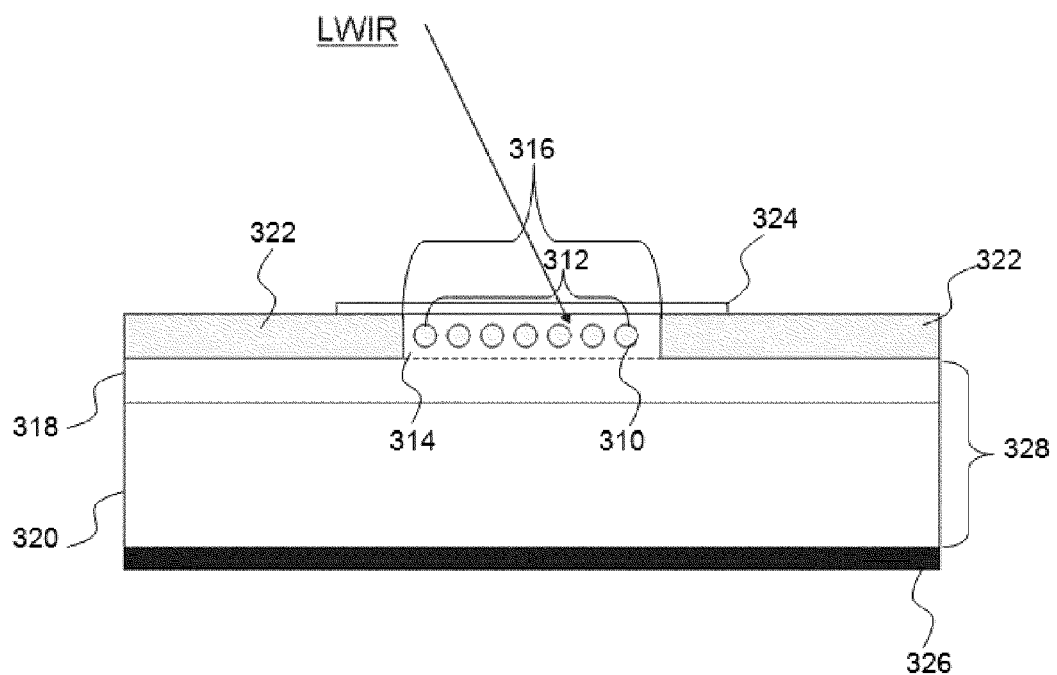
FIG. 6 is a schematic of an electromagnetic radiation detector according to another embodiment of the invention.

FIG. 6 illustrates a LWIR detector according to an embodiment of the invention. The detector in FIG. 6 includes a detector material 316 on a substrate 328, a top electrode 324, and a bottom electrode 326, where the top electrode and bottom electrode function as the voltage biasing element. The detector material 316 comprises a substantially regular array 312 of nanoparticles 310 embedded in a matrix material 314.

In this embodiment the nanoparticles 310 may be gold nanorods, which are embedded in the matrix material 314 which may be n-doped silicon. The n-doped silicon may have a doping concentration between about $10^{15}$ cm$^{-3}$ and $10^{20}$ cm$^{-3}$, for example.

Figure 7:
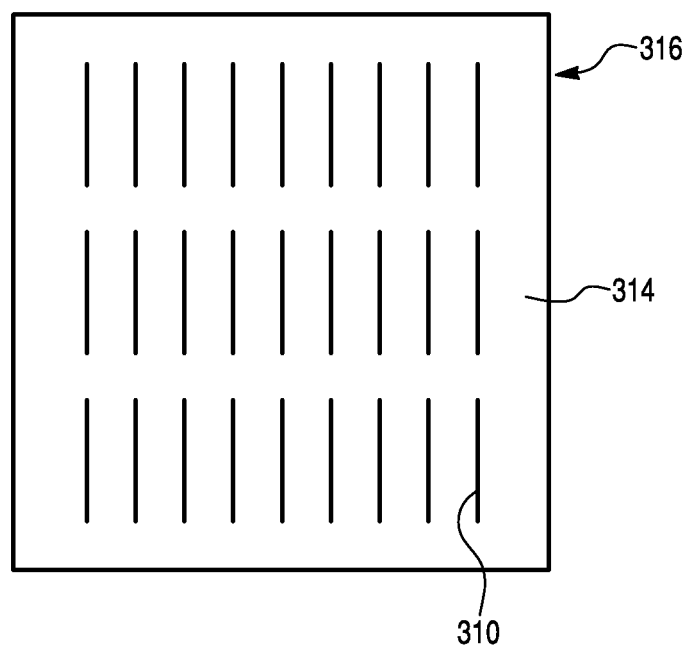
FIG. 7 illustrates a top view of a portion of the detector material of the detector of FIG. 6.

FIG. 7 illustrates a top view of a portion of the detector material 316 showing one pixel. As shown in FIG. 6, laterally surrounding the detector material 310 is a surface passivation layer 322, which may be an oxide layer about ≥0.1 micron thick. The substrate 328 may have an intermediate layer 318, which may comprise n-doped silicon with a doping concentration similar to that of the matrix material 314, and which may have a thickness, for example, of about two microns. The substrate 328 may also have a lower layer 320, which may be a n$^-$ or n$^+$ doped <100> or <111> silicon layer for example.

The detector may also have a guard-ring structure (not shown) to improve device performance as desired. The semiconductor materials of the detector may also have graded dopant-levels, as desired, to improve the performance.

The bottom and top electrodes 326 and 324 may be Ohmic contacts in nature, and may be formed of a suitable conductor such as Pt—Si or Al, for example, and may have a suitable high doping in the semiconductor material immediately adjacent to those metals. The top electrode should be sufficiently thin, such as approximately 10 nm thick or less, so that it is a transparent conductor to the desired EMR to be detected.

Figure 1B:
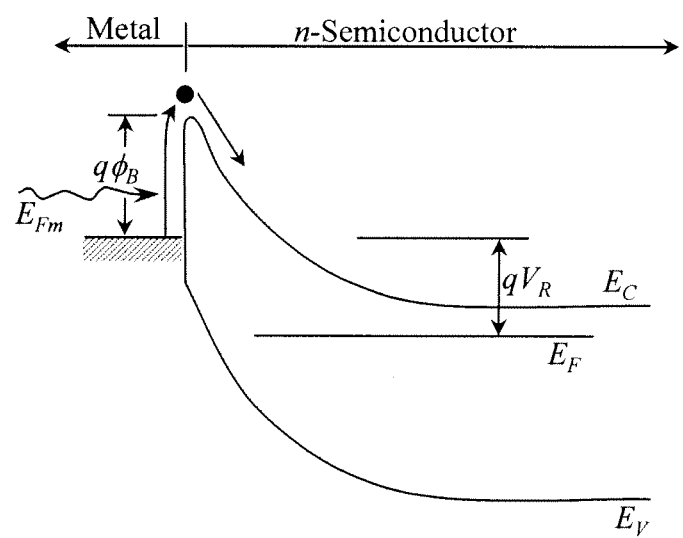
FIG. 1b is a diagram illustrating the energy levels at metal-semiconductor interface with a plasmon excitation.

The dominant dark current in this embodiment is thermionic emission of the majority carriers, the electrons; but for high doping of the matrix material 314, tunneling transmission of electrons through the metal-semiconductor barrier provides a significant contribution to the current, and thus also to the dark current. The signal current is primarily the electron-emission over the barrier as shown in FIG. 1b, created by the applied bias voltage, but the tunneling-current can also provide a significant enhancement.

The detector of FIG. 6 may be formed by known semiconductor processing techniques. An example follows. The bottom electrode 326 may be formed on the lower layer 320 of the substrate 328, where the lower layer 320 may be n or n+Si<100> or Si<111>. The upper layer 318 may be formed, for example, as a thin layer of n-doped Si, about 1 micron thick, doped somewhere between about $10^{15}$ cm$^{-3}$ and $5\times10^{16}$ cm$^{-3}$, for example. A mask, such as a photolithographic mask, may be formed on the upper layer 318 to define pixels of a size 10 microns square, where each hole in the mask material defines the pixel size for a respective pixel. The nanoparticles 310, such as gold nanorods, may then be formed within the hole in the mask, with a regular spacing between the nanoparticles 310. The matrix material 314 may be formed on the nanoparticles 310, by coating the nanoparticles 310 with amorphous Si, for example, to a depth of about 100 nm, where the Si is doped somewhere between about $10^{15}$ cm$^{-3}$ and $5\times10^{16}$ cm$^{-3}$. The mask material may then be removed. The matrix material 314 may be coated with about ≤10 nm thickness of Pt—Si to create the top electrode 324 as an ohmic contact that is transparent to LWIR. The 10 micron pixel area may be mask blocked and a thin (0.1 µm to 1.0 µm) layer of SiO$_2$ may be formed over the area surrounding the pixel, and down the sides of the device, to act as the surface passivation layer 322 and to block current-leakage. Wire bond contacts to the top and bottom electrodes 324 and 326 may be then be formed to allow for an application of bias voltage.

As an alternative to defining the pixel by forming a mask on the upper layer 318, a SiO$_2$ overcoat may be formed on the upper layer 318 to act as the passivation layer 322, and the passivation layer 322 then patterned to define the pixel regions. In this process a photoresist may be formed on the passivation layer 322, and the photoresist may be illuminated through a photomask, and then developed to define the pixel regions. The passivation layer 322 may then be etched down to the upper layer 318 using the patterned photoresist as an etch mask. Amorphous Si may then be deposited in the pixel regions to a depth of 1-2 microns and n-doped to about between $10^{15}$ cm$^{-3}$ and $5\times10^{16}$ cm$^{-3}$, followed by applying a regular array of nanoparticles 310, such as gold nanorods, to the amorphous Si. Si is then deposited to a thickness of about 0.1 microns to embed the nanoparticles 310, and form the matrix material 314 along with the deposited amorphous silicon. The matrix material 314 may be coated with about ≤10 nm thickness of Pt—Si to create the top electrode 324 as an ohmic contact that is transparent to LWIR. A suitable area of SiO$_2$ passivation is applied around the edges of the pixel to finish the passivation layer 322. Wire bond contacts to the top and bottom electrodes 324 and 326 may be then be formed to allow for an application of bias voltage. Optionally, a guard ring could be formed.

Electronics for Low-Noise Post-Detection Processing for the LWIR Detector

Figure 8:
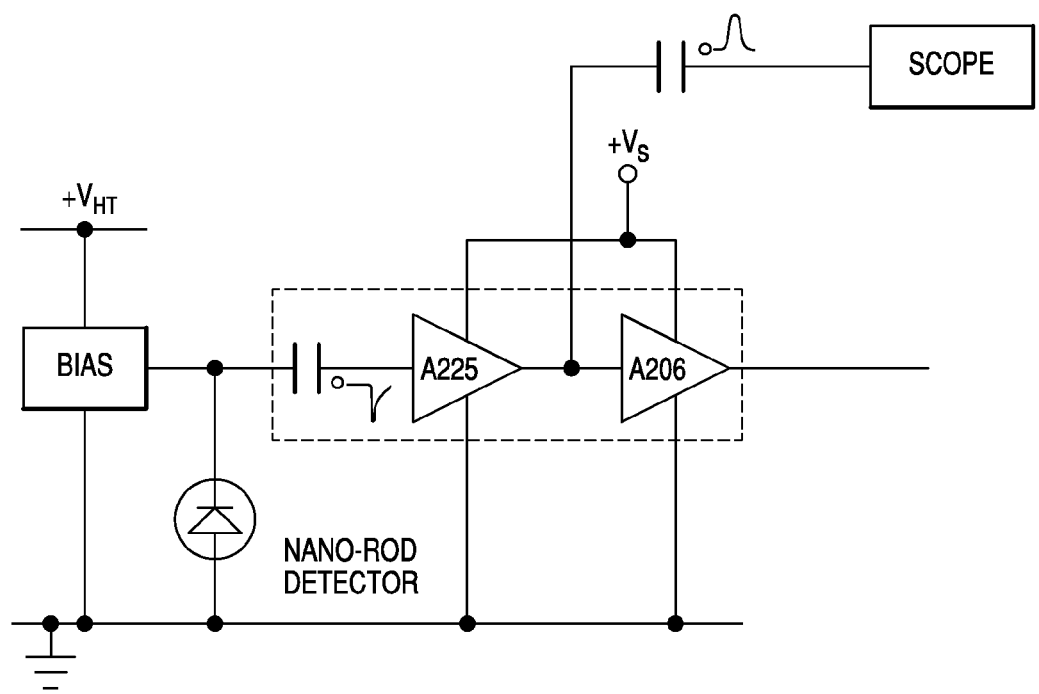
FIG. 8 is a schematic showing a post-detection signal-processing circuit for ultra-low current detection with minimal noise to be used with the detector according to an embodiment of the invention.

A circuit for low-noise post-detection processing for the LWIR detector may be provided as shown in FIG. 8. The circuit may have a very low-noise pre-amplifier, such as for example, the AMPTEK A225 (or A250) followed by analog-threshold discrimination, the A206 voltage amplifier and low-level discriminator. Use of groundplane shielding on the circuit card, and possibly Faraday cage isolation to reduce pick-up may also be used.

Nano-Particle Parameters and Device Performance

To determine the device performance, we presume a pixel with a gold nanorod array arranged as shown in FIG. 7. Rows of precisely-spaced nanorods are provided to enhance the plasmon response to the detected EMR. The pixel size is taken to be a 10 micron square detector element, such as might be typical for use with LWIR. In practice, the size could be reduced to a 1 micron square for the purpose of super resolution imaging.

We further assume 400 nm long, 20 nm diameter gold nanorods arranged in a parallel array lattice, spaced for a maximum polarizability response where the nanorods are separated by an optimum 0.3 microns. In this case, we have 33 nanorods in each row, where we further presume these nanorods are embedded in silicon of <0.1 micron thickness. The number of rows of these nanorods in the pixel is 25 to provide adequate row-to-row separation for row independence. The pixel thus has ~830 gold nanorods in an array contributing to separation enhanced polarizability, and thus to the signal strength. For the arrangement of FIG. 7, where the long axes of the nanorods are aligned in the same direction, the array can detect a chosen single polarization (oriented along the direction of the long axes), and thus is polarization selective.

The detector performance depends on the detector structure, and in particular on the parameters of nanorod shaped nanoparticles, with different aspect ratios, surrounding medium, polarization of the incident EMR, and regular arrays of particles, as described below.

Different Aspect Ratios for Single Nanoparticles

Figure 9:
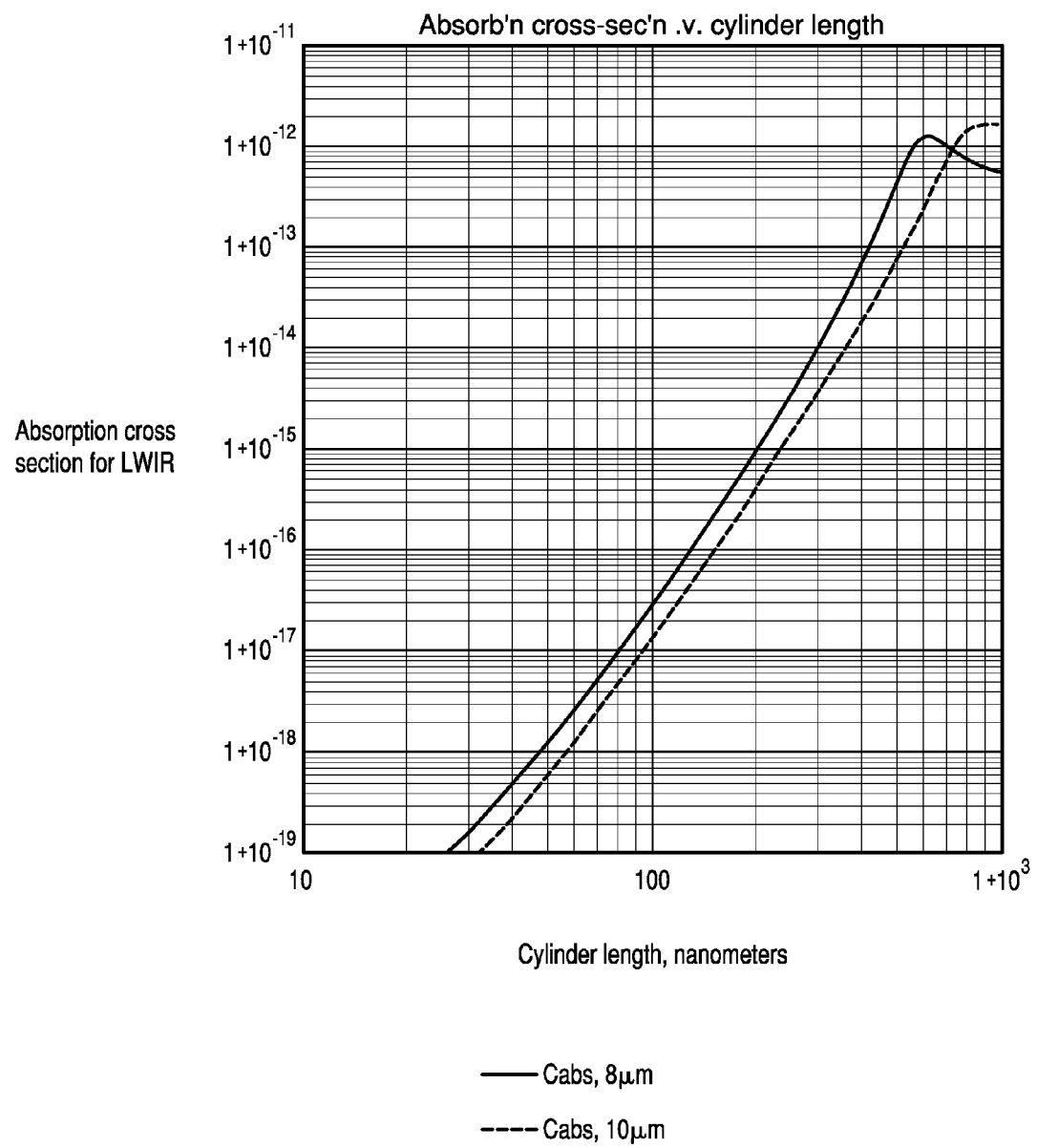
FIG. 9 is a graph showing the absorption cross section versus cylinder length for 10 nm diameter gold nanorods embedded in air for 8 and 12 micron EMR wavelengths.

The results shown in FIG. 9 illustrate results of calculations determining if any resonance or other optimized condition exist for gold nanorods in the wavelength range of interest, in this case LWIR.

Using the mathematics described in the Technology Background section above, the FIG. 9 curves are calculated for the absorption cross sections of 8 and 12 micron LWIR radiation for 10 nm diameter gold nanorods, as a function of nanorod length, up to the point where the scattering/absorption approximations become invalid (approximately $\frac{1}{10}$th wavelength, i.e, a 1 micron rod length). As shown, the peak absorption cross section is in the region of nanorod length 600 nm to 900 nm.

Figure 10:
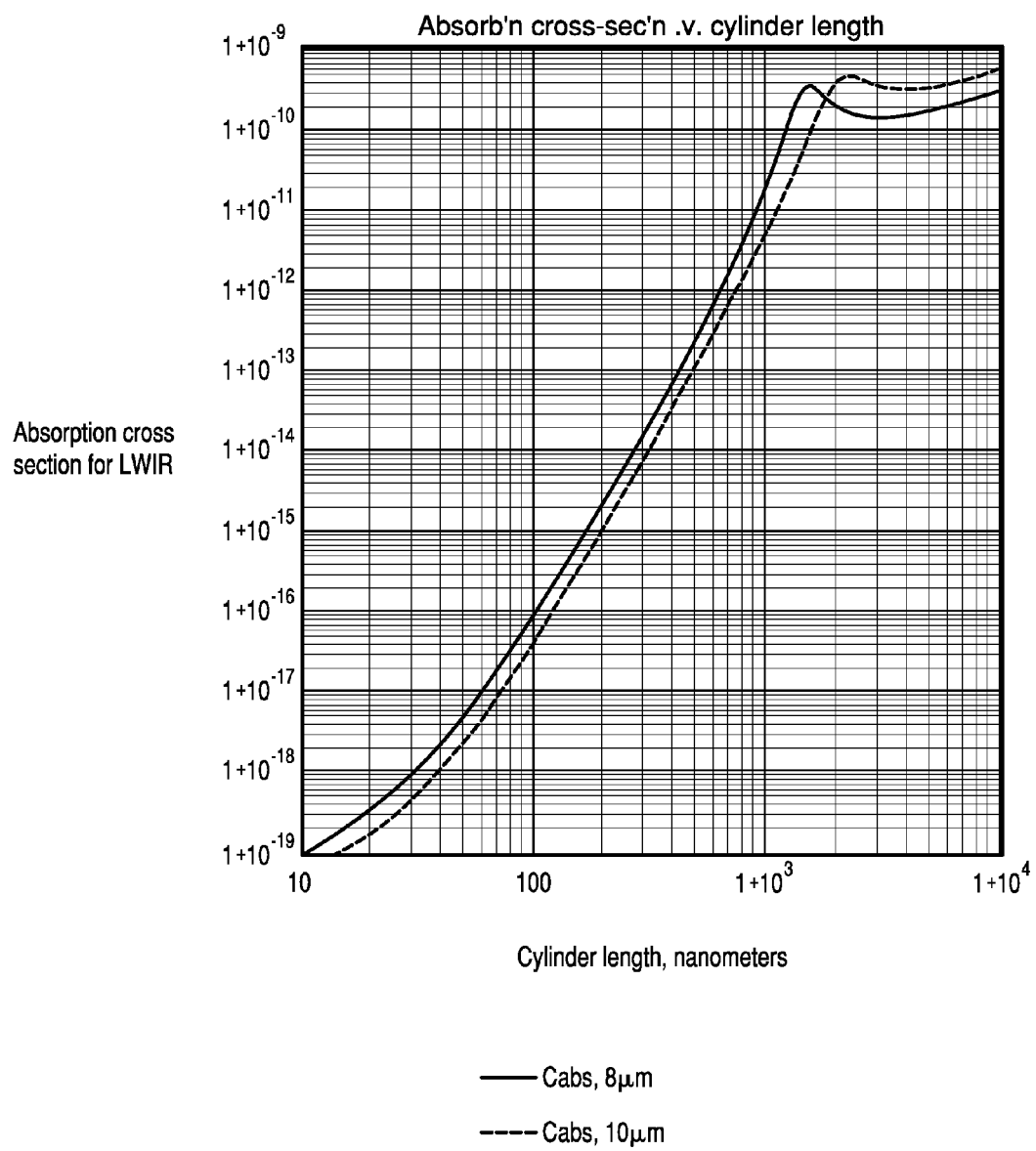
FIG. 10 is a graph showing the absorption cross section versus cylinder length for 100 nm diameter gold nanorods embedded in air for 8 and 12 micron EMR wavelengths.

To see the magnitude of the effect of aspect ratio on the absorption cross section, the absorption cross sections for 100 nm diameter nanorods were computed as shown in FIG. 10. In this case, the peak absorption cross section region has moved out to ~1500 nm-2000 nm for the LWIR wavelengths, and the absorption cross section has increased by 2 orders of magnitude.

Figure 11:
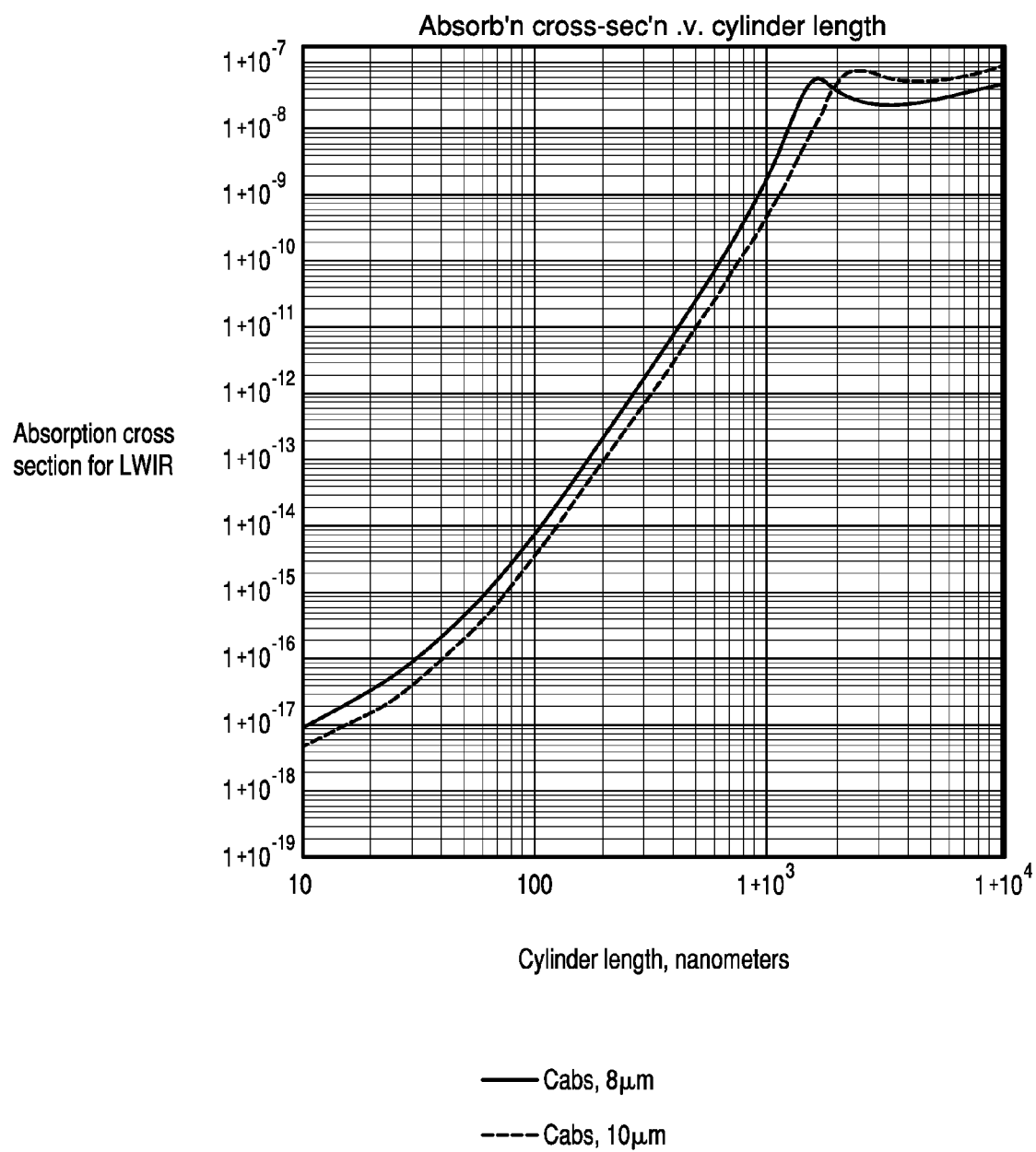
FIG. 11 is a graph showing the absorption cross section versus nanosphere' diameter for gold nanospheres embedded in air for 8 and 12 micron EMR wavelengths.

The absorption cross sections for 1000 nm diameter nanorods were computed as shown in FIG. 11. For FIG. 11, the diameter of the rods were fixed at 1000 nm, while the cylinder length was increased up to 1000 nm and just beyond to the peak, so the nanoparticle goes from a disk to a sphere as the cylinder length increases to 1000 nm, and peaks as an oblate sphere shape at ~1500 nm.

From FIGS. 9-11 it can be seen that the LWIR absorption cross section is calculated to be yet another two orders of magnitude higher, and that condition occurs when the nanorod has become a slightly oblate nanosphere at around 1500 nm-2000 nm (2 microns) diameter for the LWIR spectral region. It should be noted that for the parameters in FIGS. 9-11, the theory for calculation is at the edge of its validity. For particles embedded in media other than air, as described below, the validity improves satisfactorily.

Nanoparticles Surrounded in Different Mediums

FIGS. 9-11 examine the absorption characteristics of gold nanorods embedded in air, such as might occur on top of a detector substrate. In this section, there is described the absorption characteristics for gold nanorods embedded in media other than air.

Figure 12:
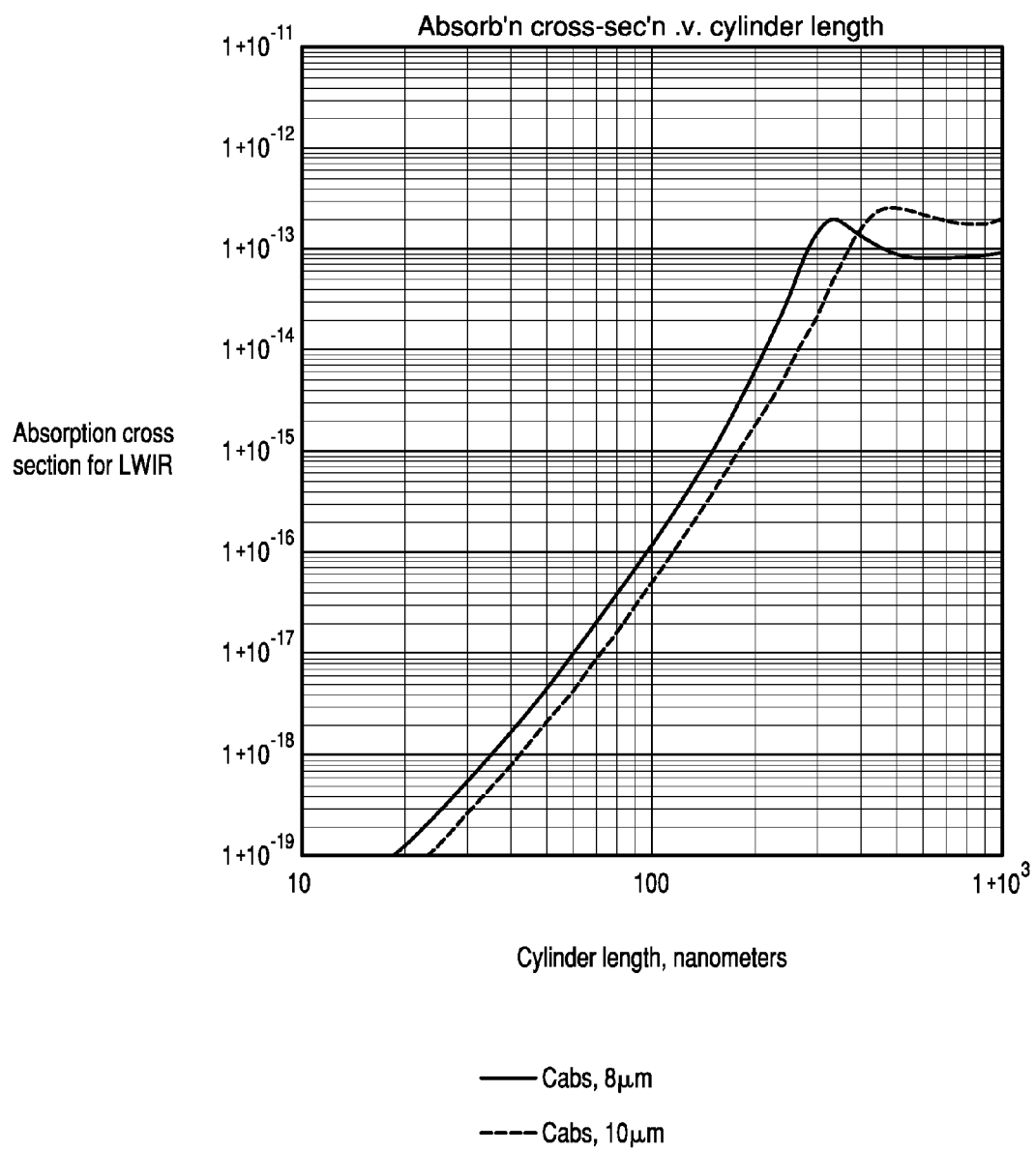
FIG. 12 is a graph showing the absorption cross section versus cylinder length for 10 nm diameter gold nanorods embedded in a material with a dielectric constant of 3.5 for 8 and 12 micron EMR wavelengths.
Figure 13:
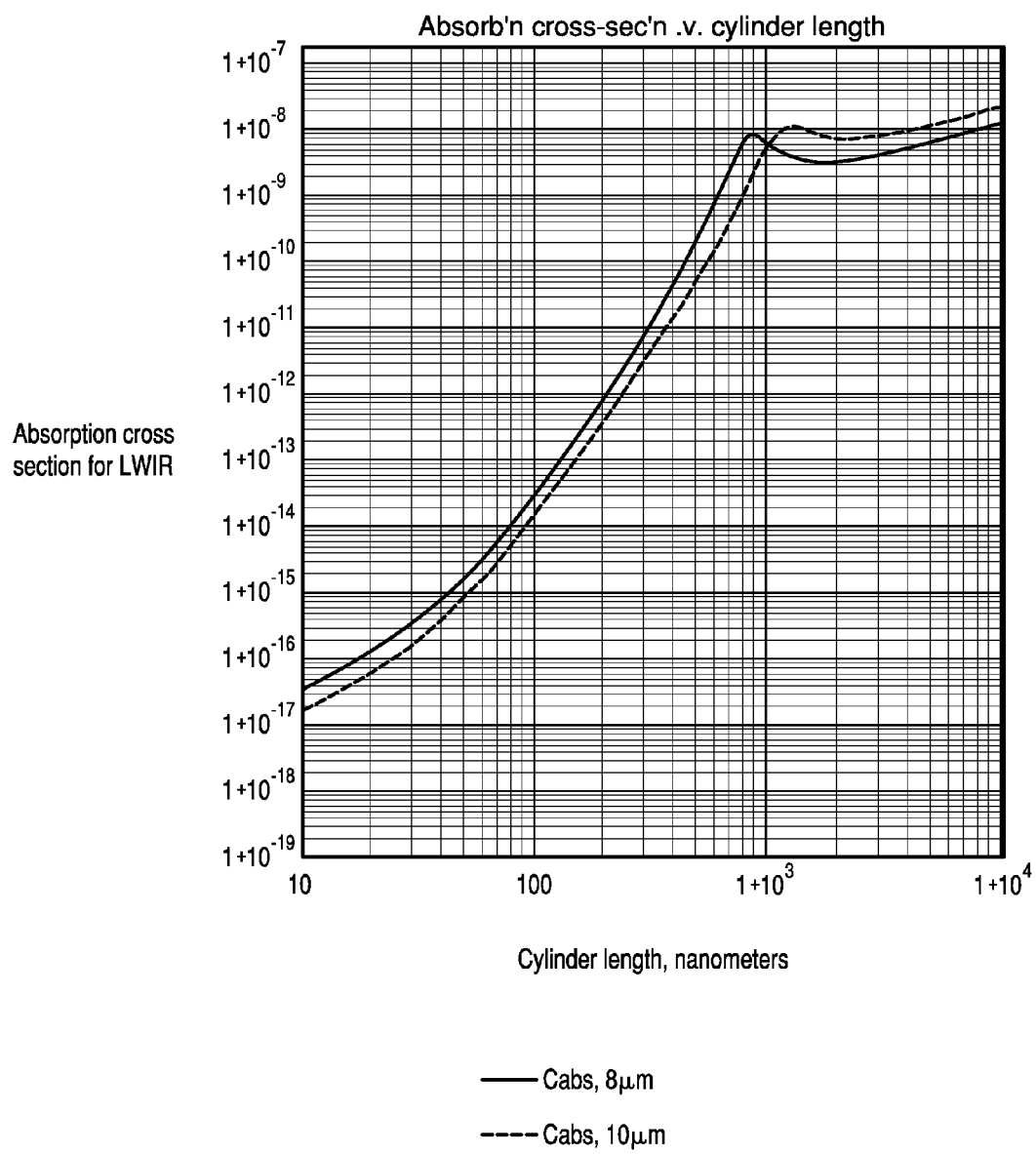
FIG. 13 is a graph showing the absorption cross section versus nanosphere' diameter for gold nanospheres embedded in a material with a dielectric constant of 3.5 for 8 and 12 micron EMR wavelengths.

If FIG. 9 is recalculated using a dielectric constant value of 3.5, greater the 1.0 value for air, for the surrounding medium we get FIG. 12. As shown in FIG. 12, the absorption cross section of the nanorods has reduced in value, as compared to. FIG. 9, by a factor ~×10, i.e., one order of magnitude. The peak absorption cross section has also been reduced to nanorod lengths of 300 microns to 500 microns. The corresponding recalculation of FIG. 11, where the nanoparticles are now embedded in a dielectric constant of ~3.5, which peaks for near spheres, is shown in FIG. 13.

Not only is a reduction observed in the absorption cross section of nearly an order of magnitude (as with the nanorod case in FIGS. 12 and 9), but the optimum sphere size can be seen for the absorption of 8-12 micron LWIR to also be reduced—to become a nanosphere diameter of approximately 1 micron in this dielectric material.

If the dielectric constant is increased to 7.0, the sphere's peak absorption cross section range reduces further, to 600-900 nm diameter, and the absorption cross section decreases by another half-order of magnitude.

Different Polarizations

In all the above calculations for different aspect ratios and different surrounding media, the polarization of the incident LWIR is parallel to the long axis of the gold nanorods.

If we examine the orthogonal polarization, the transverse plasmon is excited instead of the longitudinal plasmon. In this case, the absorption coefficients are correspondingly smaller by roughly the aspect ratio. Thus in deploying any nanorods for unpolarized LWIR detection some regular (or random) array of rod axis directions would be necessary. For detection of polarized LWIR, orientation of the nanorod axes (along the direction of the desired polarization) might be used effectively to discriminate in favor of detection of the desired polarization, and could reduce unwanted noise. For example, a 10 nm diameter rod whose length is 1000 nm offers polarization selection ~100:1.

Regular Arrays of Nanoparticles

Figure 14:
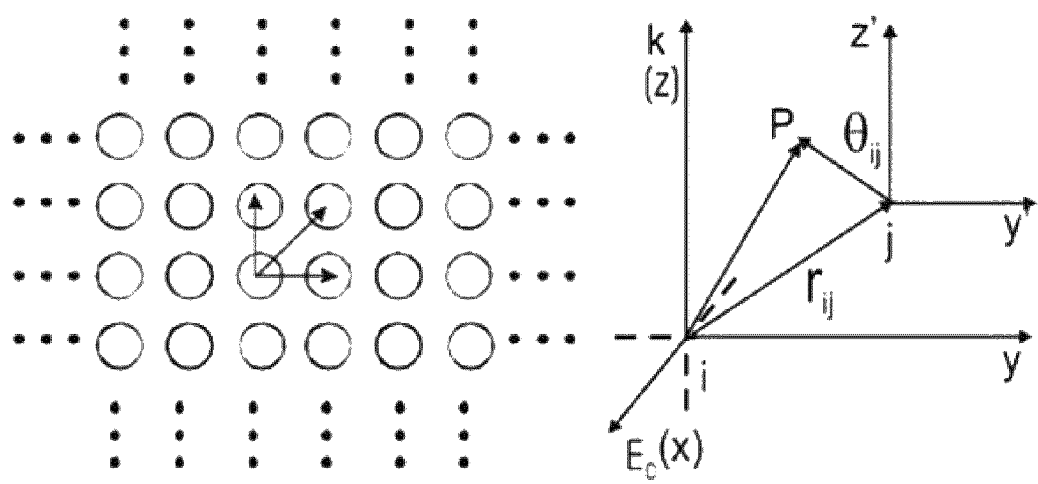
FIG. 14 illustrates the structure of a two-dimensional infinite array and the definition of a coordinate system with P as an observation point.

[Zhao, L. L., et al, 2003; 'The Extinction Spectra of Silver Nanoparticle Arrays: Influence of Array Structure on Plasmon Resonance Wavelength and Width', J. Phys. Chem. B, 107, pp 7343-7350] and [Wokaun, A., 1985; 'Surface enhancements of optical fields', Molecular Physics, 56, 1, pp 1-33] provide a theoretical basis for proceeding with a regular lattice of nanoparticles and computing the absorption cross section characteristics. While the full mathematics becomes difficult; the simplest and most useful way to use the math in [Zhao, L. L., et al, 2003; 'The Extinction Spectra of Silver Nanoparticle Arrays Influence of Array Structure on Plasmon Resonance Wavelength and Width', J. Phys. Chem. B, 107, pp 7343-7350] is as follows, where the equations relate to the co-ordinate system shown in FIG. 14.

$$\alpha_{cluster} = \frac{\alpha_s}{1 - \alpha_s S} \text{ and } C_{ext} = 4\pi k \text{Im}(\alpha_{cluster}) \quad (12)$$

S being the retarded dipole sum $$S = \sum_{j \neq i} \left[ \frac{(1 - ikr_{ij})(3\cos^2\theta_{ij} - 1)e^{ikr_{ij}}}{r_{ij}^3} + \frac{k^2 \sin^2\theta_{ij} e^{ikr_{ij}}}{r_{ij}} \right] \quad (13)$$

where $r_{ij}$ is the vector between the i-th and j-th nanoparticles, and $\alpha_s$ is the polarizability for a single nanoparticle.

Equation (12) above may be used, where $\alpha_{cluster}$ is used in '$C_{abs}$' in the place of '$C_{ext}$', where: $C_{abs}$=k Im{$\alpha_{cluster}$} and {k=2π/λ}, which is valid if the scattering is very small compared to the absorption [van de Hulst, H. C., 1957 & 1981; 'Light Scattering by Small Particles', Dover].

[Yamaguchi, T., et al, 1974; 'Optical effect of the substrate on the anomalous absorption of aggregated silver films', Thin Solid Films, 21, pp 173-187] provides expressions for the terms in S in the equation above, calculated numerically:

$$\sum_j \frac{1 - 3\cos^2\theta'_j}{r_j^3} = -0.716 \frac{d_w}{2a} \quad (10)$$

$$\sum_j \frac{1}{r_j^3} = 0.716 \frac{d_w}{a}$$

where dw is the mean thickness of the layer, and a is the lattice-constant, which is small compared to λ.

Figure 15A:
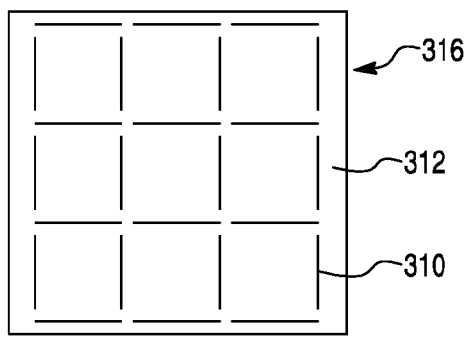
FIGS. 15a, 15b and 15c respectively illustrate of a detector having different polarization geometries showing nanoparticles array with respectively a checker-board geometry, a parallel array geometry, and different parallel array geometries placed in different quadrants in a single pixel.
Figure 15B:
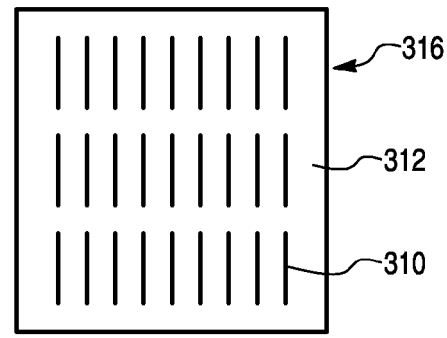
Figure 15C:
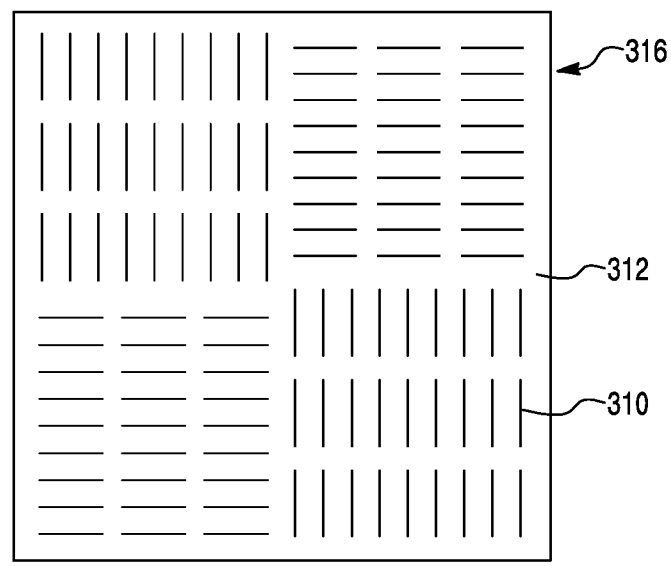

Thus, the following nanoparticle geometries may be calculated fairly accurately for their polarization and wavelength discrimination potential advantages. FIGS. 15*a*, 15*b*, and 15*c* illustrate different polarization geometries.

The geometry of FIG. 15*a* offers the possibility of detecting orthogonal 'pure' polarizations within a single pixel by electrically connecting to the rows and columns. FIG. 15*b* offers the possibility of discriminating a single polarization state in a pixel. FIG. 15*c* offers the possibility of detecting multiple specific wavelengths, by using rod length variations, and specific polarizations within the same pixel.

When the nanorods are arranged in parallel arrays, per FIG. 15*b*, the spacing between the rods critically determines the effective polarizability of an individual rod, so that the number of rods may then be summed to get the total effective polarizability of the array. As an example, consider the variation of polarizability of 400 nm long gold nanorods of 20 nm diameter illuminated by 10 micron wavelength LWIR. The optimum spacing of the rods is seen in FIG. 15*d* to be around $10^{-7}$ m for maximum polarizability (signal response).

Responsivity

Calculation of the responsivity will depend on the mechanism used to transfer power from the nanoparticle array into an electrical signal. One mechanism that may used to transfer power from the nanoparticle array into an electrical signal constituting the detection of incident radiation, is by coupling the localized plasmon in the nanoparticles into the substrate for detection, i.e., using the electron cloud directly. Such a mechanism is a most efficient way of using the 'electron-cloud' localized plasmons induced in the nanoparticles by the incident LWIR to be detected.

Direct electrical monitoring of the Plasmon generation can be achieved in a number of ways, such as (1) resistance measurement, (2) potential/voltage-fluctuation measurement, or (3) capacitance-change. The direct electrical monitoring method chosen will depend on the particular geometry in which the nanoparticle array is configured. An electric field may be applied via a dielectric interface, to enhance and modify optical plasmon resonance.

As an example configuration used for the calculation, consider the following structure. A regular square pattern array of gold nanorods of 10 nm diameter and ~1000 nm (1 micron) length, where the nanorods are arranged in a checkerboard array (see FIG. 15*a*), on a silicon substrate whose pixels are 30 microns square. The square array comprises 30 rows and 30 columns, thus yielding 900 nanorods on the pixel surface. This arrangement provides sufficient nanorod separation for an insignificant spectral shift of the longitudinal plasmon absorption peak, and allows for the detection of random polarized incident LWIR EMR (as the EMR decomposes into the two orthogonal directions of the nanorods). For the calculation an unpolarized LWIR of 8 and 12 microns wavelength is presumed.

This array structure has an electron (dipole) coupling coefficient of ~0.001, because the nanorods on top of the substrate in air are primarily reradiating photons. In this calculation the absorbed energy, not the scattered energy, is of interest.

The mean photon counting rate is inserted into the calculation using the value of the absorption cross section, Cabs, per FIG. 9. The detector internal quantum efficiency is conservatively presumed to be 50%. The photodetection rate may be converted to photoelectron current, using the fact that each photoelectron is $1.6 \times 10^{-19}$ Amps. For calculation convenience, the incident LWIR is assumed to be 1 Watt.

Figure 16:
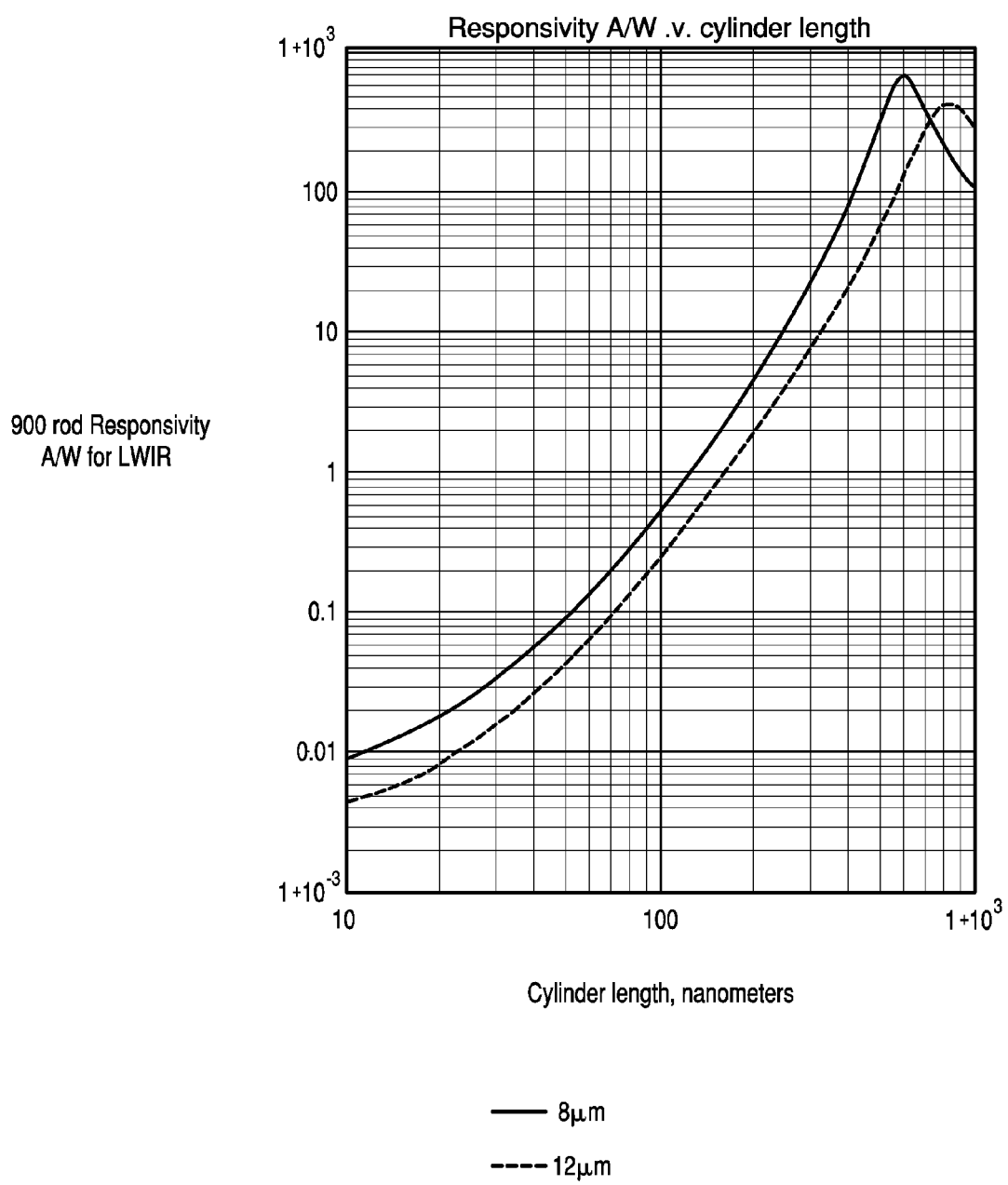
FIG. 16 is a graph illustrating the responsivity as a function of nanorod length for 10 nm diameter nanorods embedded in air, for 8 and 12 micron EMR wavelengths.

Using these parameters, the following responsivity curve as a function of nanorod length is calculated, as shown in FIG. 16, where the responsivity is calculated as Amps per Watt. FIG. 16 closely follows the shape of the FIG. 9, where the absorption cross section curve shown there is converted into actual photodetection and then into coupled photocurrent.

Figure 17:
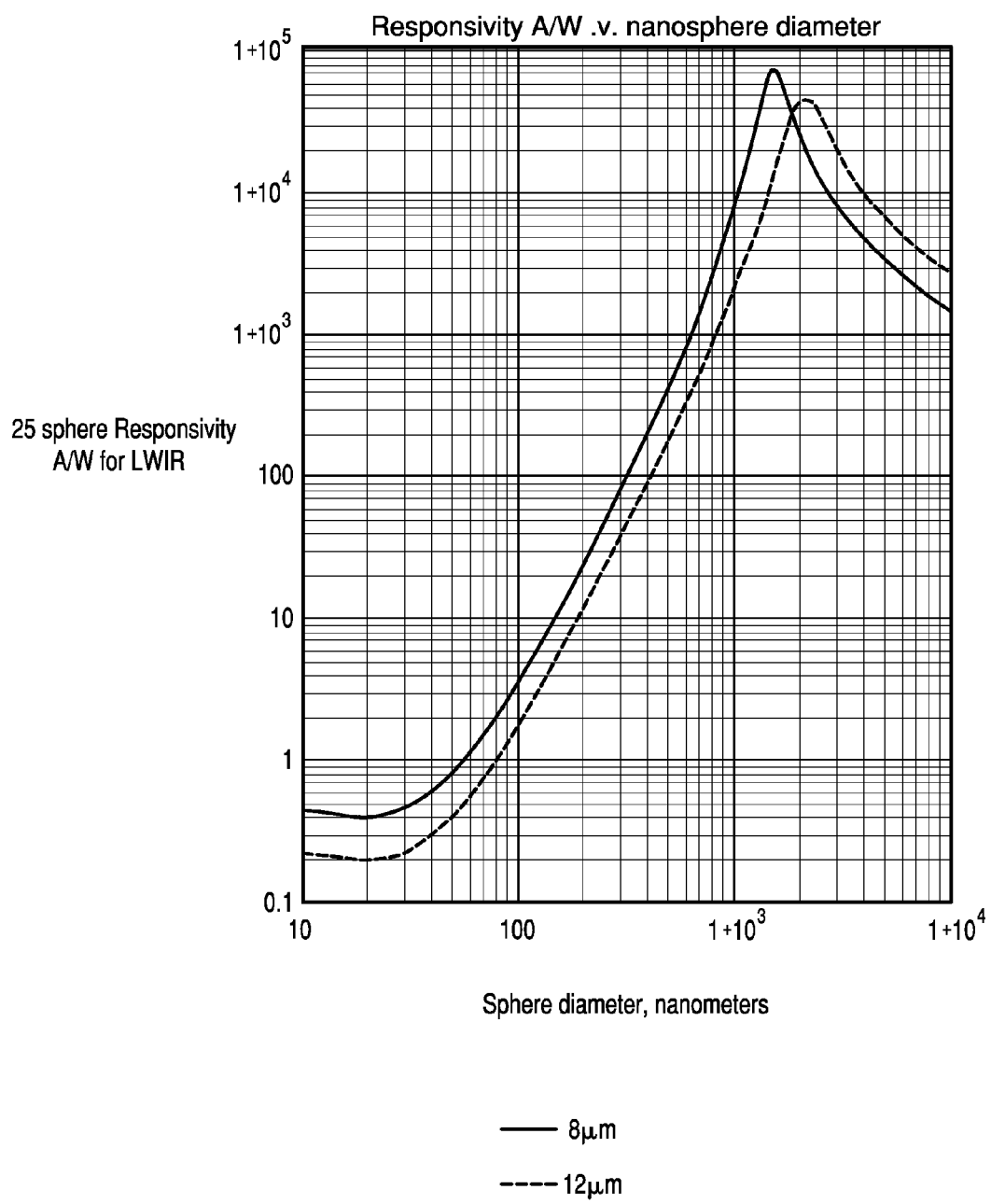
FIG. 17 is a graph illustrating the responsivity as a function of nanosphere diameter for gold nanospheres embedded in air for 8 and 12 micron EMR wavelengths.

FIG. 17 illustrates the calculation for gold nanospheres on the substrate, for comparison. The peak in FIG. 17 occurs for ~1.5-micron diameter nanospheres in air, so the lattice spacing should be increased to about 6 microns, and the number of nanoparticles therefore falls to just 25 over the pixel. The coupling coefficient is ~0.01, because the photons are not primarily reradiating as a nanorod typically does. In spite of the reduced number of sphere shaped nanoparticles, the responsivity has increased by about more than an order of magnitude at the peak.

Comparison with Microbolometers

The responsivity of the system for FIGS. 16 and 17 can be compared with a microbolometer system. The principles and practice of microbolometer LWIR detection are well known and understood, for example as summarized by [Kruse, P. W., 2001; 'Uncooled Thermal Imaging Arrays, Systems, and Applications', SPIE Tutorial Texts in Optical Engineering, Vol. TT51] and [Radford, W. et al, 1999; 'Sensitivity improvements in uncooled microbolometer FPAs', Proc. SPIE, Vol. 3698, pp 119-130].

[Radford, W. et al, 1999; 'Sensitivity improvements in uncooled microbolometer FPAs', Proc. SPIE, Vol. 3698, pp 119-130] provides an example of a microbolometer system with pixel dimensions of 50 microns, spectral performance of 8-14 microns, absorptivity >80%, detector nonuniformity of ~10%, and particularly the signal responsivity of >5×10$^6$ Volts per Watt, which provides the basic sensitivity of the pixels. Using the stated nominal resistance of 50,000 Ohms, this translates to a basic minimum responsivity of 100 Amps per Watt at room temperature. More recent microbolometer systems perform even better than the Radford specifications.

Figure 18:
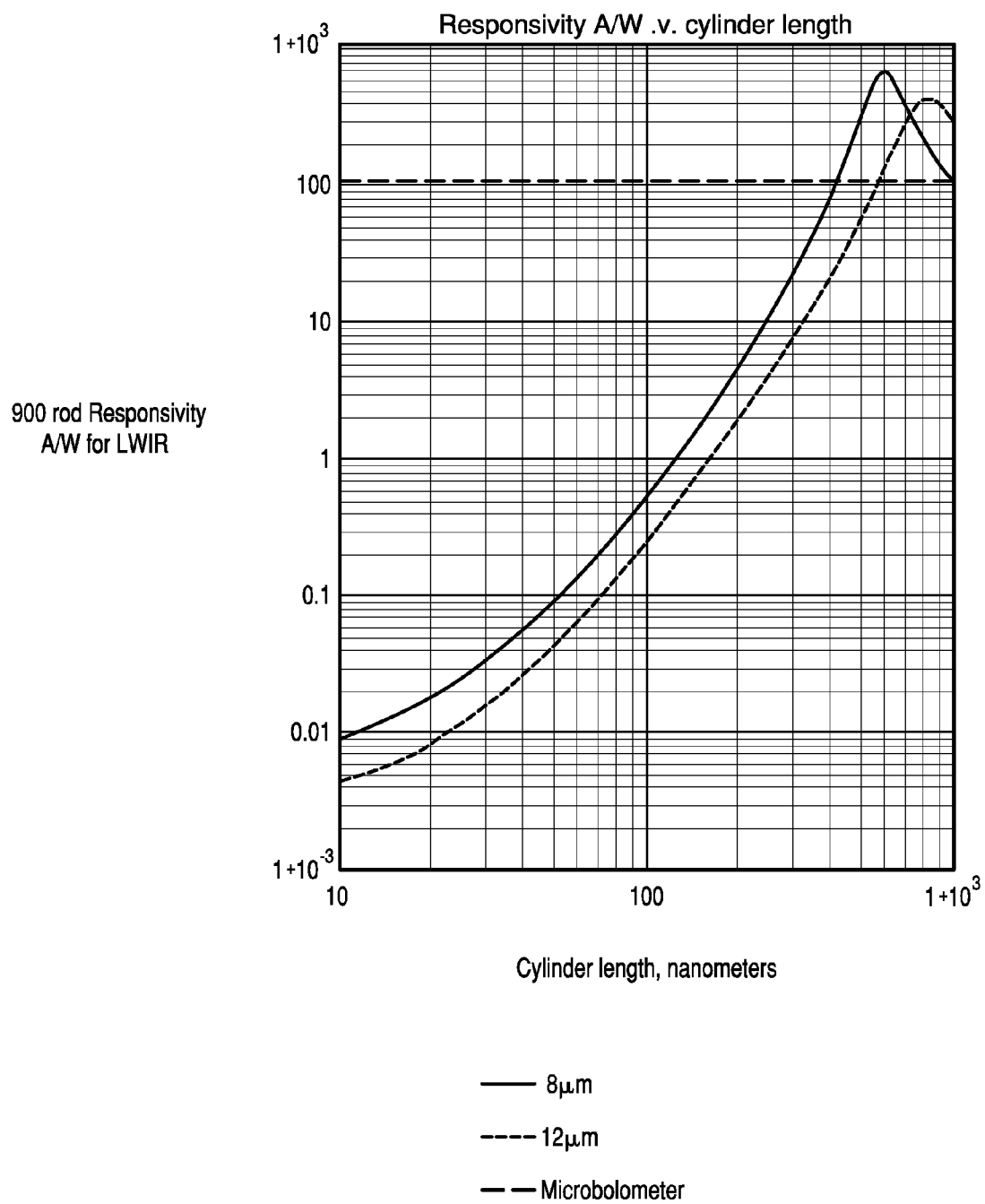
FIG. 18 is a graph illustrating the responsivity as a function of nanorod length for 10 nm diameter nanorods embedded in air, for 8 and 12 micron EMR wavelengths, and compared to a microbolometer responsivity.
Figure 19:
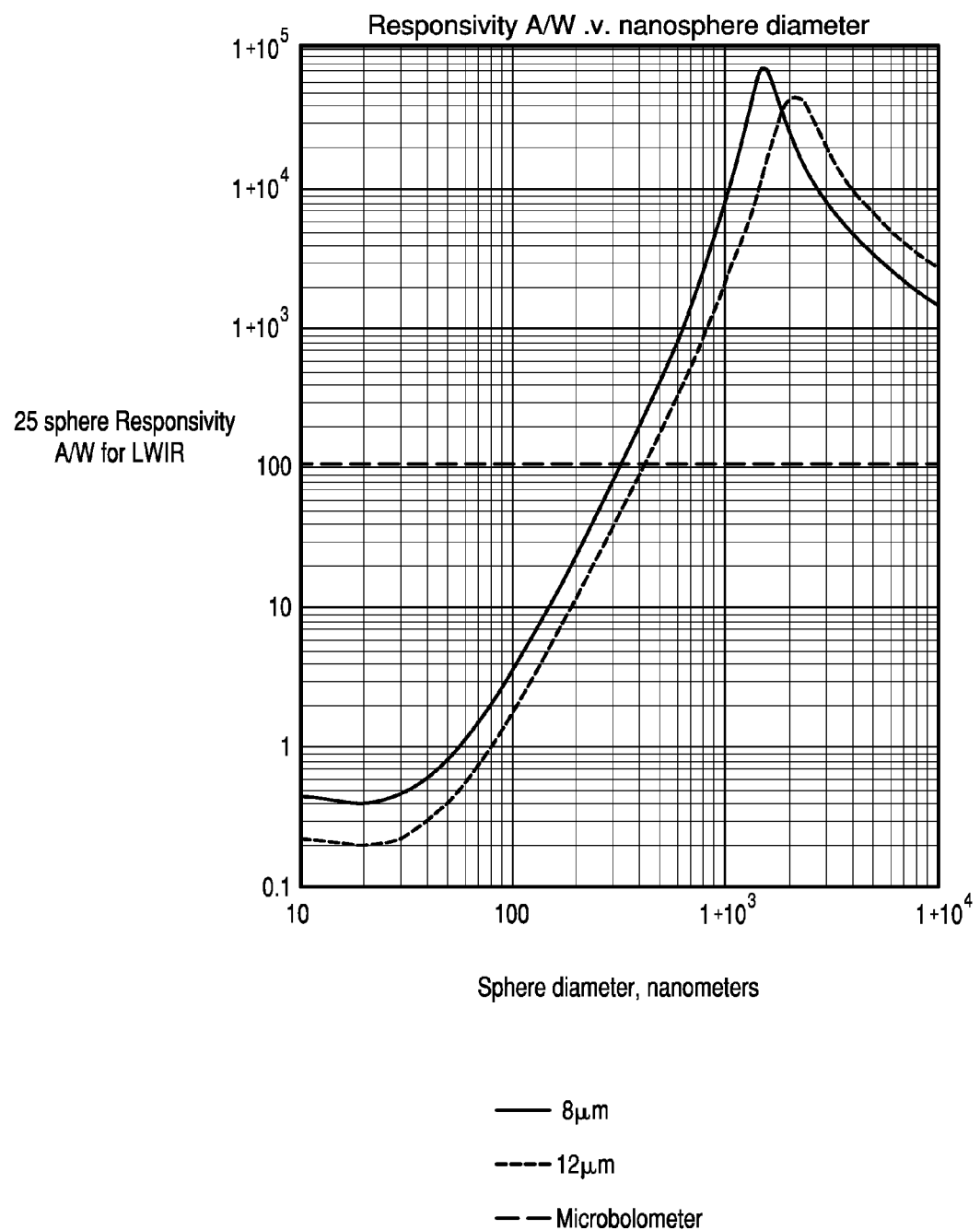
FIG. 19 is a graph illustrating the responsivity as a function of nanosphere diameter for gold nanospheres embedded in air for 8 and 12 micron EMR wavelengths, and compared to a microbolometer responsivity.

The sensitivities of gold nanorod based detection and microbolometers may now be compared for the same incident power in the 8-14 micron LWIR band, as shown in FIGS. 18 and 19. FIGS. 18 and 19 illustrate the responsivity curves in FIGS. 16 and 17, but also include the responsivity of a microbolometer system, the Raytheon Microbolometer [Radford, W. et al, 1999; 'Sensitivity improvements in uncooled microbolometer FPAs', Proc. SPIE, Vol. 3698, pp 119-130].

Based on the comparison shown, a nanosphere array in place of nanorods may provide advantages, at the expense of polarization discrimination. This is so even when some embedding matrix material is placed around an array of micron sized gold spheres and thus the responsivity falls by an order of magnitude or more. The nanosphere array may exceed the micro-bolometer performance by about a factor of 10 in practice.

Electrical and Thermal Time Constants

In this section, the thermal time constant of a microbolometer system is compared with the electrical time constant of a system using nanoparticles with direct electrical detection. Traditionally, microbolometers function through the absorption of LWIR as heat, and have thermal response time constants of around a few milliseconds. The heat detection mechanism of microbolometers provides a disadvantage for moving imagery, leading to often observed blurring of the images being viewed. For the systems using nanoparticles, by comparison, where the detection mode is based on direct electrical detection, the time constants may be much smaller, in the sub microsecond region.

The intrinsic thermal time-constant of a pixel is given by:

$$\tau = \frac{\rho c_p V}{h A_s}$$

where $\rho$ is the density of the pixel material, $c_p$ its specific heat, V its volume, h its heat-transfer coefficient, and $A_s$ its surface area. The above equation takes no account of any additional thermal loads imposed by substrate support or wire connections, all of which need to be made negligible by comparison.

The intrinsic electrical time constant of a pixel is RC, the product of the pixel's resistance R and its capacitance C, calculated from its dimensions, resistivity and dielectric constant as is known. Again, this equation takes no account of any additional resistive or capacitive loads imposed by substrate support or wire connections, all of which need to be made negligible by comparison.

As examples, note that the thermal time constants for pure silicon and pure gold pixels of 10 microns square dimensions and 1 micron thick calculate to be 10.95 milliseconds and 7.83 milliseconds, respectively. A composite structure employing silicon and gold lies somewhere between these two values. Such a time constant is too slow for high resolution, blur free imaging of moving scenes.

By comparison, the electrical time constant of a silicon pixel, for 5000 $\Omega$-cm Si, typically used for basic silicon structure manufacture, is only 0.052 milliseconds, potentially ideal for blur free imaging with moving scenes. In general, the resistivity of silicon depends on the doping level. In our calculation here a resistivity of $10^{12}$ cm$^{-3}$ n-type is used. Increased doping and the inclusion of gold nanorods would both reduce the resistivity, and thus reduce further electrical time constant.

Structure for Detector Performance Calculations

The detector performance will of course depend upon the specific geometry and materials. In this section the detector performance is calculated for geometries of FIGS. 15a and 15b for a 10 microns square pixel made of silicon embedded with 20 nm diameter gold nanorods, and where direct electrical detection of the induced plasmon cloud is used for signal creation. The further advantage of these two geometries is their polarization sensing capability, which is unavailable to standard microbolometer detectors. The temperature of operation is presumed to be room temperature.

Structure 1

Figure 20:
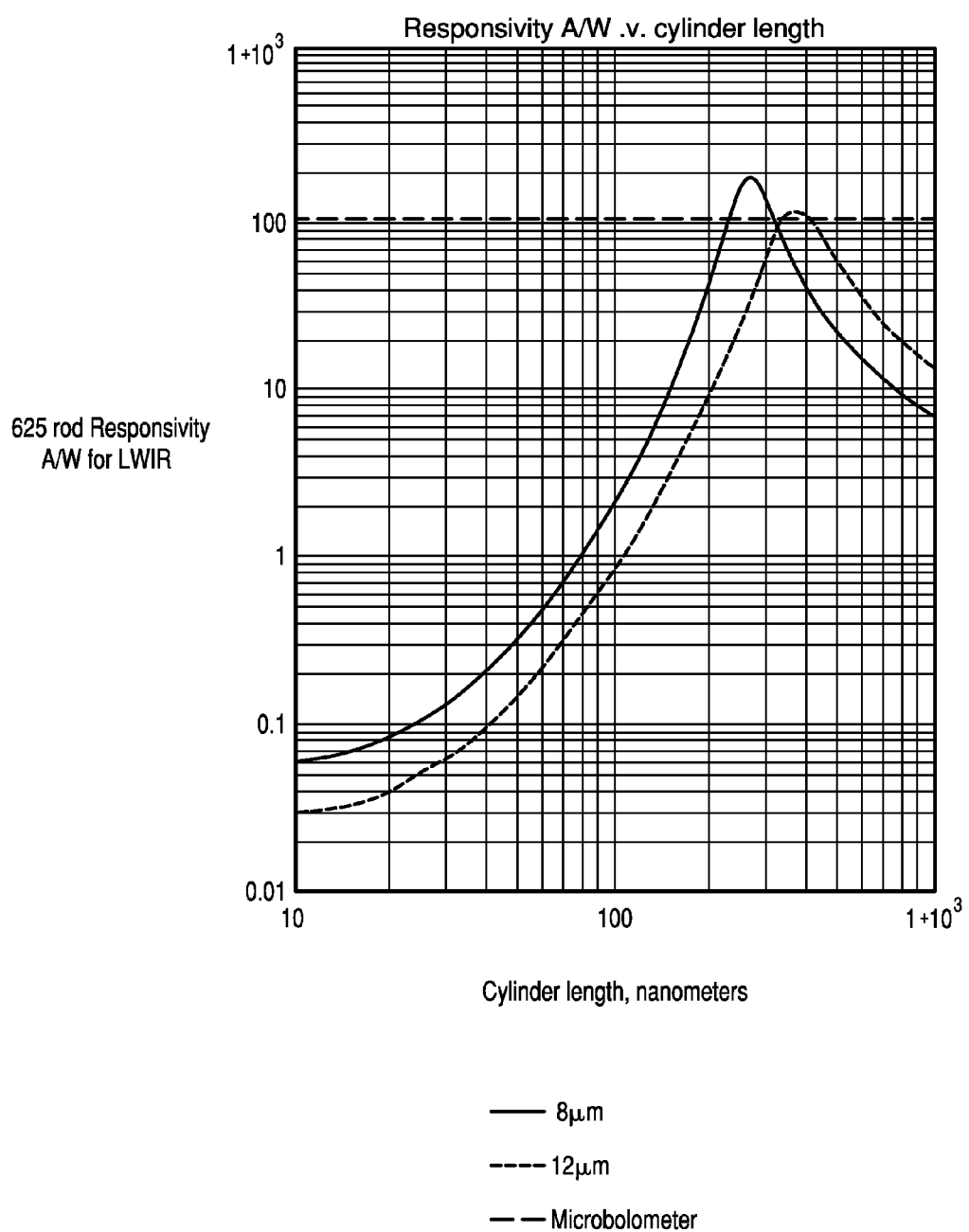
FIG. 20 is a graph illustrating the responsivity as a function of nanorod length for 20 nm diameter gold nanorods in a checker-board pattern embedded in silicon, for 8 and 12 micron EMR wavelengths, and compared to a microbolometer responsivity.

For the geometry of FIG. 15a, 400 nm long and 20 nm diameter gold nanorods are used in the checkerboard lattice, with 25 rows and columns. The nanorods are embedded in silicon of 1 micron thickness. The electrical time constant is ~50 micro-seconds (~20 KHz intrinsic response). There are 625 nanorods in the square lattice. This array can detect orthogonal polarizations, and thus any polarization state. The polarizability of a single gold nanorod in silicon suggests a 300 to 400 nanometer rod length is optimal, where the length is chosen to be 400 nm. The 625 rod pixel's responsivity curves for 8 and 12 micron wavelengths are shown in FIG. 20, which are very similar to that of a microbolometer. The advantage for this structure is the polarization detection, where any arbitrary polarization state can be discriminated from the two orthogonal states detected in the checker-board arrangement.

Structure 2

Figure 21:
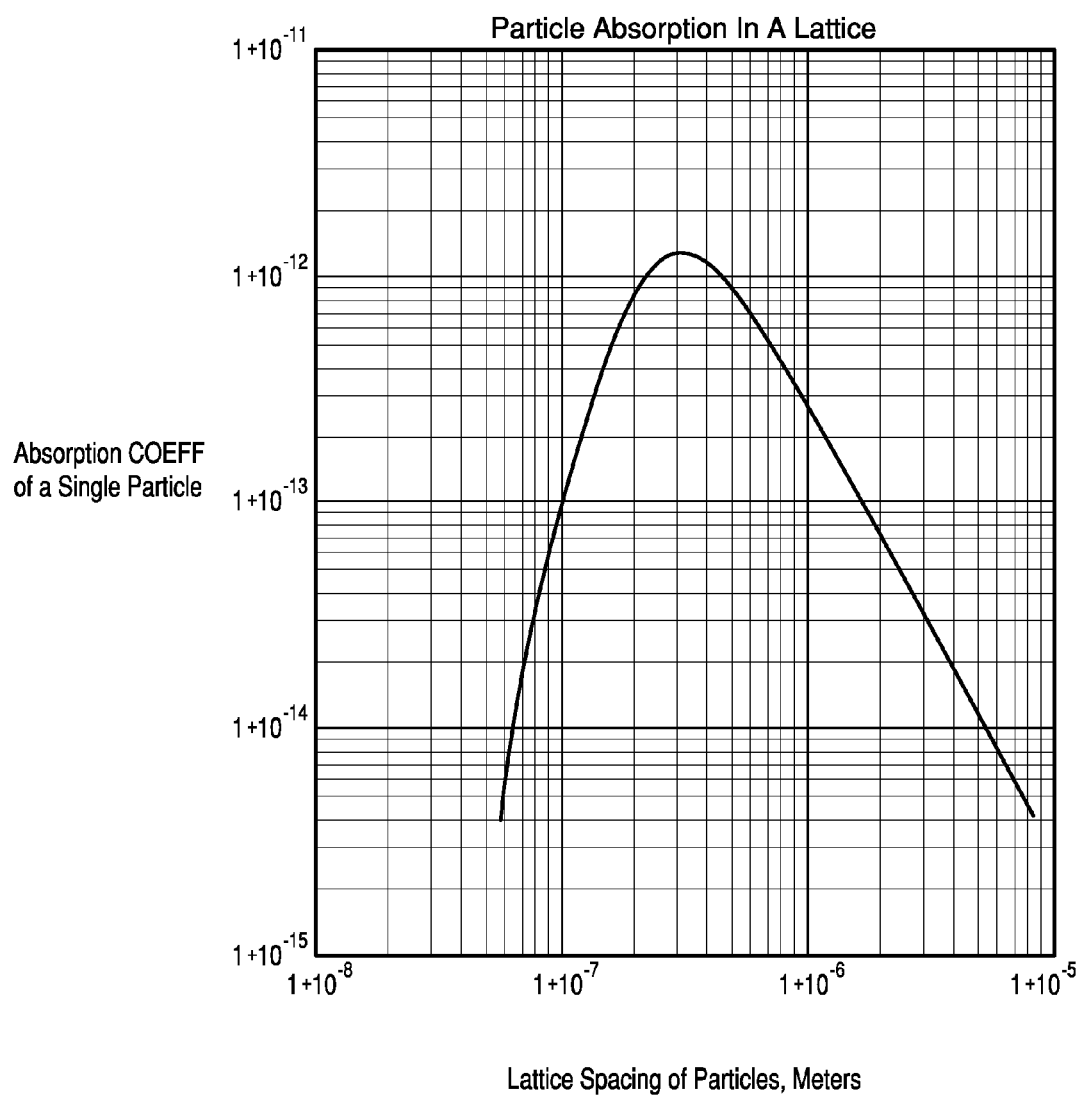
FIG. 21 is a graph illustrating the absorption for a single nanorod versus lattice spacing of a nanorod parallel array as a function of nanorod spacing, for 20 nm diameter gold nanrods embedded in gold.

For the geometry of FIG. 15b, 400 nm long and 20 nm diameter gold nanorods are used in the parallel array lattice. The nanorods are spaced for maximum polarizability response, which is a separation of about 0.3 microns, which provides for 33 nanorods in each row for a 10 microns square pixel. The nanorods are embedded in silicon of 1 micron thickness. The electrical time constant for this structure is ~50 micro-seconds (~20 KHz intrinsic response). There are 25 rows of the nanorods in the pixel to provide adequate row-to-row separation for row independence. Thus there are ~830 gold nanorods contributing to separation enhanced polarizability, thus signal strength. This array can detect a chosen single polarization. The polarizability of a single gold nanorod in silicon is the same as for structure 1 above. But the nanorod polarizability is enhanced for the closepacking in the FIG. 15b arrangement of the parallel sets of nanorods with the polarizability behavior as shown in FIG. 15d. In FIG. 21, it can be seen that the optimal spacing of the nanorods is ~3.10$^{-7}$ m or 0.3 microns.

Figure 22:
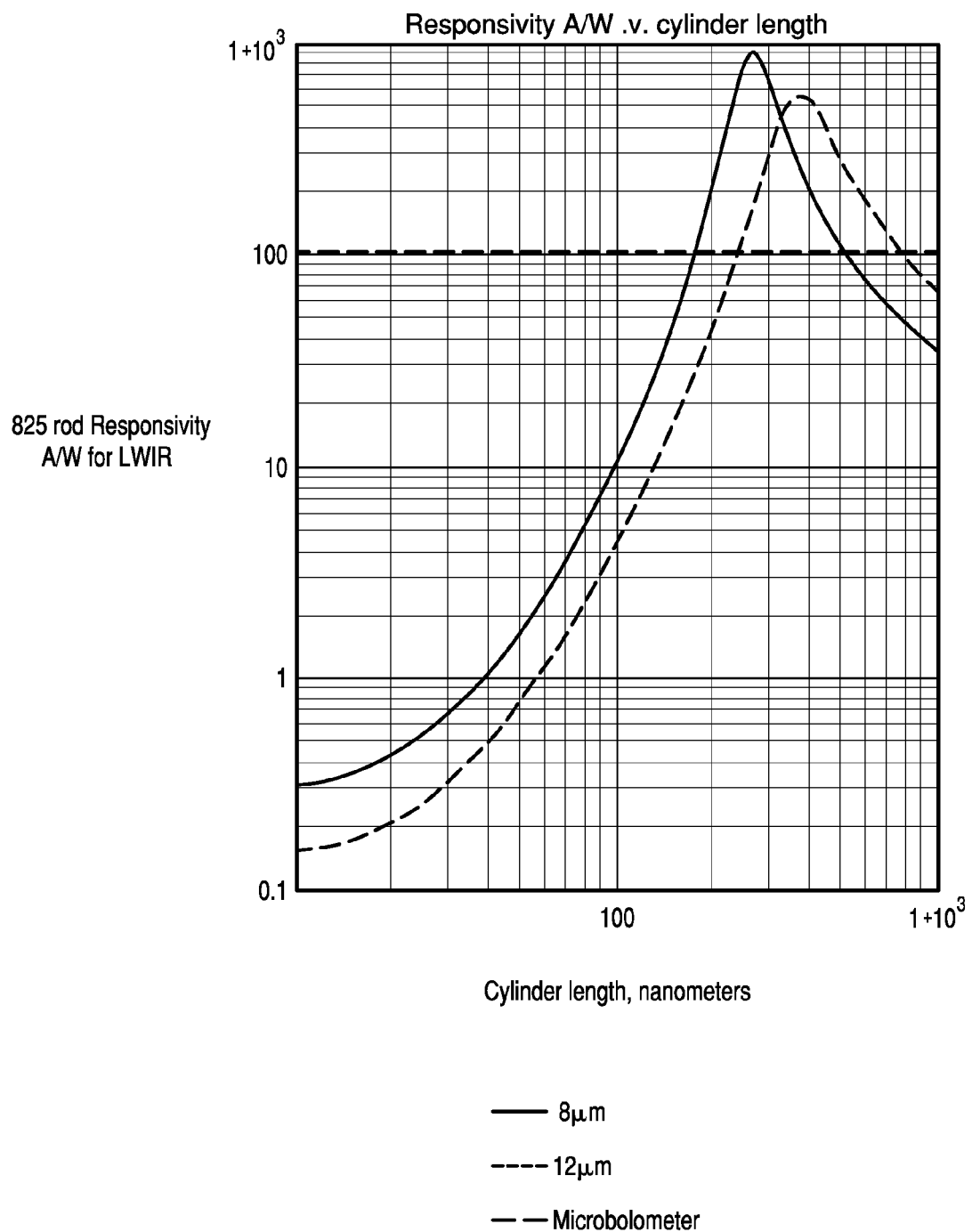
FIG. 22 is a graph illustrating the responsivity as a function of nanorod length for 20 nm diameter gold nanorods in a parallel array pattern embedded in silicon, for 8 and 12 micron EMR wavelengths, and compared to a microbolometer responsivity.

The ~825 coupled nanorod pixel responsivity curve for this single polarization 'enhanced-polarizability' detector is illustrated in FIG. 22, which shows better responsivity performance than the 100 A/W microbolometer, even though only a single-polarization component is being detected. Thus, this structure provides a better responsivity for the single polarization while at the same time providing extra polarization selectivity.

The comparisons shown here are for illustrative purposes only and do not show the further superiority of smaller diameter gold nanorods for this LWIR sensor embodiment.

Thermal Noise, Signal Levels, S/N Ratios, NETD & MRTD Performance

For this section the performance parameters for a 830 nanorod LWIR detector with 10-micron pixels were calculated.

Thermal Noise

The dominating noise for the electrically detected nanorod detector is likely to be the thermal/Johnson noise current [Saleh, B. E. A., & Teich, M. C., 1991; 'Fundamentals of Photonics', p 682, Wiley]. The noise-variance is provided by $\sigma^2 = 4 k_B T B/R$, where $k_B$ is Boltzmann's constant, T is the temperature, 300° K, B is the circuit bandwidth (about $10^6$ to take advantage of the RC time constant) and R the silicon pixel resistance $\sim 10^9$ Ohms. For signal to noise calculations, root mean square (rms) is used, which for a room temperature Si/Au-pixel of 10 microns square, yields σ equal to be around 1.82 picoAmps.

In practice, it may be desired to trade noise current for a lower pixel resistance. Additional capacitive load from the pixel's circuitry will also detract from this intrinsic, ideal calculation of σ. In practice, σ may increase $\sim \times 10$, so we assume a degradation of $\times 10$ in further calculations. $\sigma = 18.2$ pico-Amps.

Signal Levels

For an image at 300K temperature filling a non BLIP (Background Limited Infrared Photodector) LWIR optical system operating at f/1 (50% transmitting), the image irradiance is $\sim 12.5$ Wm-2 [RCA, 1968; 'Electro-Optics Handbook', RCA, Harrison, N.J. 07029, USA. Technical series volume EOH-10].

Signal to Noise Ratio

Using the signal and noise values just estimated, the signal to noise ratio, assuming a 10 micron square pixel of responsivity 100 A/W, calculates to be $\sim 6.89 \ast 10^4$. This yields excellent NETD and MRTD performance. If for engineering reasons σ is 10 times worse than calculated above, the signal totnoise ratio would fall to $\sim 6.89 \ast 10^3$, which is still respectable.

A wide dynamic range (gray scale) in temperature space might be expected from such a 8-12 microns LWIR system, which should provide additional advantages over microbolometers. A dynamic range exceeding 12 bits, (i.e., >4096) can be calculated based on the ratio of the detector's saturation current to dark current.

The main reason for this promising performance is that the dominant noise component associated with the plasmon based electronic pixel, which arises from thermally induced fluctuations in the motion of the electrons transferred from the sensing element to the readout electronics, is very much smaller than the dominant noise component associated with a microbolometer pixel, which arises from thermally induced fluctuations in the motion of the phonons transferred from the sensing element to the readout electronics. Further, by reducing the diameter of the gold nanorods from 20 nm to 10 nm, the sensitivity performance can be reduced by nearly an order of magnitude.

NETD—Noise Equivalent Temperature Difference

Using the standard NETD equation [Kruse, P. W., 2001; 'Uncooled Thermal Imaging Arrays, Systems, and Applications', SPIE Tutorial Texts in Optical Engineering, Vol. TT51] for the worst case S/N ratio of $6.89 \ast 10^3$ estimated above, NETD in the 8-14 microns band calculates to be 6.9 milliKelvins, a substantial improvement over published figures for circa-1999 microbolometers. Reduction of the diameter of the gold nanorods allows for the design NETD in the sub 1 milliKelvin region, which is better than more current microbolometer performance.

MRTD—Minimum Resolvable Temperature Difference

MRTD is a function of spatial-frequency in the imaging system. To determine the MRTD, a standard equation may be used as in known [Lloyd, J. M., 1975; 'Thermal Imaging Systems', Plenum Press].

Figure 23:
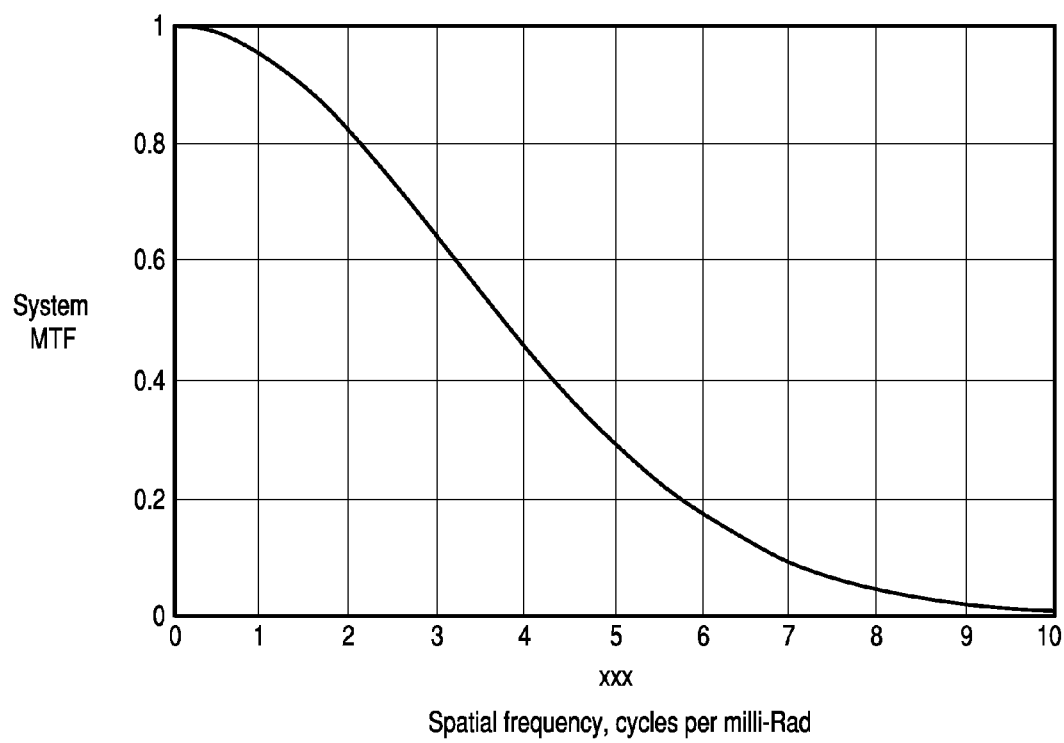
FIG. 23 is a graph illustrating a system MTF as a function of spatial frequency.

For the purposes of calculation, a f/1 system is assumed with a 10 micron pixel whose pixel field of view is $\sim 1$ milliradian. It is further assumed an observer's eye is using photopic (cone) vision, looking at a bright display, not low light level conditions, so its integration time is $\sim 15$ milliseconds. It is further assumed a display screen frame-rate of 120 Hz and a detector bandwidth of 100 KHz. A composite MTF of an entire model system was created using a Gaussian squared function whose shape is as shown in FIG. 23.

Figure 24:
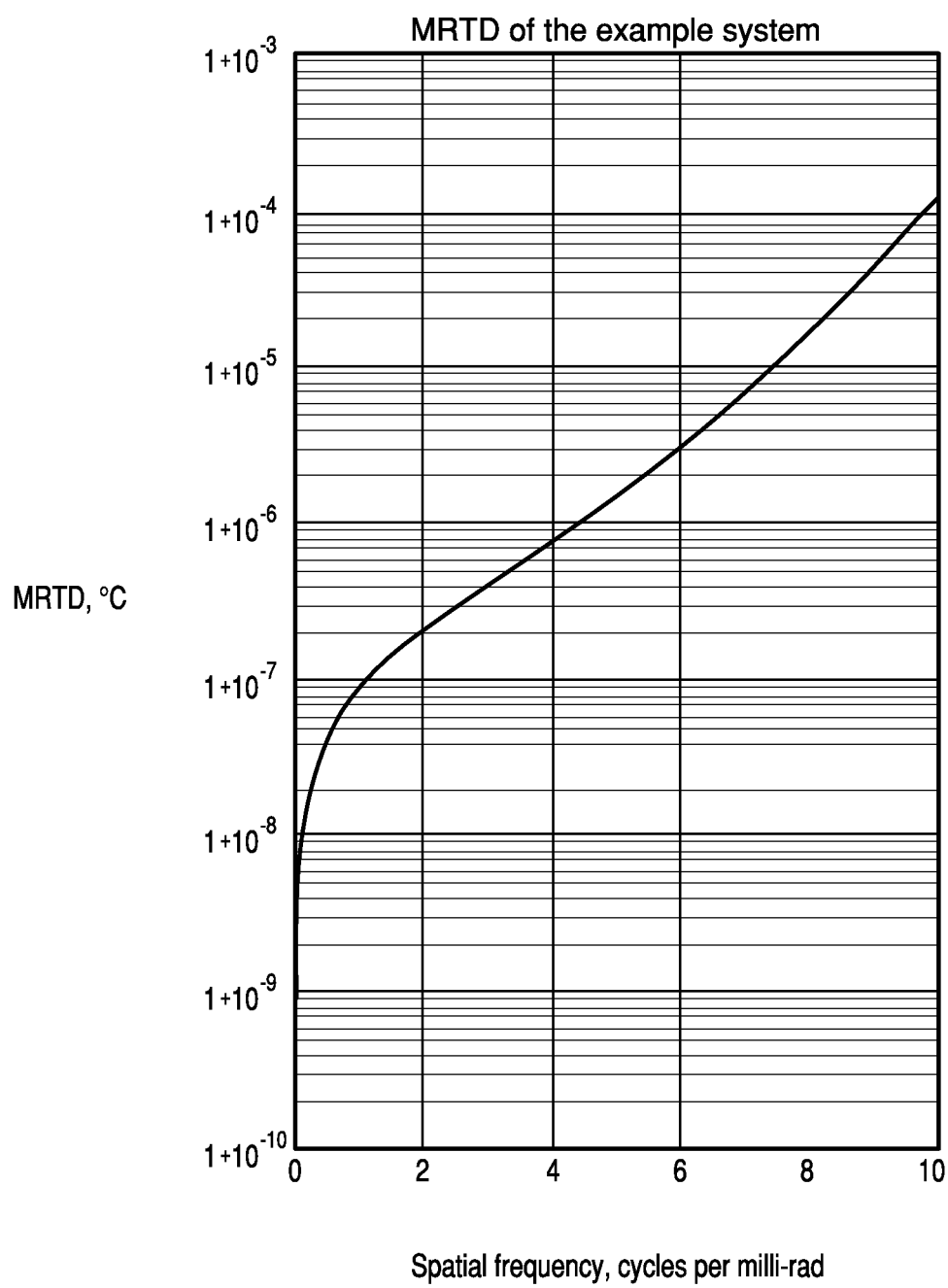
FIG. 24 is a graph illustrating a MRTF as a function of spatial frequency using gold nanorods of 10 nm diameter.
Figure 25:
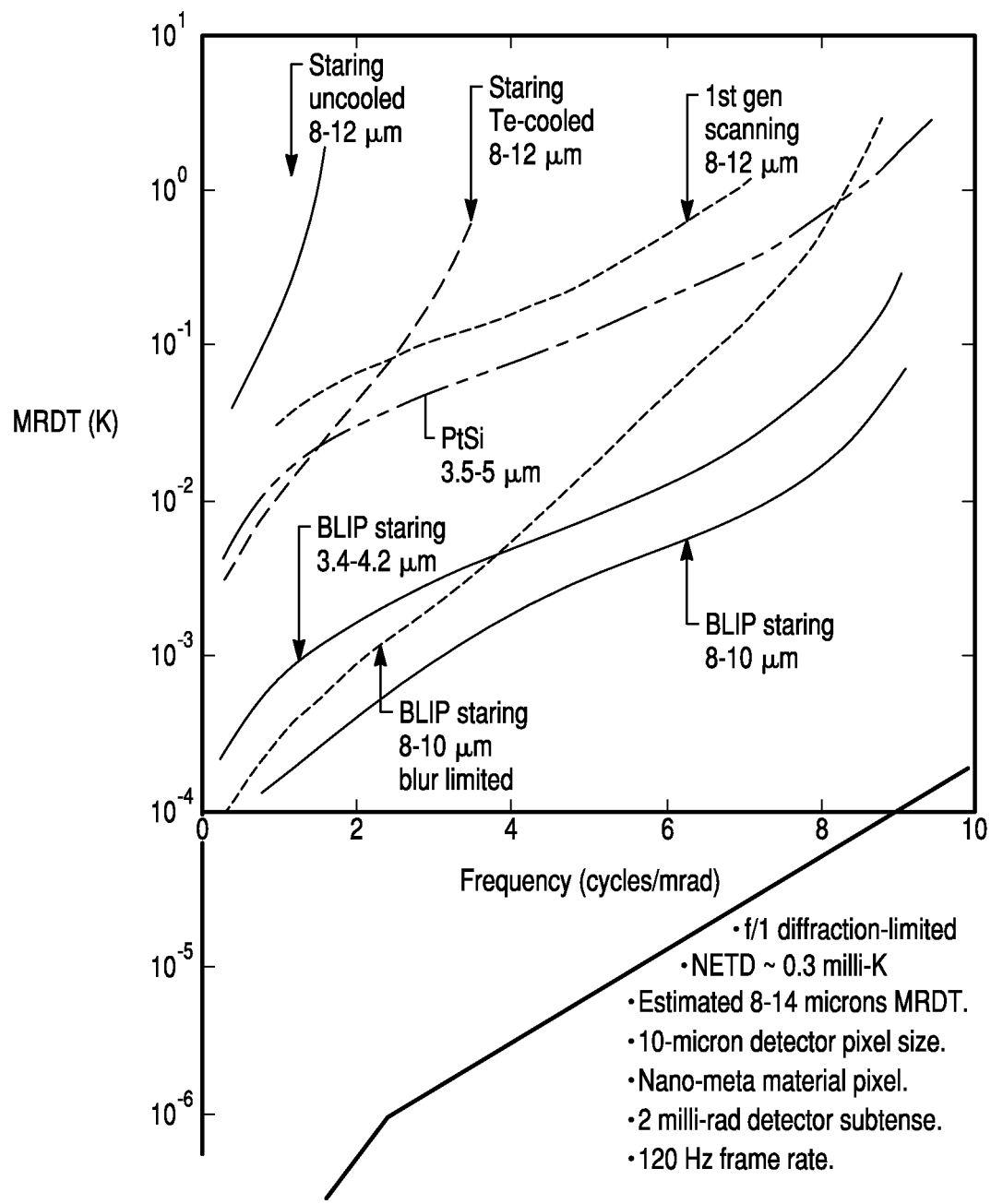
FIG. 25 is a graph illustrating the MRTD as a function of spatial frequency for various LWIR detectors.

On this basis, the MRTD curve appears as shown in FIG. 24; now for a detector whose gold nanorods are only 10 nm diameter. For this calculation >80% of spatial-frequency performance would be sub 0.1 milliKelvin MRTD; and MRTD for $\sim 100\%$ of the entire range of spatial frequencies is less than 1 milliKelvins. Comparison of this MRTD with other LWIR detectors is shown in FIG. 25 which shows the potential superiority of the gold nanorod detectors as described herein.

Figure 26:
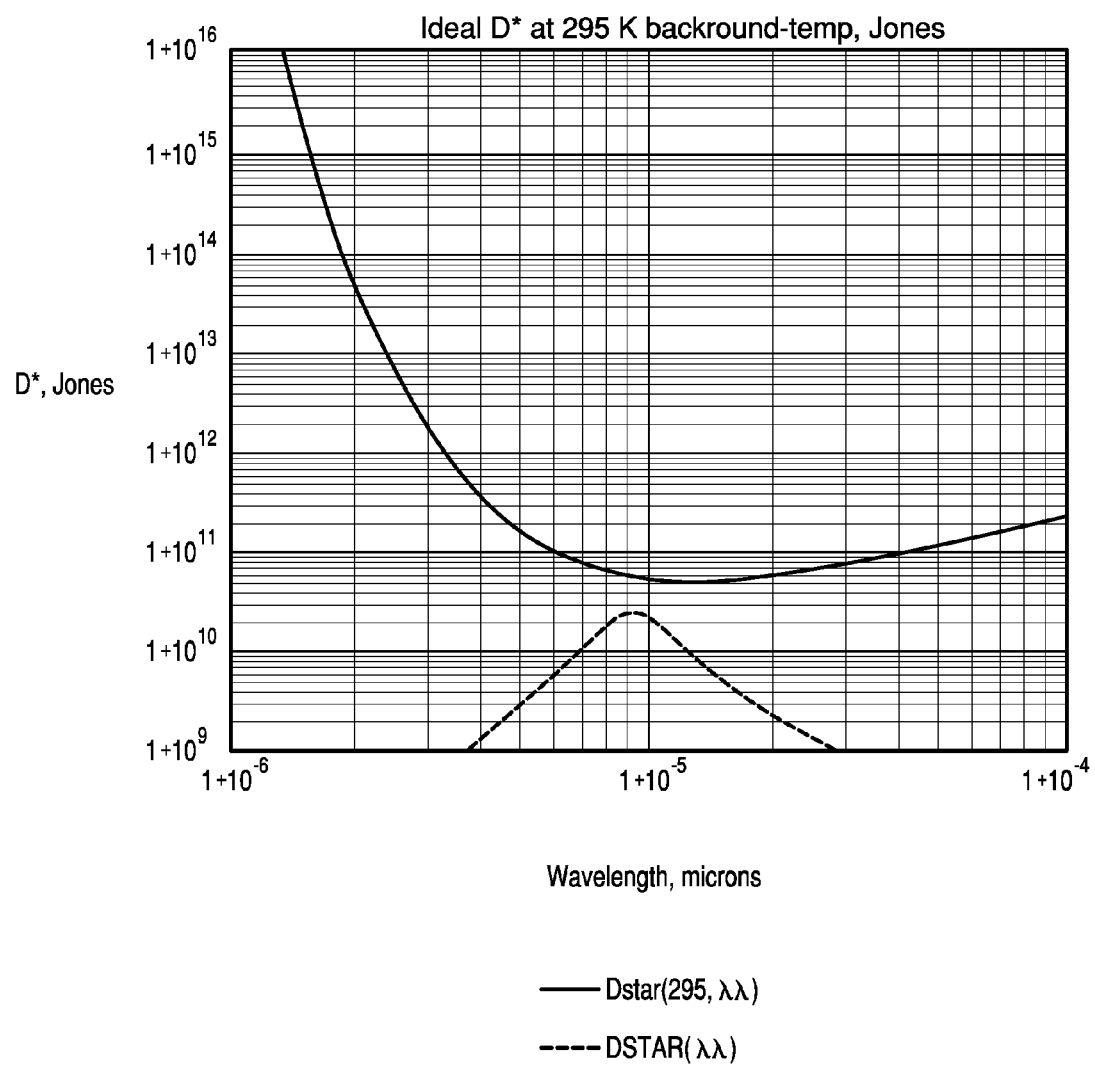
FIG. 26 is a graph illustrating the figure of merit, D* as a function of wavelength for 10 nm diameter gold nanorods embedded in silicon.

The detector spectral response and the figure of merit, D* [Lloyd, J. M., 1975; 'Thermal Imaging Systems', Plenum Press] may also be calculated. In FIG. 26 an unusual and unexpected spectral response shape is observed, because of the nanorod resonance detection process instead of a p-n junction process with its long wavelength cut off at the bandgap.

Detector Device Structures

In addition to the detector device structure shown in FIG. 6, alternative detector structures for the direct electrical determination of plasmon resonance EMR detection are possible. For example, alternative device architectures and structures are shown schematically in FIGS. 27 to FIG. 30.

Figure 27:
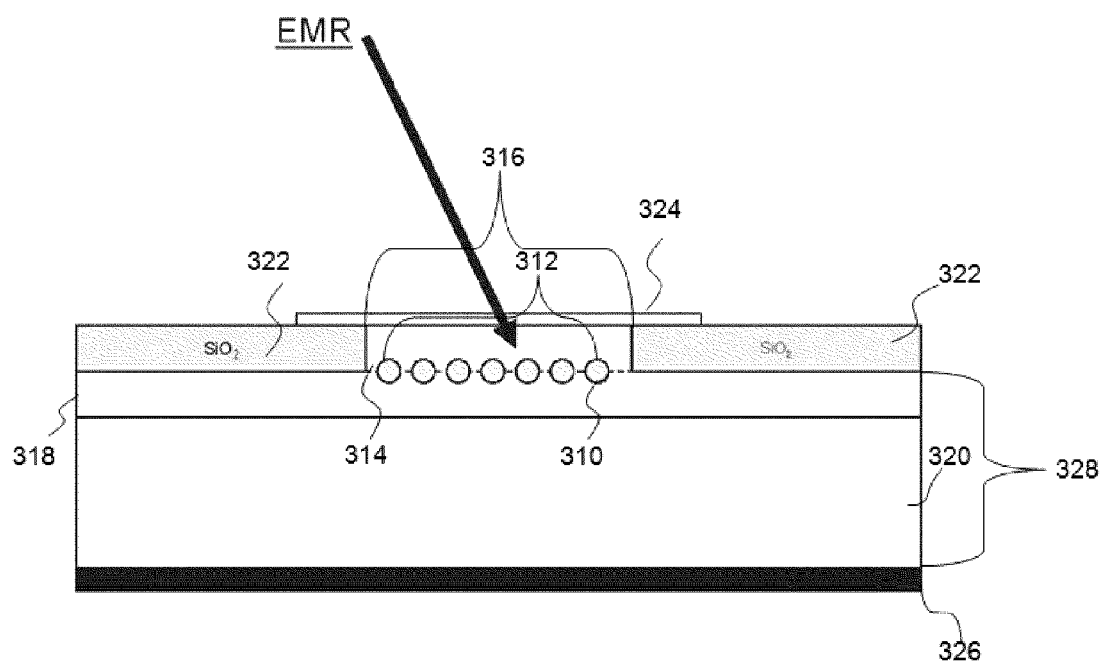
FIG. 27 is a schematic of an electromagnetic radiation detector according to another embodiment of the invention, where nanoparticles are embedded in a heterojunction.

FIG. 27 illustrates a detector where, to enhance the electric field across the nanoparticles, the nanoparticles are embedded in a heterojunction. The heterojunction may be a p-n junction, a n-N junction, or a metal-semiconductor junction, for example. The embodiment of FIG. 27 has the same structure as that of the embodiment of FIG. 6, except that the nanoparticles 310 are embedded in the heterojunction between the intermediate layer 318 and the material 314, and the same reference numerals are used to denote the same elements.

Figure 28:
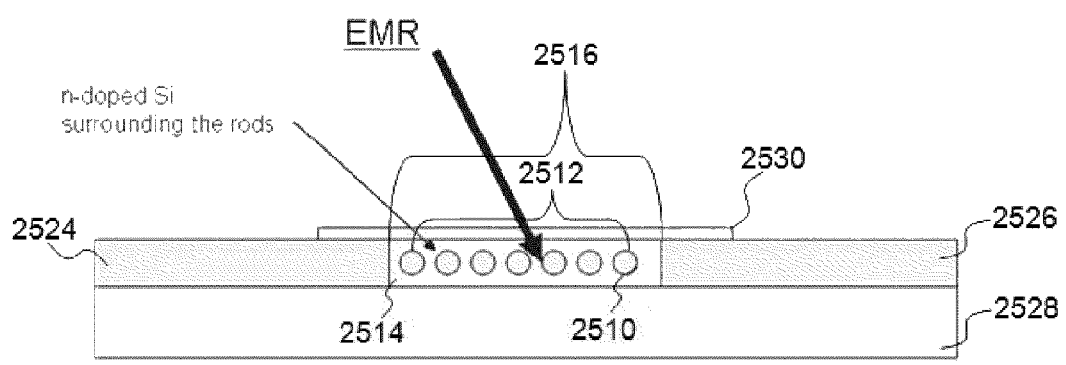
FIG. 28 is a schematic of an electromagnetic radiation detector according to another embodiment of the invention, with an orthogonal implementation for current generation.

FIG. 28 illustrates a detector according to an embodiment of the invention with an orthogonal implementation for current generation, using nanoparticles operated serially, the current generation flows in a lateral direction. The detector in FIG. 28 includes a detector material 2516 on a substrate 2528, a first electrode 2524, and a second electrode 2526, where the first electrode and second electrode function as the voltage biasing element. The detector material 2516 comprises a substantially regular array 2512 of nanoparticles 2510 embedded in a matrix material 2514.

In this embodiment the nanoparticles 2510 may be gold nanorods, which are embedded in the matrix material 2514 which may be n-doped silicon, for example. The substrate 2528 in this embodiment may be a dielectric substrate, for example. The detector may also include a dielectric anti-reflection coating 2530 over the detector material 2516 to enhance absorption in the detector material 2516.

Figure 29:
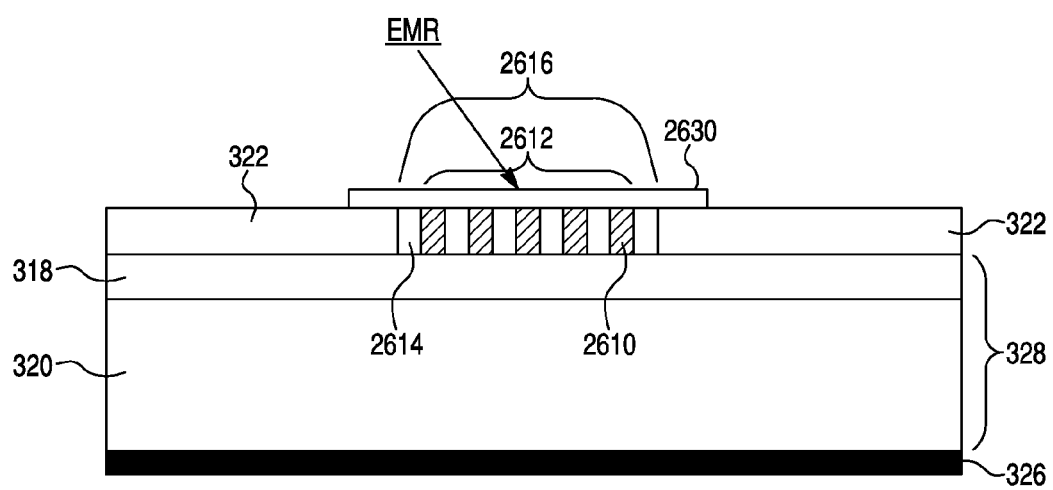
FIG. 29 is a schematic of an electromagnetic radiation detector according to another embodiment of the invention, with semiconductor nanoparticles embedded in a metal matrix.

FIG. 29 illustrates a detector with an inverse nanoparticle operation, where the nanoparticles are the semiconducting material instead of the metal, where the nanoparticles are surrounded by metal, and are disposed in nanoholes in the metal. Again, the physics in play here is that of maximizing the direct absorption of the incident EMR into the nanoparticle itself, not the maximized scattering of, or extra-ordinary transmission of, sub-wavelength apertures in metal surfaces, as used in previous research [Ebbesen et al, 1998; Ghaemi et al, 1998].

To calculate the pertinent performance parameters for the FIG. 29 design, the real and imaginary refractive index and complex permittivity (dielectric function) values of the metal and semiconductor may be exchanged thereby obtaining the plasmon-absorption directly into the metal surrounded semiconductor nanoparticles. This is the inverse geometry of what has been described with respect to the detectors of FIGS. 6, 27 and 29.

The detector in FIG. 29 includes a detector material 2616 on a substrate 328, a bottom electrode 326, where the bottom electrode 326 and top electrode 2630 functions as the voltage biasing element. The detector material 2616 comprises a substantially regular array 2612 of nanoparticles 2610 embedded in a matrix material 2614. In this embodiment the nanoparticles 2610 may be silicon nanorods, which are embedded in the matrix material 2614 which may gold.

As shown in FIG. 29, laterally surrounding the detector material 2616 is a surface passivation layer 322, which may be an oxide layer about ≥0.1 micron thick. The substrate 328 may have an intermediate layer 318, which may comprise n-doped silicon, and which may have a thickness, for example, of about two microns. The substrate 328 may also have a lower layer 320, which may be a n⁻ or n⁺ doped <100> or <111> silicon layer for example.

Figure 30:
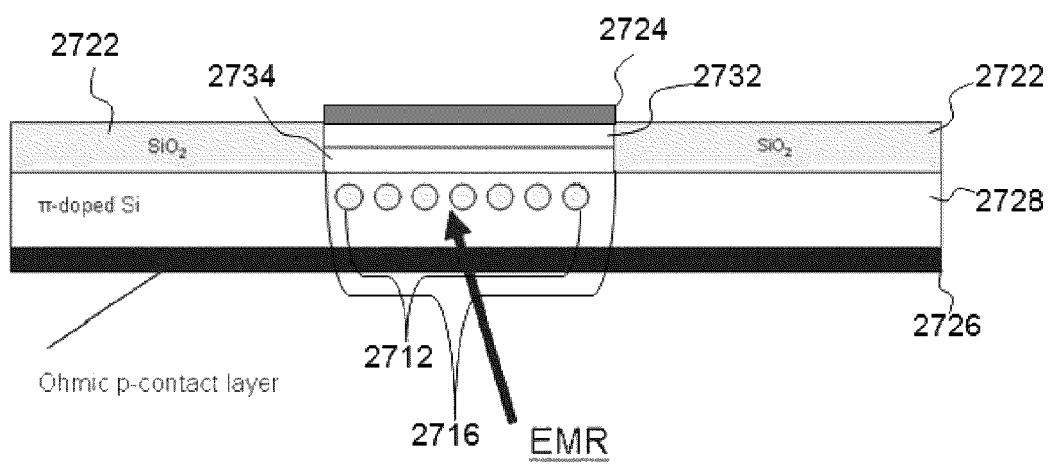
FIG. 30 is a schematic of an electromagnetic radiation detector according to another embodiment of the invention, with an avalanche photodiode structure.

FIG. 30 illustrates a detector where nanoparticle absorber arrays are used to replace the standard absorption region of an avalanche photodiode to improve its performance. The standard π-region is replaced by metal nanoparticles for carrier creation prior to employing the p-n avalanche effect on the photoelectrons. This design is especially advantageous for single-photon counting enhancement using very weak, 'photon-starved' light fields.

The detector in FIG. 30 includes a detector material 2716 in a substrate 2728, a top electrode 2724, and a bottom electrode 2726, where the top electrode and bottom electrode function as the voltage biasing element. The detector material 2710 comprises a substantially regular array 2712 of nanoparticles 2710 embedded in a matrix material, i.e., the π-region of the substrate 2728, which may be doped silicon. In this embodiment the nano-particles 2710 may be gold nano-rods. The detector in FIG. 30 further includes in order from the top electrode 2724 to the substrate 2728 a n-region 2732 and a p-region 2734, which may be doped silicon as is known for avalanche photodiode structures. As shown in FIG. 30, laterally surrounding the n-region 2732 and p-region 2734 is a surface passivation layer 2722.

Short Wavelength Infra Red (SWIR) Detectors

The nanoparticle detector may also be arranged to preferentially detect EMR with wavelengths in the SWIR region. In this embodiment there is described the performance of a nanoparticle detector designed to operate in the SWIR region, usually accepted to be between 1 micron and 3 microns in wavelength. For example, gold nanorods may be used with a configuration such as that in the detectors and pixel arrangements of FIGS. 6, 15a-15b and 27-30.

Figure 31:
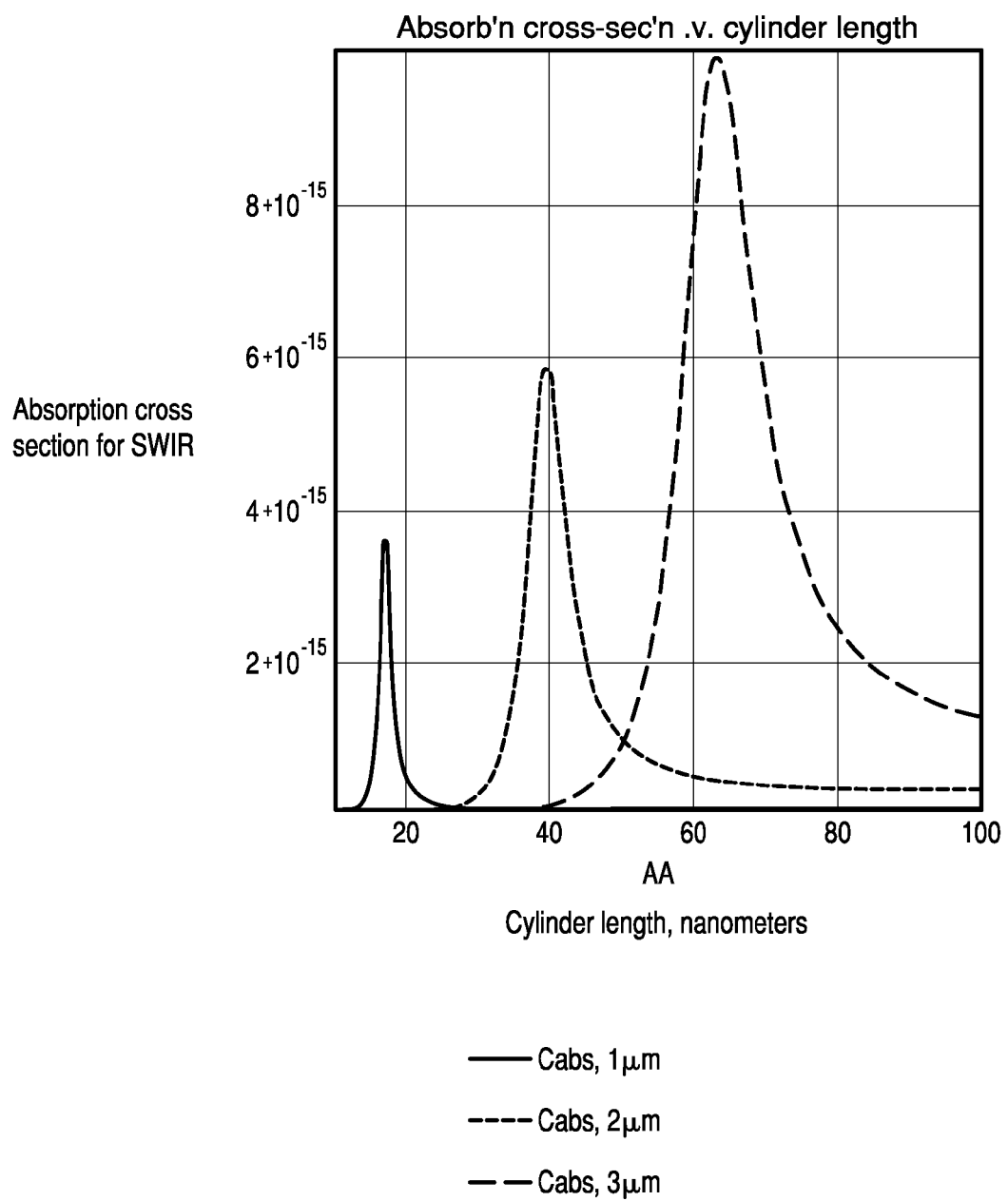
FIG. 31 is a graph showing the absorption cross section versus cylinder length for 10 nm diameter gold nanorods for 1, 2 and 3 micron EMR wavelengths.
Figure 32:
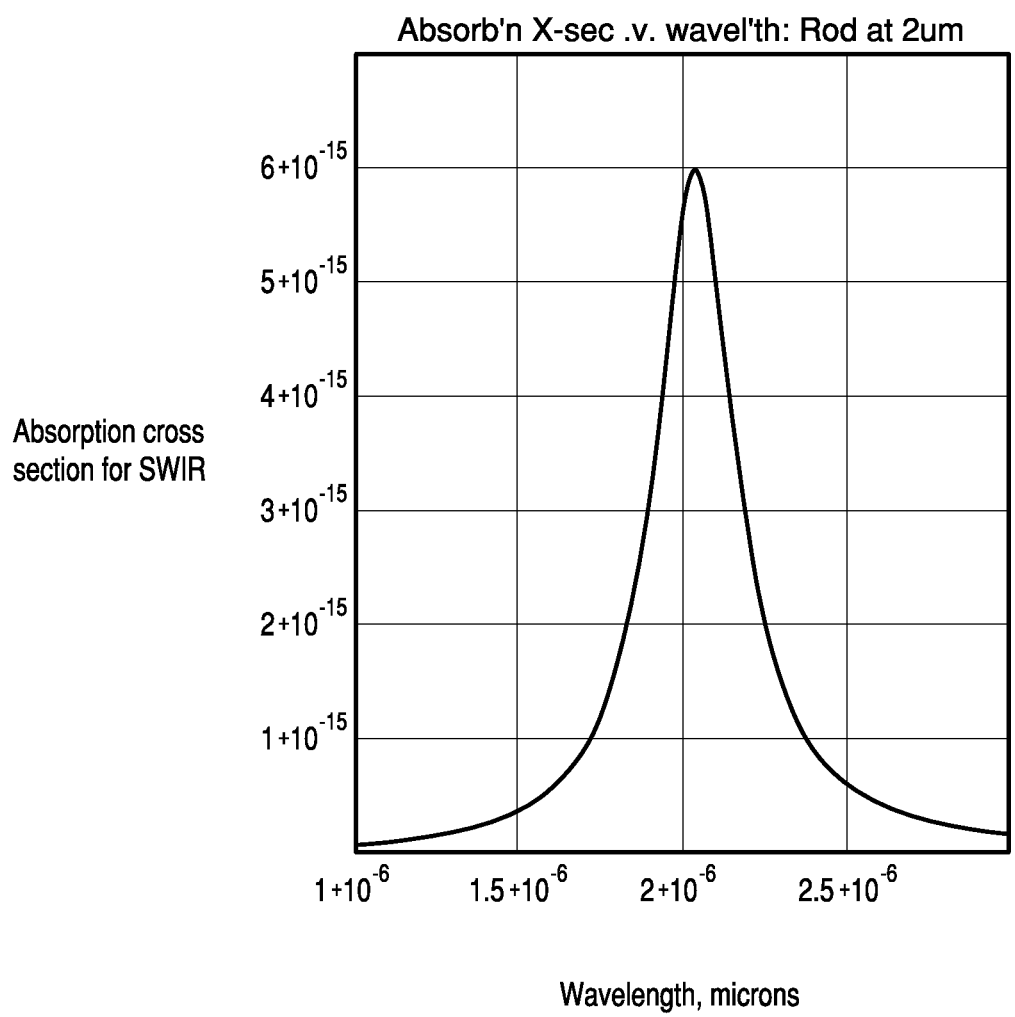
FIG. 32 is a graph showing the absorption cross section versus incident EMR wavelength for 10 nm, diameter, 400 nm length gold nanorods.

The nanorod length may be varied for peak detection wavelength, in a similar fashion to LWIR detection described above, as is shown in FIG. 31. FIG. 32 illustrates that a 40 nm long, 10 nm diameter nanorod arrangement has peak absorption at a 2 microns SWIR wavelength.

Figure 33:
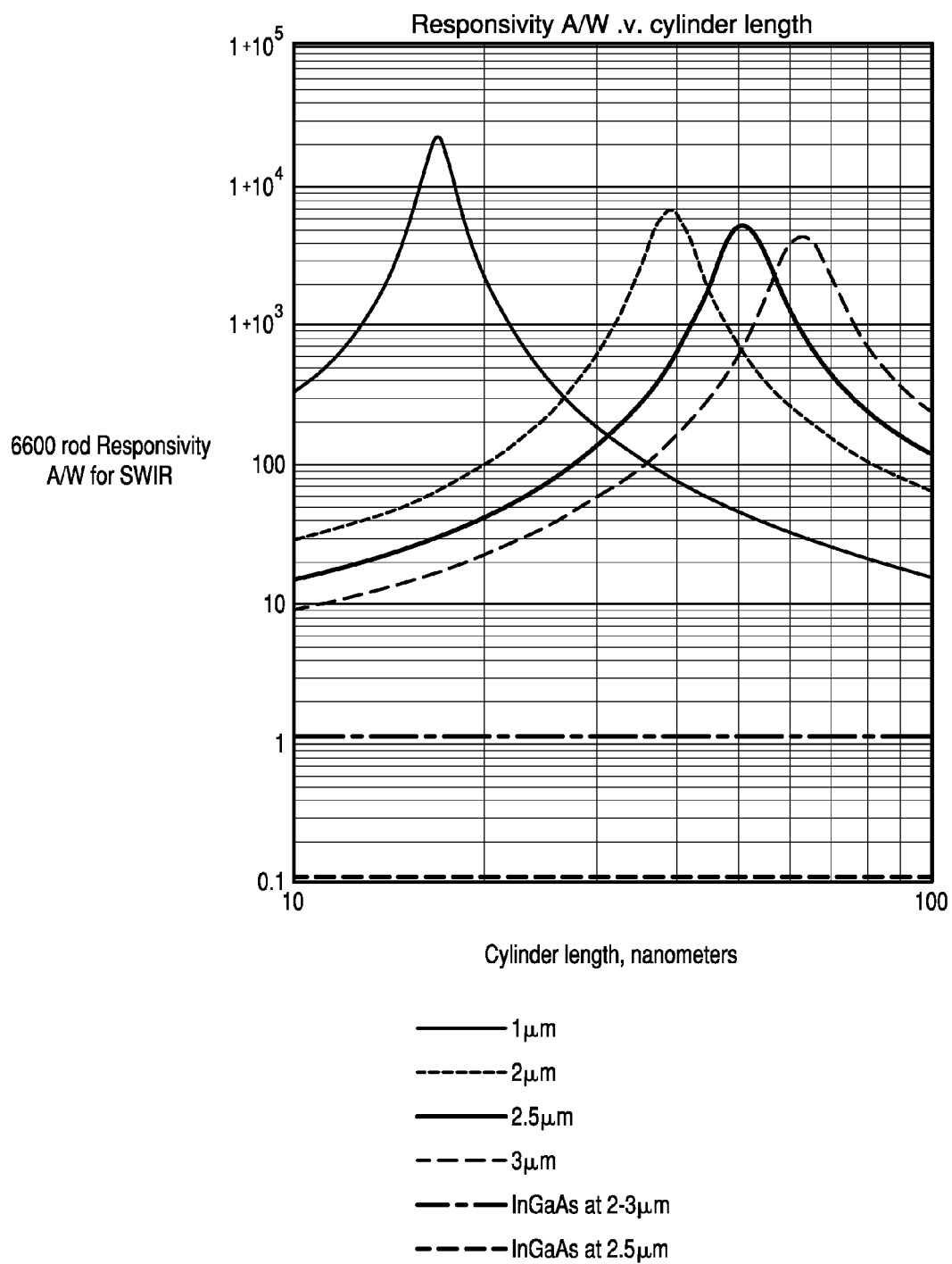
FIG. 33 is a graph showing SWIR-APD gained responsivity as a function of nanorod length for 6600 gold nanorods in silicon for EMR different wavelengths, and as compared to InGaAs diodes a 2 and 2.65 microns.

FIG. 33 illustrates the SWIR-APD (FIG. 30 structure) gained responsivity for 6600 nanorods in a 10 micron square pixel, with a system with gold nanorods in a silicon matrix. As can be seen in FIG. 33, the curves compare well to the responsivities from InGaAs photodiodes at ~2 microns and 2.65 microns, respectively.

Figure 34:
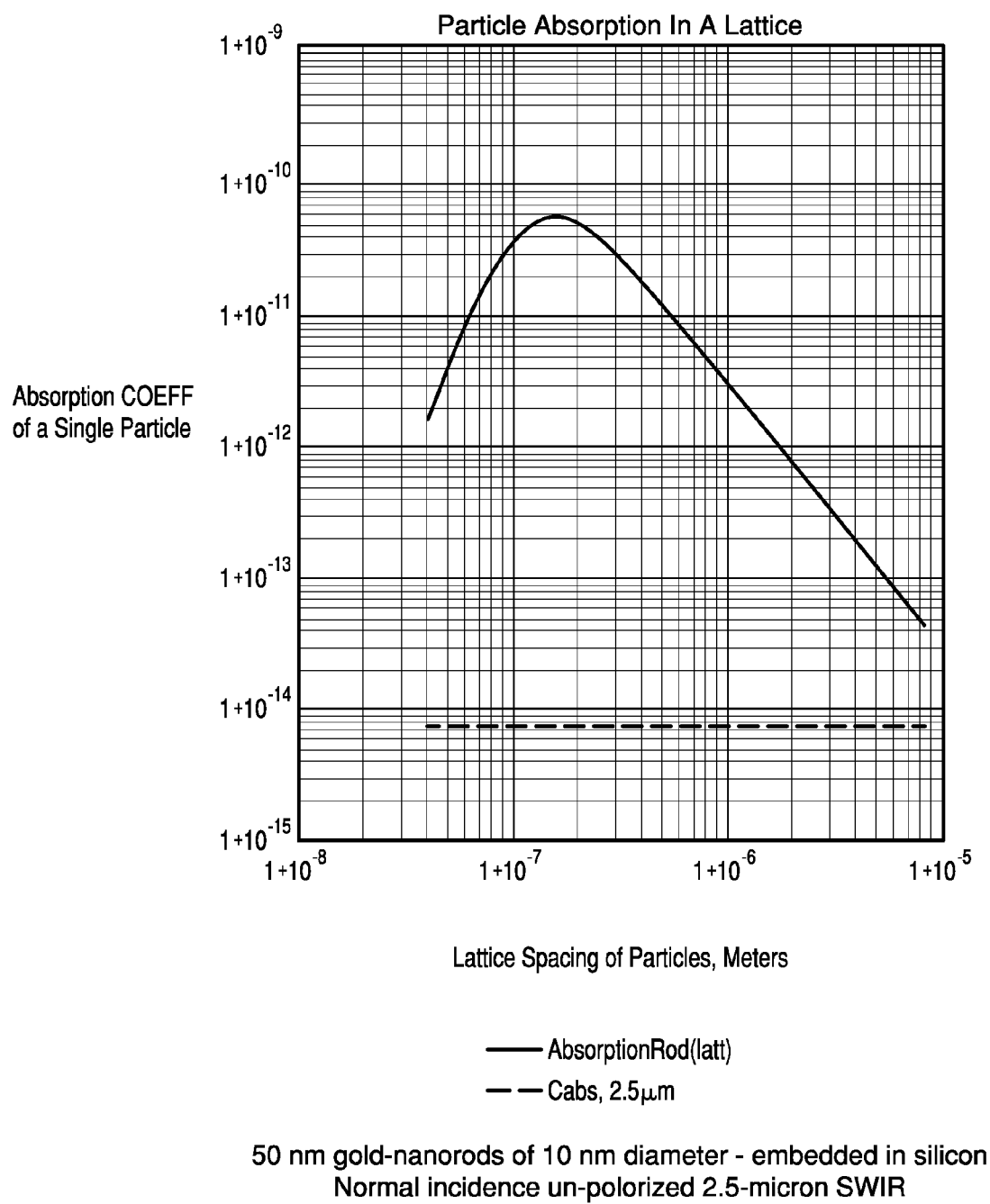
FIG. 34 is a graph showing the enhanced absorption versus lattice spacing for the nanorod system of FIG. 33 for a nanorod spacing of 150 nm.

FIG. 34 illustrates the enhanced absorption of the array of 6600 gold nanorods used for determining the FIG. 33 curve for a nanorod lattice spacing of ~150 nm and is nearly 4 orders of magnitude greater per particle than the absorption of a single nanoparticle not placed in a lattice array as shown in FIG. 34.

The detector performance of such an array of gold nanoparticles for SWIR detection was calculated as follows for f/1 optics (T=50%) using SWIR of 2.6 microns wavelength, with 10 micron square pixels. The APD responsivity for the FIG. 25 structure detector structure equals 1000 A/W. This yields the following performance predictions from simulations. Under conditions of Magnitude +2 starlight conditions (one tenth of quarter-moonlight) the signal to noise ratio in each pixel is S/N ~13.6 and its dynamic range ~5685, based on saturation/noise current ratio. If the detector bandwidth is set to $10^5$ Hz, then the noise-equivalent power is NEP ~$8.6 \times 10^{-14}$ Watts which yields a specific detectivity D*~$3 \times 10^{12}$ Jones, which nearly falls on the ideal photovoltaic D* curve for a temperature of 295K.

Figure 35:
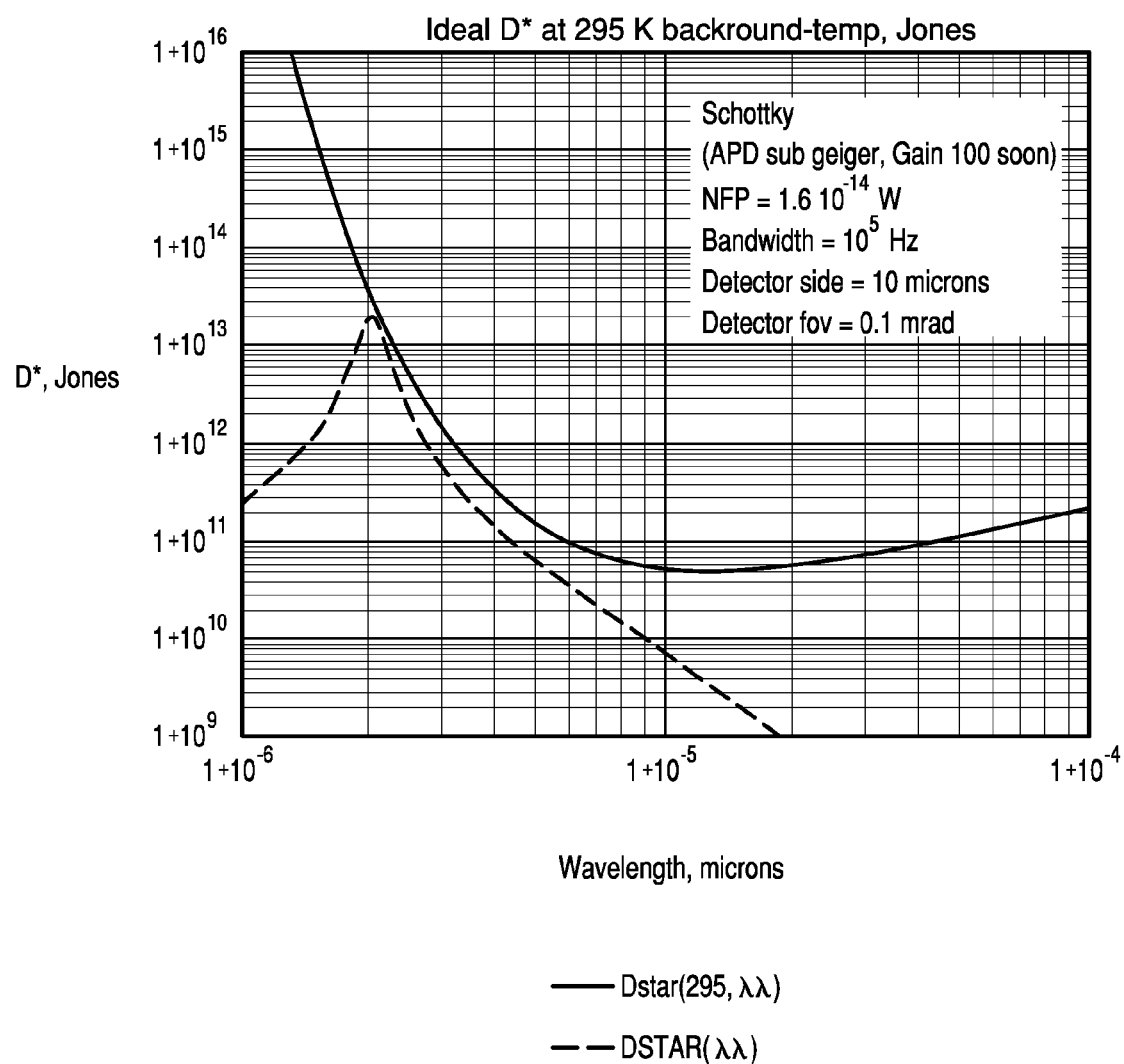
FIG. 35 is a graph showing the figure of merit, D* as a function of wavelength for a SWIR detector.

FIG. 35 illustrates the D* curve compared to an ideal photovoltaic operating at 2π steradians—and 295K temperature. Unusual and unexpected shapes are observed, because of the nanorod resonance detection process, instead of a p-n junction process with its long wavelength cutoff at the bandgap that is typically observed for detector performance. The extended long wavelength performance can be very useful in night-vision imaging.

Visible (VIS) and Near Infra-Red (NIR) Region Detectors

The nanoparticle detector may also be arranged to preferentially detect EMR with wavelengths in the Visible/Near-Infra-Red (VIS-NIR) region. In this embodiment there is described the performance of a nanoparticle detector designed to operate in the VIS-NIR region. The detectors and pixel arrangements of FIGS. 6, 15a-15c and 27-30 may be used for such detectors. The nanoparticles may be gold, for example, or another noble metal, transparent oxides such as Al:ZnO, Ga:ZnO or ITO, transition metal oxides such as TiN or ZrN, or possibly graphene.

Figure 36:
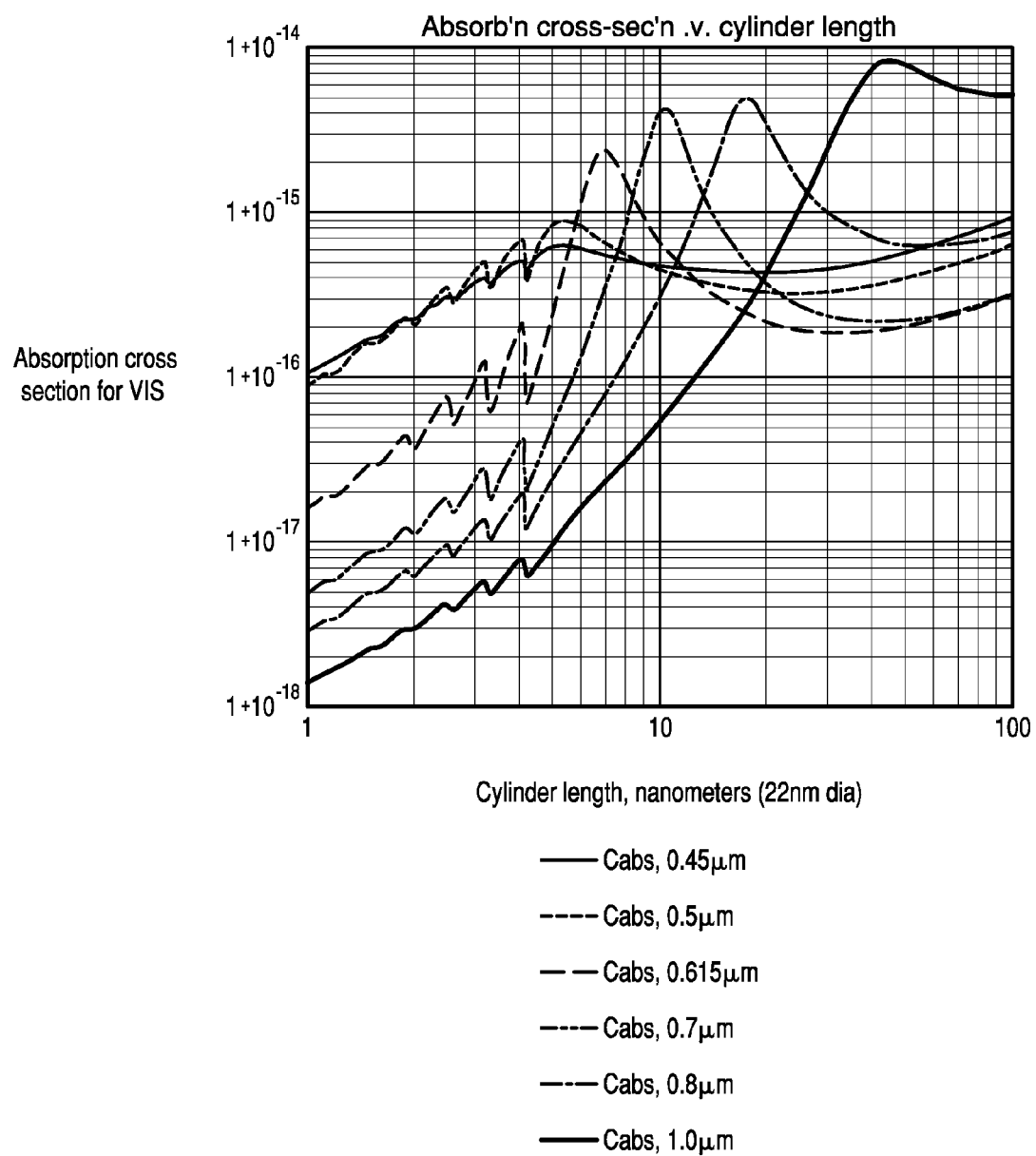
FIG. 36 is a graph showing the absorption cross-section as a function of nanorod length for 22 nm diameter gold nanorods in silicon, at EMR wavelengths of 450 nm, 500 nm, 615 nm, 700 nm, 800 nm and 1-micron.

An example of VIS and NIR detection is provide with 22 nm diameter gold nanorods embedded in silicon, where the illumination is assumed perpendicular to the gold nano-rod lattice plane. As seen in FIG. 36, a peak absorption region for EMR with wavelengths 450 nm, 500 nm, 615 nm, 700 nm, 800 nm and 1-micron is shown, where the peaks occur at different nanorod lengths. FIG. 37 illustrates the calculated responsivities of a 10-micron detector element comprising ~5000 22 nm diameter gold nanorods in a close-coupled array as a function of nanorod length, with the responsivity of 55 nm length nanorods shown for comparison.

As can be seen in FIG. 37, there is a peak responsivity of around 100 A/W for 55 nm long gold nanorods illuminated at 1 micron NIR wavelength. For 615 nm wavelength EMR, the peak in responsivity occurs at a length of 7 nm with 10× the responsivity. With this arrangement there is no discernable peak response for wavelengths less than about 550 nm. In the 450 nm and 500 nm curves there is evidence of Mie absorption oscillations for very short nanorods, as expected, because Rayleigh-Mie light-scattering is dominating here—with such small particles, not light-absorption. The optimum center-to-center spacing of the gold nano-rods was calculated and is estimated to be approximately 0.3 microns, or 300 nm to give maximum single particle absorption from the enhanced-lattice-response effect.

LWIR Region Detectors with SiC Nanoparticles

In this embodiment, for LWIR region detection, silicon carbide particles are used as an alternative to gold for the nanorod array material embedded in a semiconductor such as silicon.

The underlying physics of the nano-absorption in this embodiment is that of phononics instead of plasmonics. Phononics is another polariton mechanism, and the math behind the calculations for absorptivity is very similar to the localized plasmon case discussed above with respect to gold nanoparticles. With phononics, the effect of absorption of EMR is to heat the detector, where the absorbed EMR photon is converted ultimately to a phonon and thus heat, so the same limitations of thermal time constant apply here as they do for a microbolometer.

Figure 38A:
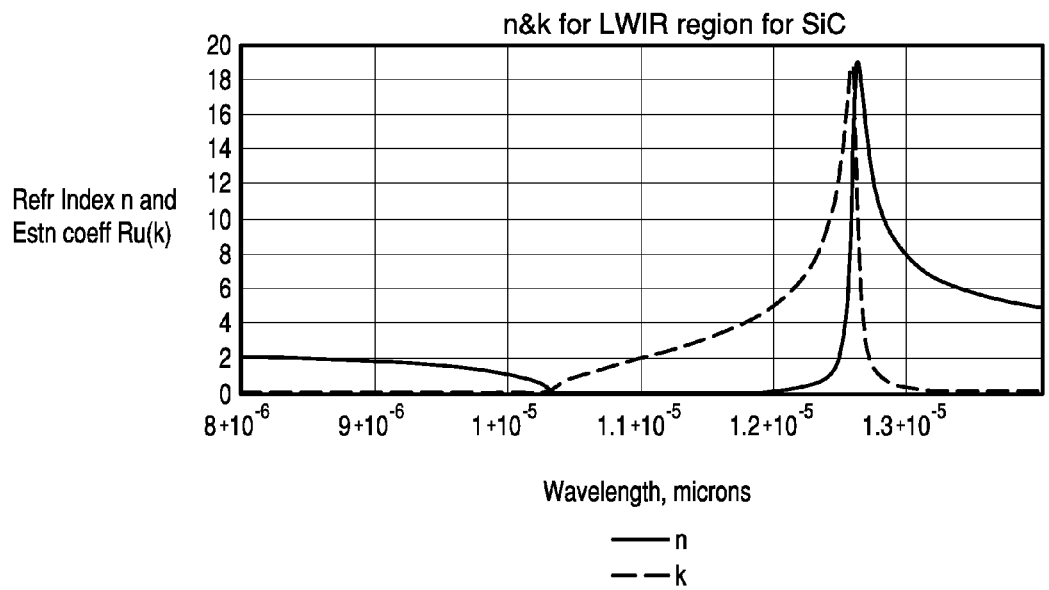
FIG. 38a is a graph showing the complex refractive index curves of silicon carbide as a function of EMR wavelength in the LWIR region.
Figure 38B:
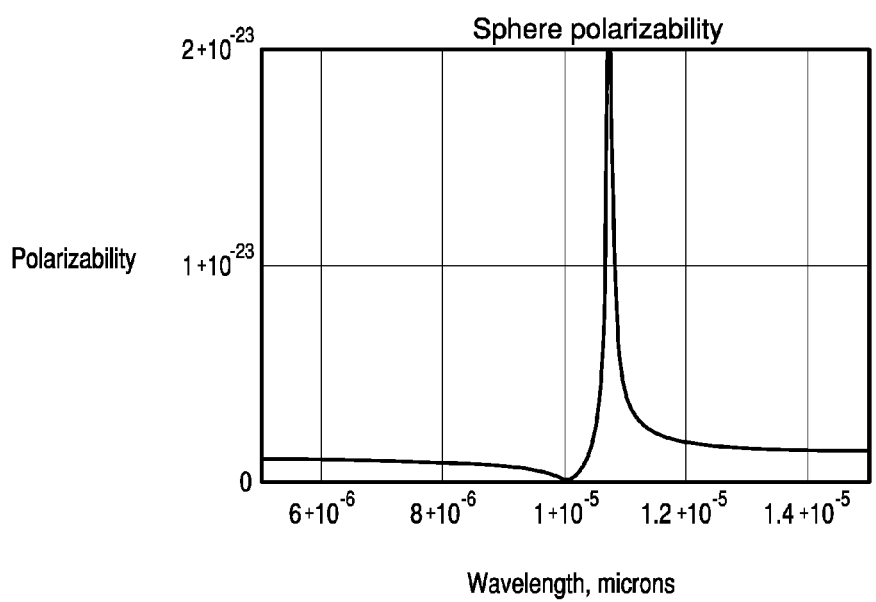
FIG. 38b is a graph showing the polarizability of 10 nm diameter silicon carbide spheres as a function of EMR wavelength in the LWIR region.
Figure 39:
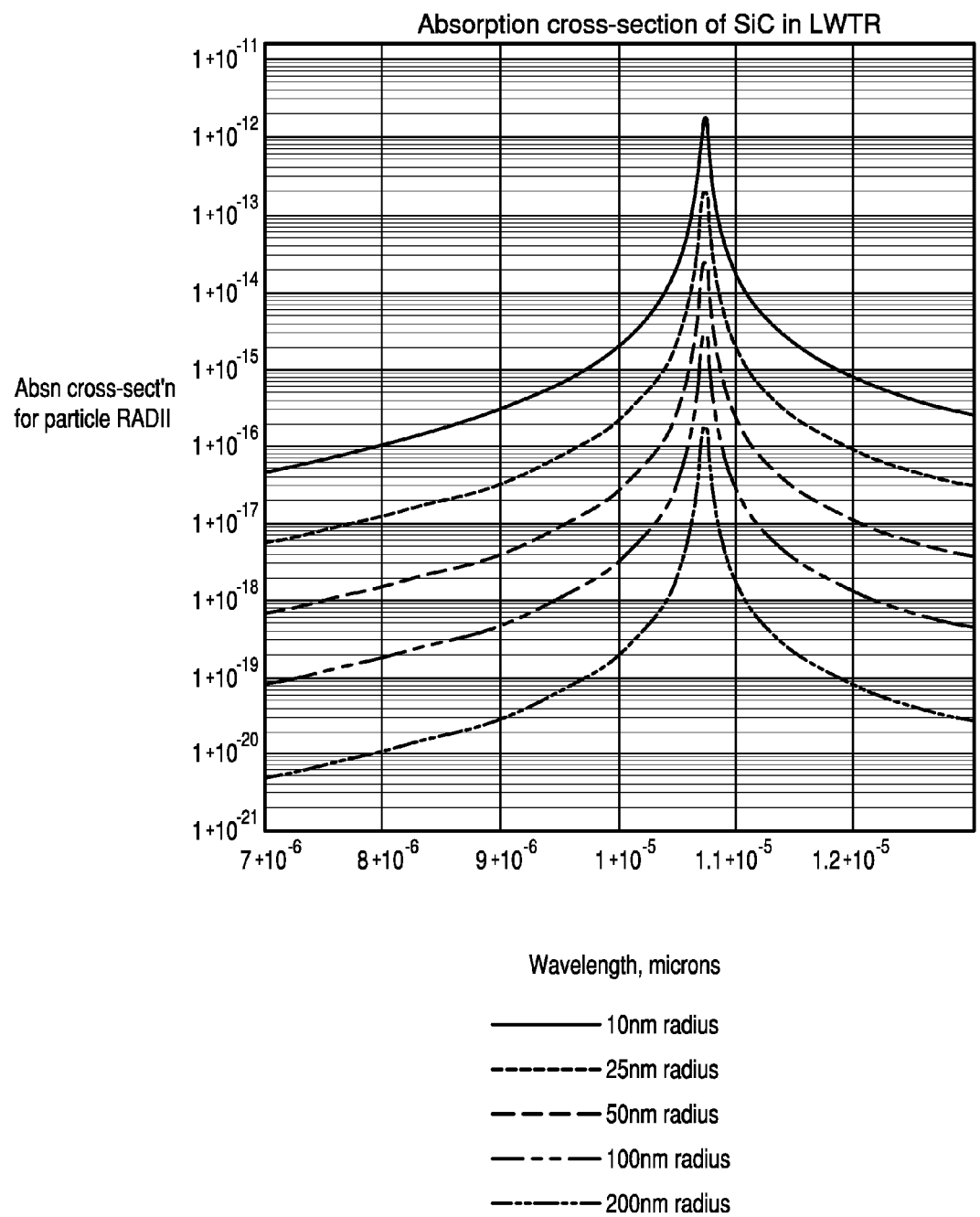
FIG. 39 is a graph showing the aborption as a function of EMR wavelength for 20, 40, 100, 200 and 400 nm diameter silicon carbide spheres in the LWIR region.

The LWIR absorption for this embodiment may be calculated in a corresponding fashion to the LWIR absorption based on plasmonics. As a start, FIG. 38a illustrates the complex refractive index curves for silicon carbide material in the LWIR region, while FIG. 38b illustrates the corresponding polarizability curve for a 10 nm silicon carbide sphere also in the LWIR region. FIG. 39 illustrates the LWIR absorption of 20, 50, 100, 200 and 400 nm diameter SiC spheres.

As can be seen, the width of the detector's resonance peak curve is noticeably reduced within the LWIR. This feature allows for the design and manufacture of detectors selective to very specific wavelengths within the LWIR, while having the same polarization advantages as described in FIGS. 15a-15c for arrays of such nanoparticles. The resonances are confined to a spectral region far smaller than can be obtained with the typical multi-layer dielectric interference filter approach. The resonance peak may be changed by changing the matrix material surrounding nanoparticles, such as the semiconductor material and its doping-levels and type.

Terra-Hertz and Microwave Region EMR Detection

The nanoparticle detector may also be arranged to preferentially detect EMR with wavelengths in the Terra-Hertz and microwave region. InSb, gold, silver or lead nanoparticles, for example, may be formed into an array, which is embedded in silicon or some other suitable semiconductor for direct electrical detection of incident THz EMR. Detector geometries and pixel arrangements of FIGS. 6, 15a-15c and 27-30 apply. Applications for a Terra-Hertz detector in the wavelength range of 01. to 10 THz, may include, for example, a camera, such as for example a SLR camera. Such THz detectors provide advantages such as imaging through solid materials.

The essential underlying physics for THz detection is that of the complex dielectric constant for metals and semi-conductors. From permittivity equations for permittivity $\in$, the real, n, and imaginary, k, refractive index values may be calculated as follows:

$$\dot{\epsilon} = \epsilon_1 + i\epsilon_2 = (n + i\kappa)^2.$$

Conversion between refractive index and dielectric constant is done by:

$$\epsilon_1 = n^2 - \kappa^2$$

$$\epsilon_2 = 2n\kappa$$

$$n = \sqrt{\frac{\sqrt{\epsilon_1^2 + \epsilon_2^2} + \epsilon_1}{2}}$$

$$\kappa = \sqrt{\frac{\sqrt{\epsilon_1^2 + \epsilon_2^2} - \epsilon_1}{2}}$$

The response of an array of nano-structures may be used to estimate the responsivity of such nanostructures made of metals and semiconductors embedded in air or semiconducting materials.

A good THz detector may be achieved, for example, using a regular array of 120 10 micron diameter gold cylinders embedded in a silicon matrix, where the pixel size is 1 mm square, and the array is linear. For a rod length of 250 microns, the responsivity can be calculated to be 2.5 A/W at 0.3 THz for a 500 mW peak power THz laser source in a 4 inch f/2 optical system.

The responsivity may be increase even further for a array of 5 rods spaced 200 microns across with a rod length of 1 mm to 35 A/W for a 100 mW peak power THz laser source in a 4 inch f/2 optical system. The responsivity of this detector configuration with the load-resistor of 50K Ohms corresponds to a responsivity in Volts/Watt of $1.7 \times 10^6$, which exceeds the responsivity figure of comparable pyro-electric detectors for THz detection by more than 10×. For the noise-level of this detector, we calculate a worst-case NEP of $8 \times 10^{13}$ Watts per root-Hertz, and D* of $2.4 \times 10^{12}$ Jones.

Vitamin Enhancement of IR Region Photodetection

Figure 40:
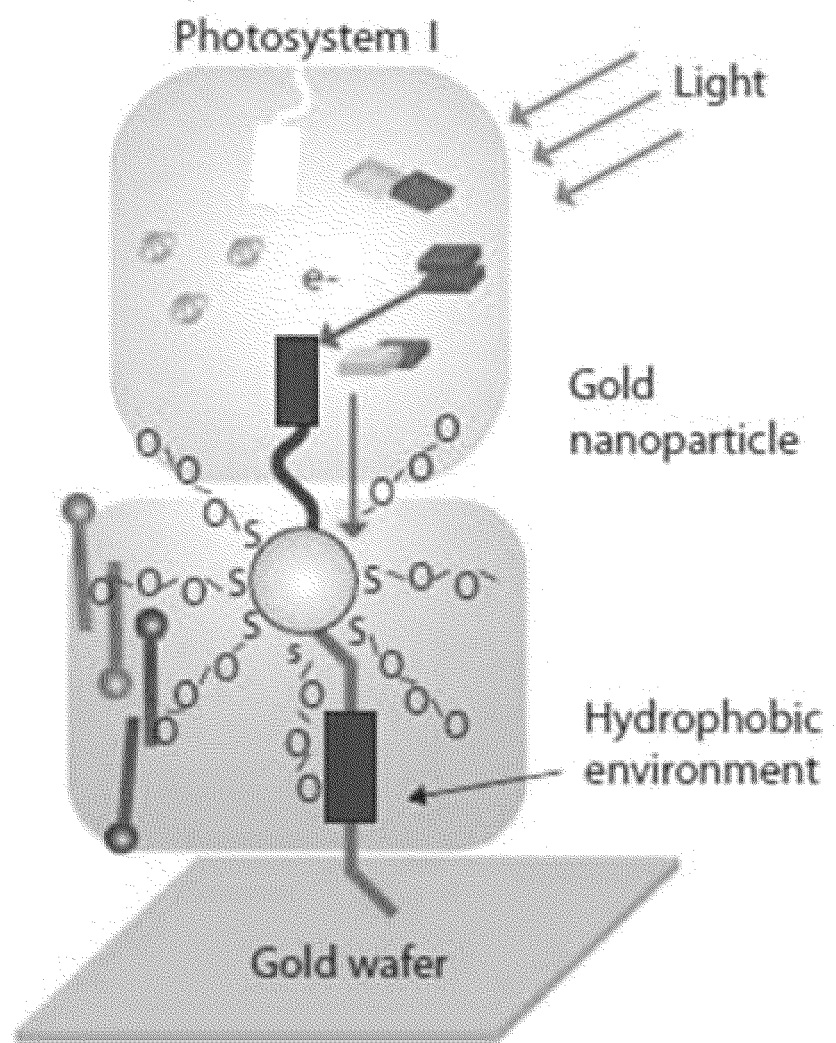
FIG. 40 is a schematic illustrating of an enhanced photo-detection system using gold nanoparticles.

The nanoparticle detector may also be arranged to preferentially detect EMR with wavelengths in the IR region based on vitamin enhancement. Such a detecting system can be based on a chemical component that has a crucial role in photosynthesis, which provides a most efficient process for converting light into a flow of electrons. The process of converting light into electrons is described, in [Miyachi et al, 2010; 'A photosensing system composed of photosystem I, molecular wire, gold nano-particle, and double surfactants in water', Chem. Commun. 46, pp 2557-2559], which describes enhanced photodetection using gold nanoparticles and surfactants linking them to a gold film. FIG. 40, taken from Miyachi, illustrates the operation schematically. While Miyachi disclose photodetection of visible wavelengths using 2 nm gold particles, such photodetection could possibly be extended into the SWIR & LWIR regions.

In plants, photosynthesis begins when a photon of light frees an electron from a chlorophyll molecule. A device based on this process is potentially sensitive enough to detect even a single photon, making it useful as a light sensor. The devices uses molecules similar to vitamin K1. Nanoparticles are an important part of the system, acting as a store for electrons. This system could be extended out to the SWIR and LWIR regions to capture the high efficiency potential by use of different vitamins to replace vitamin K1.

Multi-Spectral Band and Polarization Geometries

This embodiment provides nano particle arrays which allow for the detection of multiple wavelengths simultaneous with the same detector. Such multiple wavelength detection can provide advantages in focal plane array (FPA) imaging systems, with the special advantage that two or more wavelengths may be detected simultaneously in the same detector structure. In this regard, the nanorods in different portions of a pixel may be made to have different lengths and aspect ratio that provide a resonance at different specific wavelengths, and/or nanorods may be arranged to detect different polarizations of interest.

Figure 41:
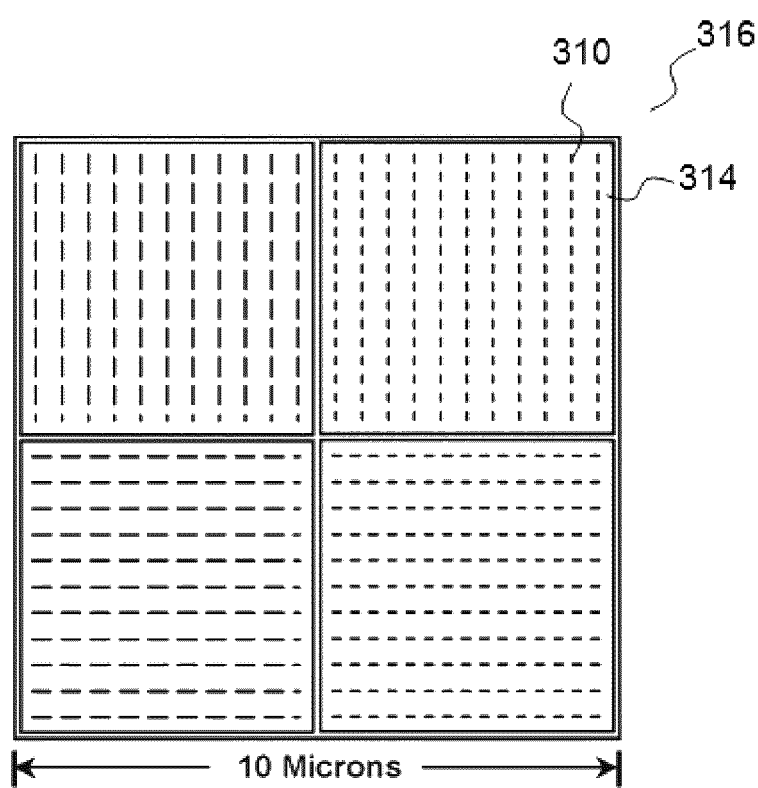
FIG. 41 is a schematic illustrating arrays of differently oriented and length nanorods for wavelength and polarization selectivity in a single pixel detector.

An exemplary nanorod array geometry for this purpose is illustrated in FIG. 41. The detectors of FIGS. 6 and 27-30 apply here as basic detector structures. FIG. 41 shows a possible nanorod layout. FIG. 41 shows arrays of differently oriented, and different length, nanorods for the purposes of wavelength and orthogonal polarization selectivity within a single pixel detector. This structure could be applied across a focal-plane array detector to assist in detection of specific features in the scene being observed.

Figure 42:
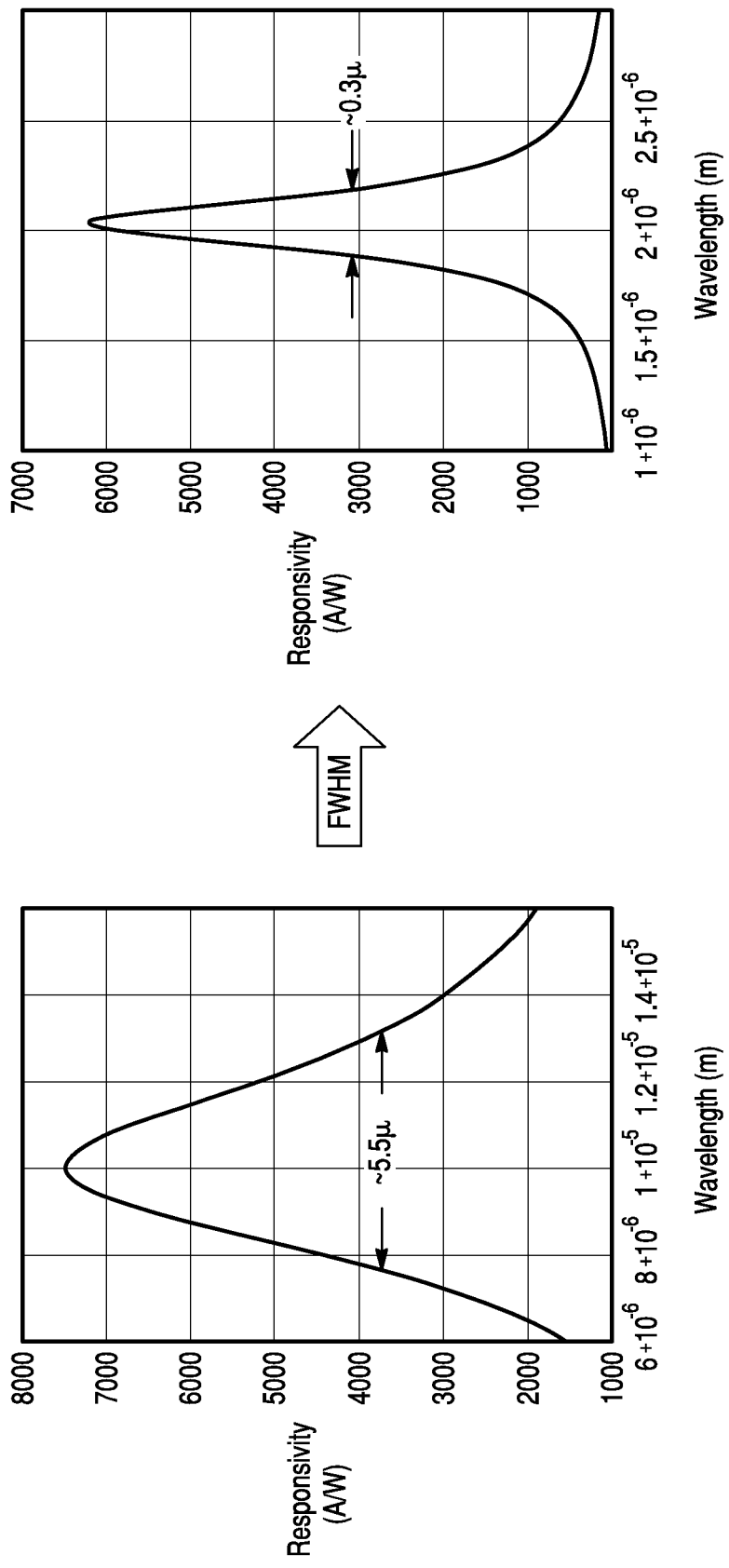
FIG. 42 are graphs of the responsivity versus wavelength showing the relative spectral bandwidths that may be obtained in two spectral regions using the arrays of FIG. 35 for simultaneous SWIR and LWIR detection.

For example, a system may be deployed for simultaneous SWIR (~0.3 microns full width half maximum (FWHM)) and LWIR (~5.5 microns FWHM) detection. FIG. 42 illustrates these relative spectral bandwidths that may be obtained in those two spectral regions.

Solar Cells

With respect to solar cells, direct electron detection as described herein may be used in place of (or together with) the plasmon scattering effects currently used in nanoparticle array light scatterers to enhance absorption in optical modes in silicon, where detector geometries and pixel arrangements of FIGS. 6, 15a-15c and 27-30 apply as solar-cell detector structures.

The invention claimed is:

1. An electromagnetic radiation detector, comprising:
    a detector material comprising a substantially regular array of nano-particles embedded in a matrix material; and
    a voltage biasing element configured to apply a bias voltage to the matrix material such that electrical current is directly generated based on a cooperative plasmon effect in the detector material when electro-magnetic radiation in a predetermined wavelength range is incident upon the detector material, where the dominant mechanism for decay in the cooperative plasmon effect is non-radiative,
    wherein the nano-particles have a long axis, and the array comprises one or more pixels,
    wherein the nano-particles in each pixel comprise a first group of nano-particles and a second group of nano-particles, the long-axis of each nano-particle in the first group oriented along a first direction the long-axis of each nano-particle in the second group oriented along a second direction.

2. The detector of claim 1, wherein the nano-particles comprise a metal, and the matrix material comprises a semiconductor material.

3. The detector of claim 2, wherein the nano-particles comprise gold.

4. The detector of claim 2, wherein the matrix material comprises one of silicon or InSb.

5. The detector of claim 1, wherein the nano-particles comprise a semiconductor material, and the matrix material comprises a metal.

6. The detector of claim 1, wherein the nano-particles comprise a first semiconductor material, and the matrix material comprises a second semiconductor material.

7. The detector of claim 6, wherein the second semiconductor material is highly doped.

8. The detector of claim 1, wherein the nano-particles comprise a semiconductor material, and the matrix material comprises a conductive contact material having ohmic or Schottky barrier properties with respect to the embedded nano-particles.

9. The detector of claim 1, wherein the voltage biasing element comprises a first electrode electrically contacting a first side of the matrix material and a second electrode electrically contacting a second side of the matrix material.

10. The detector of claim 9, wherein the first and second electrodes are laterally arranged relative to each other.

11. The detector of claim 10, further comprising an anti-reflection coating on the matrix material.

12. The detector of claim wherein the first and second electrodes are vertically arranged relative to each other.

13. The detector of claim 12, wherein the first electrode is transparent or semi-transparent to the electro-magnetic radiation in the predetermined wavelength range.

14. The detector of claim 9, wherein the matrix material comprises a heterojunction, and the nano-particles are embedded in the heterojunction.

15. The detector of claim 9, wherein the matrix material comprises a metal-semiconductor junction, and the nano-particles are embedded in the metal-semiconductor junction.

16. The detector of claim 1, wherein the matrix material comprises a metal as a perforated contact electrode and the nano-particles comprise a semiconductor material.

17. The detector of claim 16, wherein the voltage biasing element comprises another electrode electrically contacting the nano-particles.

18. The detector of claim 9, further comprising:
    a p-type semiconductor region formed on the matrix material; and
    a n-type semiconductor region formed on the p-type semiconductor region, wherein the first electrode contacts the n-type semiconductor region, and the second electrode contacts the matrix material opposite to the p-type semiconductor region, and
    wherein the matrix material comprises a $\pi$ doped semiconductor material.

19. The detector of claim 18, wherein the detector is an avalanche photodiode.

20. The detector of claim 1, wherein the detector is a solar cell.

21. The detector of claim 1, wherein the detector is a focal plane array.

22. The detector of claim 1, wherein nano-particles are cylindrical, spherical, cubic, rectangular-cubic, ellipsoidal, planar or spiral-twisted.

23. The detector of claim 1, wherein the first direction is perpendicular to the second direction.

24. The detector of claim 1, wherein the nano-particles of the first and second groups are arranged in the same region of the pixel to form a checker-board pattern.

25. The detector of claim 1, wherein the nano-particles of the first and second groups are arranged in different regions of the pixel.

26. The detector of claim 1, wherein the nano-particles of the first group are sensitive to a polarization of the electromagnetic radiation in the predetermined radiation range in a first polarization direction, and the nano-particles of the second group are sensitive to a polarization of the electromagnetic radiation in the predetermined radiation range in a second polarization direction.

27. The detector of claim 1, wherein the predetermined wavelength range comprises multiple predetermined wavelength subranges.

28. The detector of claim 27, wherein the predetermined wavelength subranges are separated from each other.

29. The detector of claim 28, wherein the predetermined wavelength subranges are continuous with each other.

30. The detector of claim 1, wherein the predetermined wavelength range is between the deep ultra-violet and microwave regions of the electromagnetic spectrum.

31. The detector of claim 2, wherein the predetermined wavelength range comprises at least one of the visible, near infra-red, short-wave infrared, medium-wave infrared, infrared, long-wave infra-red, and tera-hertz regions of the electromagnetic spectrum.

32. An electro-magnetic radiation detector, comprising:
    a detector material comprising a substantially regular array of nano-particles embedded in a matrix material, and
    a voltage biasing element configured to apply a bias voltage to the matrix material such that electrical current is directly generated based on a cooperative plasmon effect in the detector material when electro-magnetic radiation in a predetermined wavelength range is incident upon the detector material, where the dominant mechanism for decay in the cooperative plasmon effect is non-radiative, wherein the nano-particles have a long axis, and the array comprises one or more pixels, wherein the nano-particles in each pixel comprise a first group of nano-particles arranged in a first region of the pixel and a second group of nano-particles arranged in a second region of the pixel, wherein the nano-particles in the first group are arranged in the first region to optimally detect electromagnetic radiation in a first wavelength range, and the nano-particles in the second group are arranged in the second region to optimally detect electromagnetic radiation in a second wavelength range different from the first wavelength range.

33. The detector of claim 32, wherein the nano-particles in each pixel further comprise a third group of nano-particles arranged in a third region of the pixel, the nano-particles in the third group are arranged in the third region to optimally detect electromagnetic radiation in a third wavelength range different from the first wavelength range and the second wavelength range.

34. An electro-magnetic radiation detector, comprising:

a detector material comprising a substantially regular array of nano-particles embedded in a matrix material; and a voltage biasing element configured to apply a bias voltage to the matrix material such that electrical current is directly generated based on a cooperative plasmon effect in the detector material when electro-magnetic radiation in a predetermined wavelength range is incident upon the detector material, where the dominant mechanism for decay in the cooperative plasmon effect is non-radiative, wherein the nano-particles have a long axis, and the array comprises one or more pixels, wherein the array is polarization sensitive to the electromagnetic radiation in the predetermined radiation range.

35. The detector of claim 34, wherein the nano-particles in each pixel are arranged such that the long-axis of each nano-particle in the pixel are oriented along a same direction.

* * * * *